United States Patent [19]
Amano et al.

[11] Patent Number: 5,451,767
[45] Date of Patent: Sep. 19, 1995

[54] OPTICAL MODULATOR GATE ARRAY INCLUDING MULTI-QUANTUM WELL PHOTODETECTOR

[75] Inventors: Chikara Amano; Shinji Matsuo; Hideki Hukano, all of Kanagawa; Takashi Kurokawa, Saitama; Takeshi Yamada, Kanagawa, all of Japan

[73] Assignee: Nippon Telegraph & Telephone Corporation, Japan

[21] Appl. No.: 928,530

[22] Filed: Aug. 13, 1992

Related U.S. Application Data

[63] Continuation of Ser. No. 644,308, Jan. 22, 1991, abandoned.

[30] Foreign Application Priority Data

| | | |
|---|---|---|
| Jan. 23, 1990 [JP] | Japan | 2-11763 |
| Jul. 9, 1990 [JP] | Japan | 2-179481 |
| Aug. 31, 1990 [JP] | Japan | 2-228349 |
| Nov. 2, 1990 [JP] | Japan | 2-295282 |
| Nov. 2, 1990 [JP] | Japan | 2-295283 |

[51] Int. Cl.[6] .......................... H01J 31/50
[52] U.S. Cl. ..................... 250/214.1; 377/102
[58] Field of Search ............ 250/211 J, 213 A; 377/102; 372/45, 46, 50; 365/110, 112; 359/152, 154

[56] References Cited

U.S. PATENT DOCUMENTS

| | | | |
|---|---|---|---|
| 4,546,244 | 10/1985 | Miller | 250/211 J |
| 4,716,449 | 12/1987 | Miller | 357/30 |
| 4,754,132 | 6/1988 | Hinton et al. | 250/213 A |
| 4,952,791 | 8/1990 | Hinton et al. | 250/213 A |
| 4,961,198 | 10/1990 | Ishino et al. | 372/50 |
| 5,020,153 | 5/1991 | Choa et al. | 359/189 |

OTHER PUBLICATIONS

W. P. Bleha et al., "Application of the Liquid Crystal Light Valve to Real–Time Optical Data Processing", Optical Engineering, vol. 17 No. 4, Jul.–Aug. 1978, pp. 371–384.

*Primary Examiner*—David C. Nelms
*Attorney, Agent, or Firm*—Blakely, Sokoloff, Taylor & Zafman

[57] ABSTRACT

An optical gate array includes a photodetector, an optical modulator, and a reflecting structure arranged therebetween. The photodetector, the optical modulator, and the reflecting structure are composed of semiconductor materials. The photodetector includes an MQW (Multi Quantum Well). The reflecting structure is constituted by a distributed Bragg reflector formed by alternately stacking semiconductor layers having different refractivities. The photodetector and the optical modulator are arranged to receive light from different directions. The modulation characteristics of the optical modulator are controlled by the intensity of light radiated on the photodetector. The reflecting structure connects the photodetector and the modulator electrically and isolates lights radiated on both parts. A plurality of optical gates, each constituted by the photodetector, the optical modulator, and the reflection structure, are two-dimensionally arranged.

28 Claims, 41 Drawing Sheets

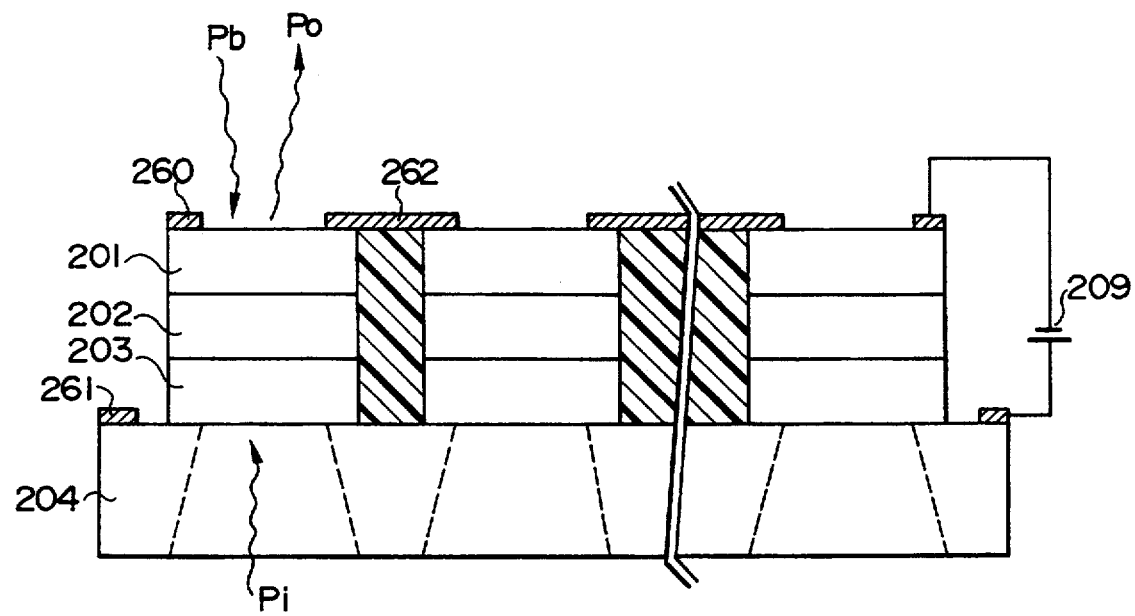
F I G. 1A
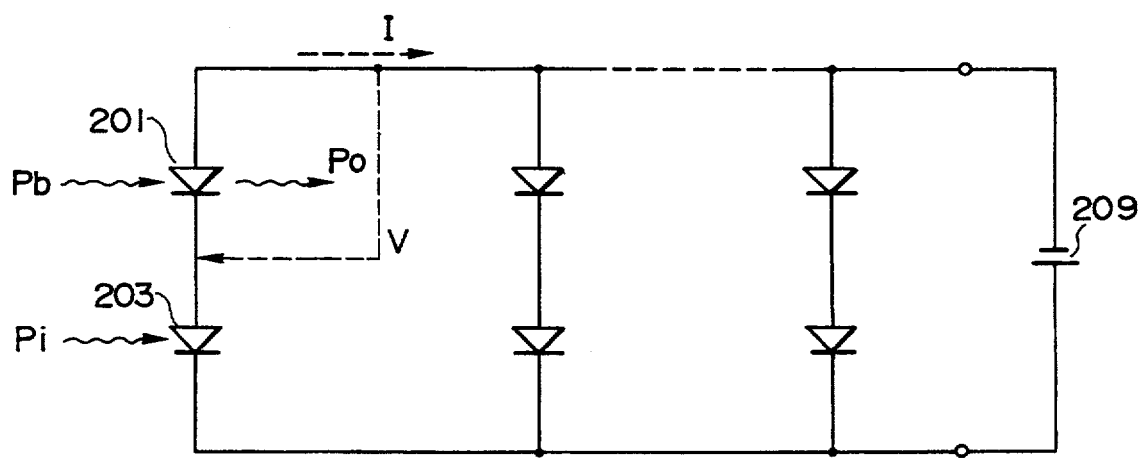
F I G. 1B

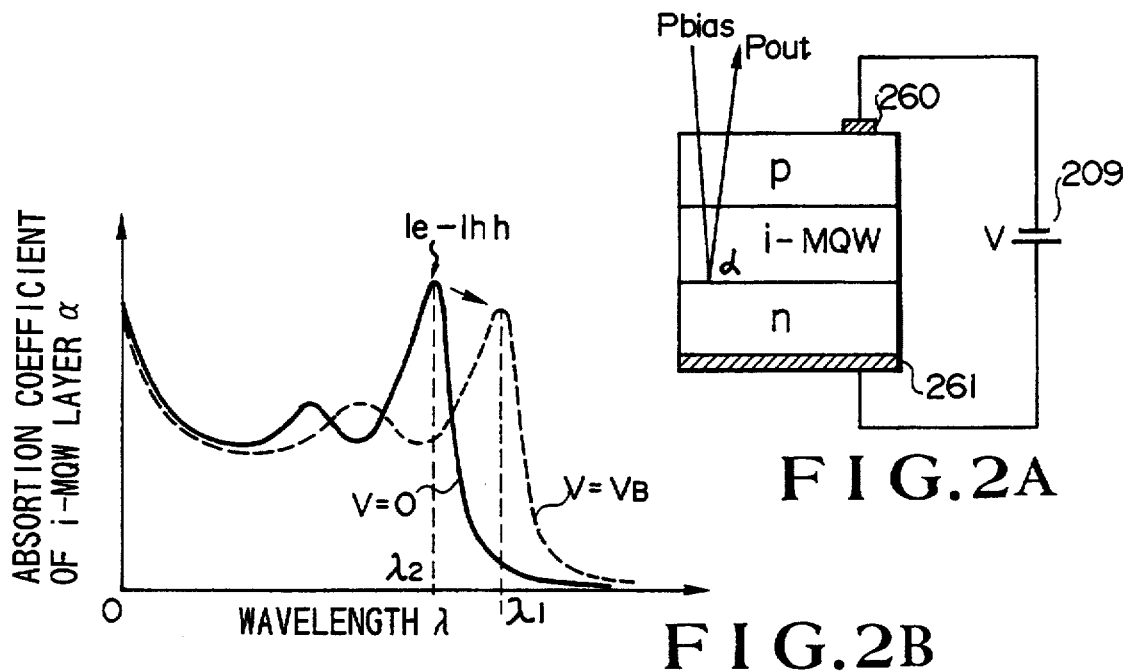
FIG. 2A
FIG. 2B
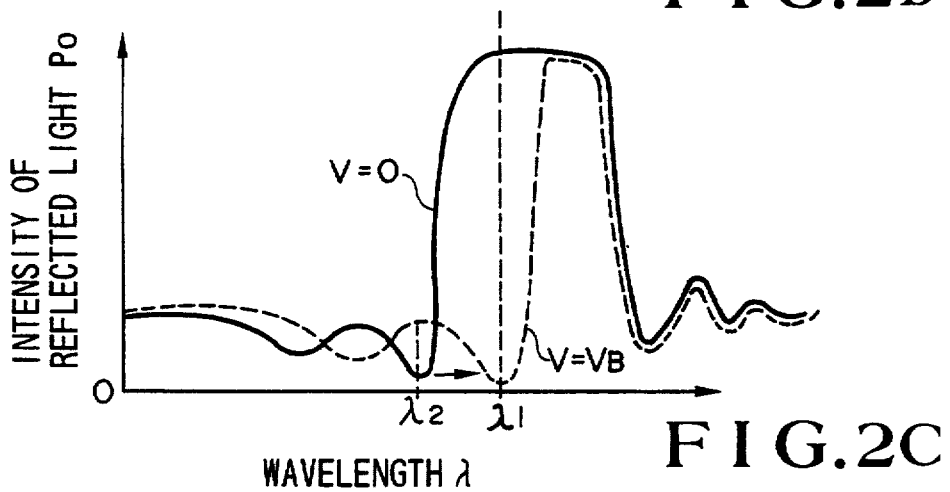
FIG. 2C
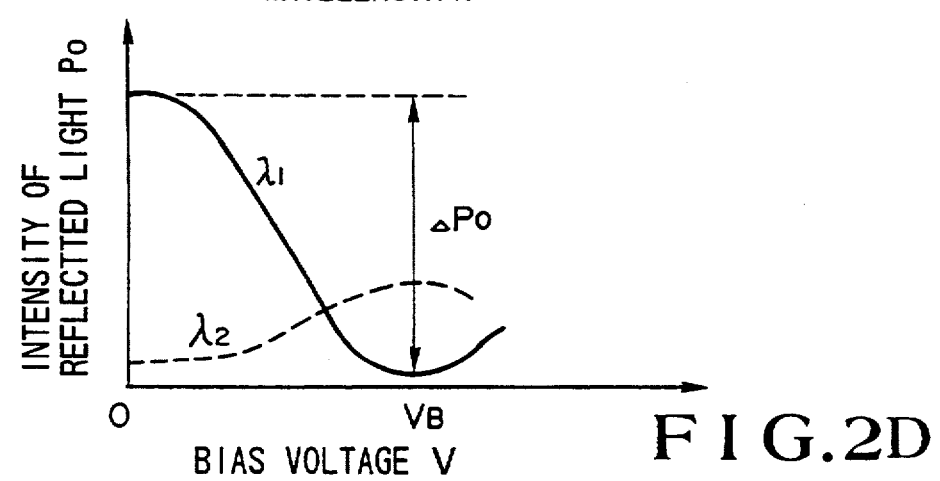
FIG. 2D

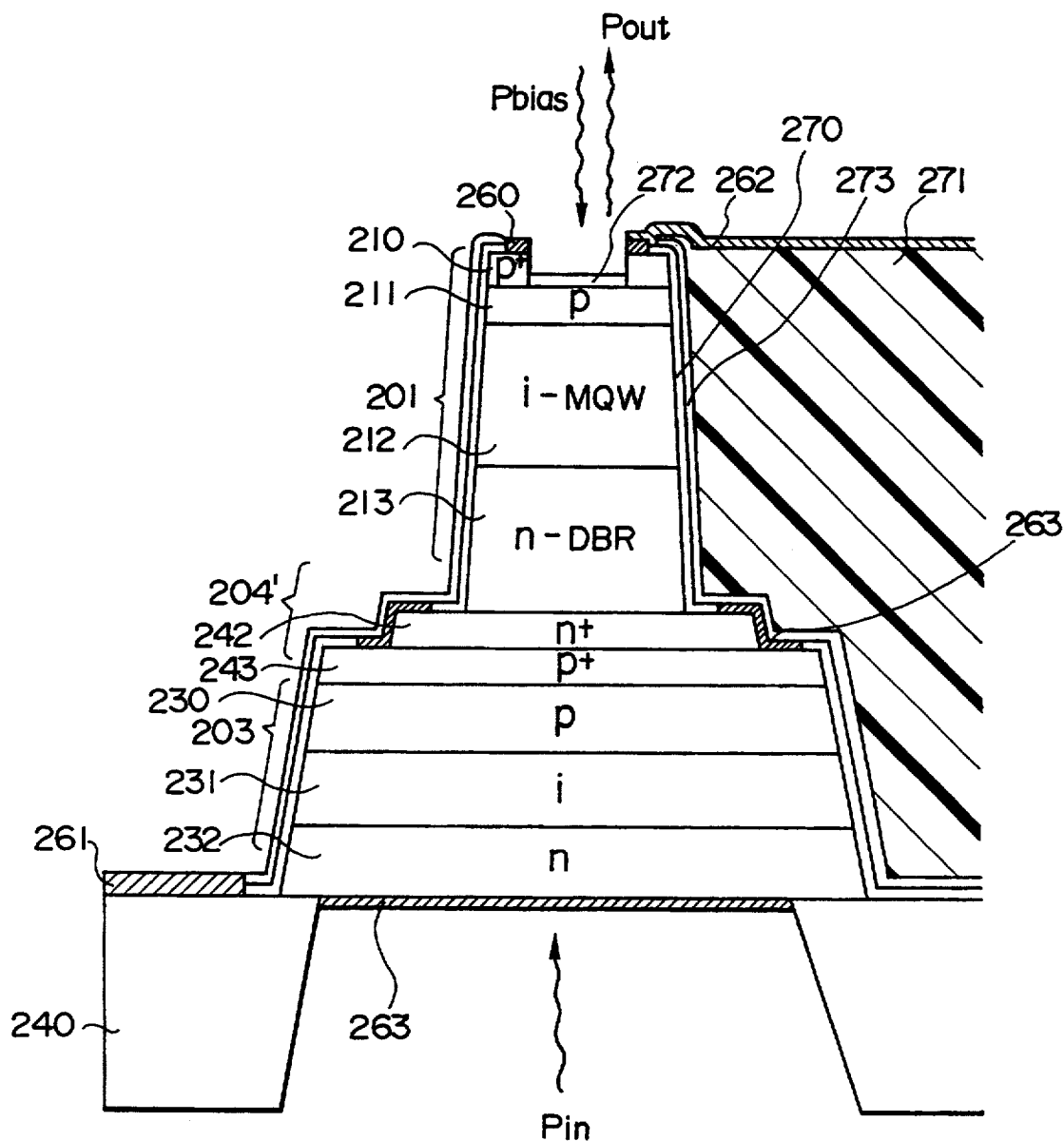
F I G. 6

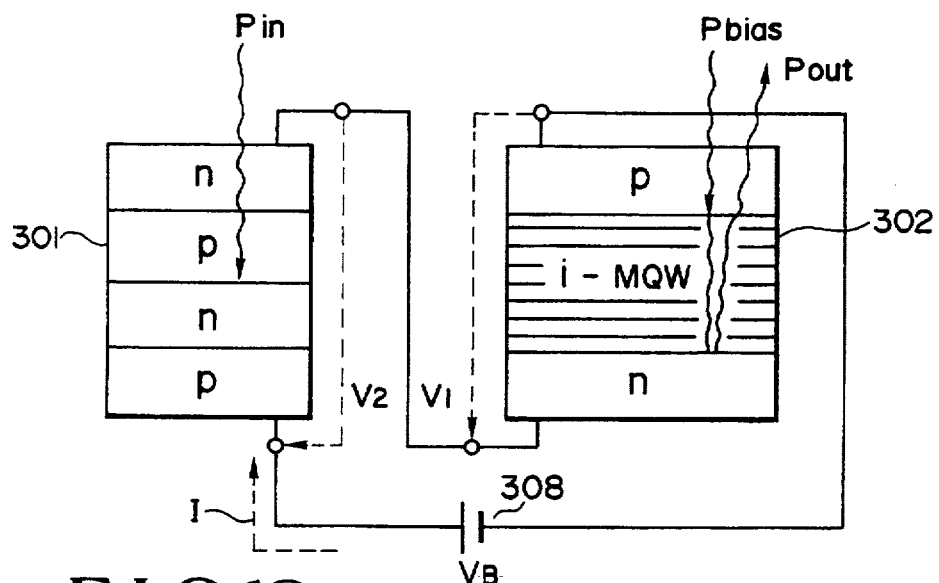
F I G.13
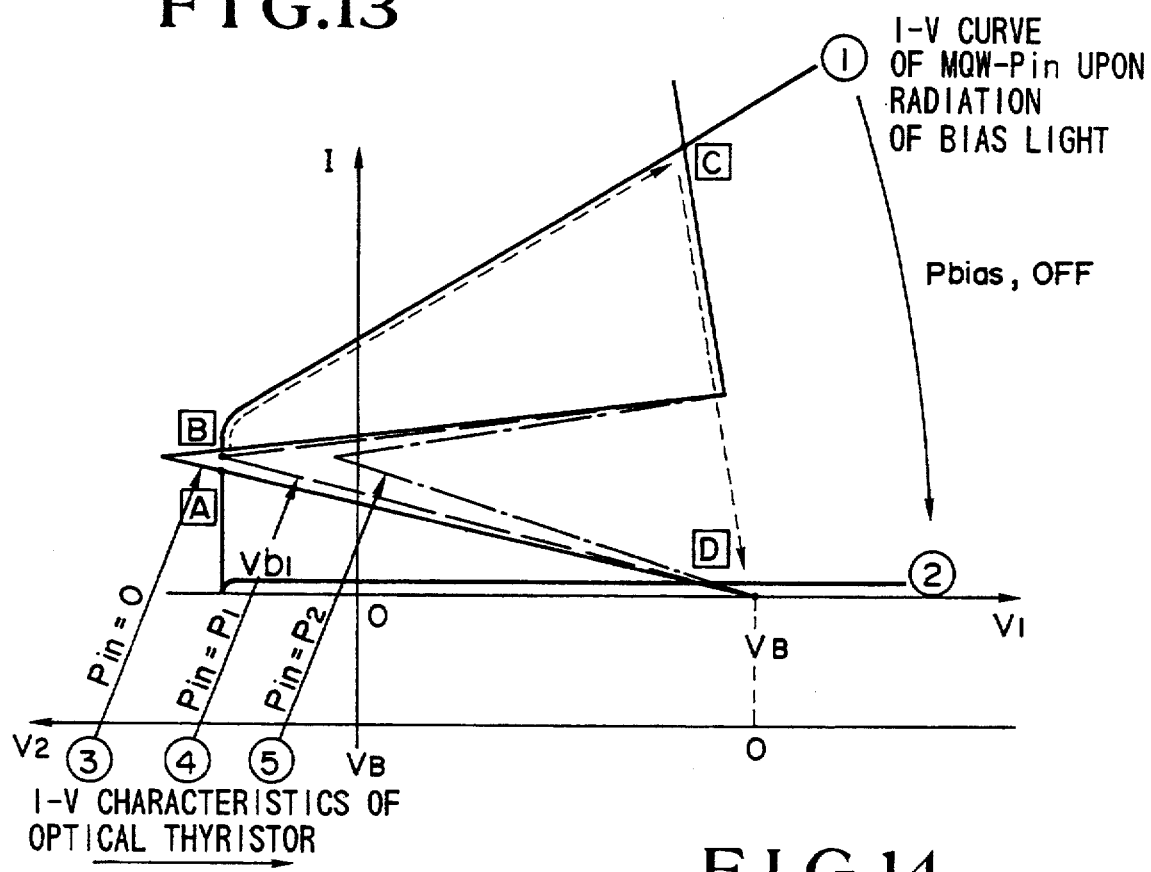
F I G.14

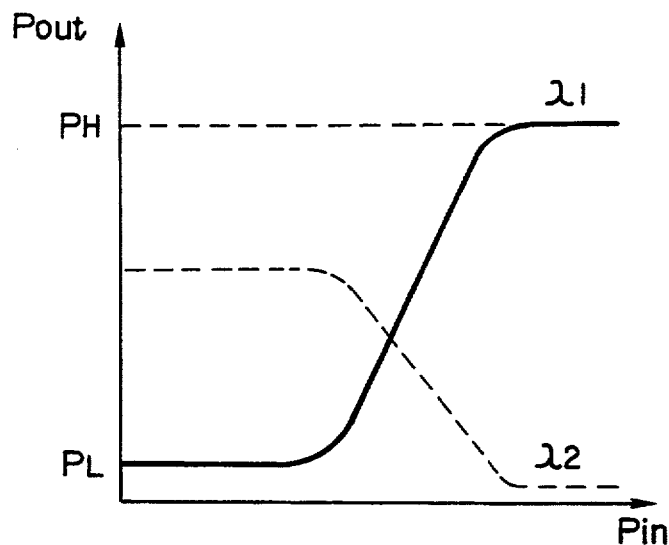
F I G. 25A
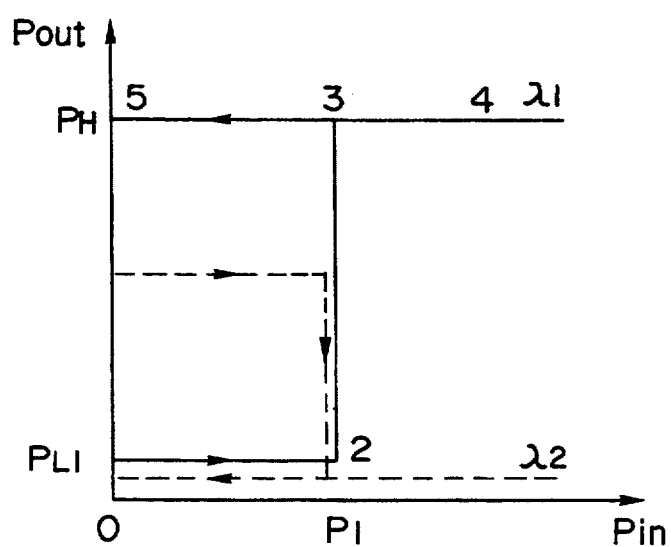
F I G. 25B

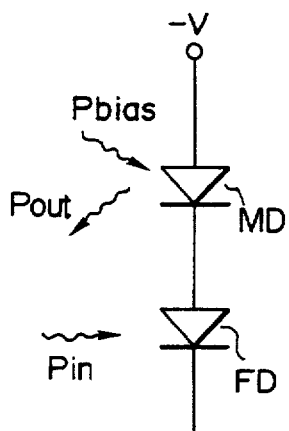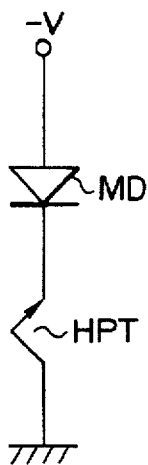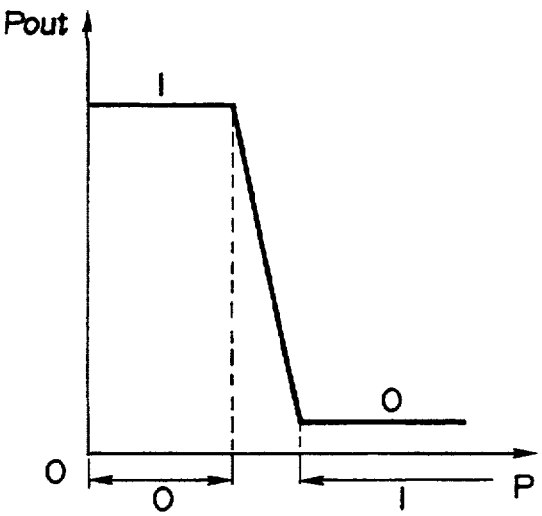
FIG. 28A  FIG. 28B  FIG. 28C
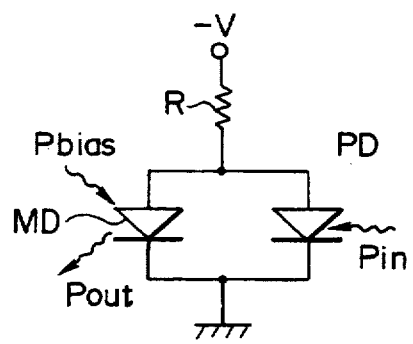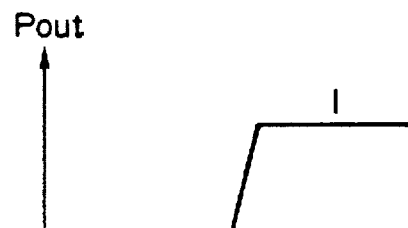
FIG. 29A
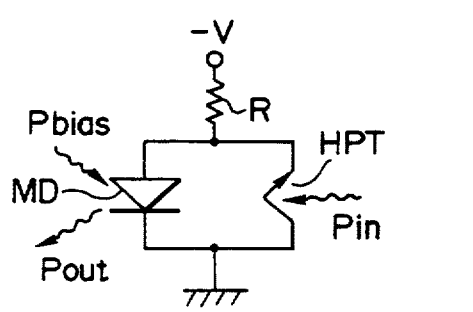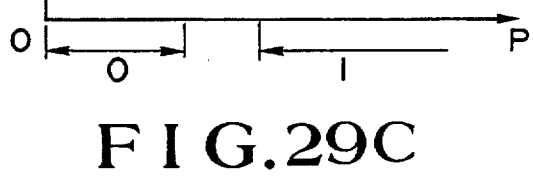
FIG. 29B  FIG. 29C

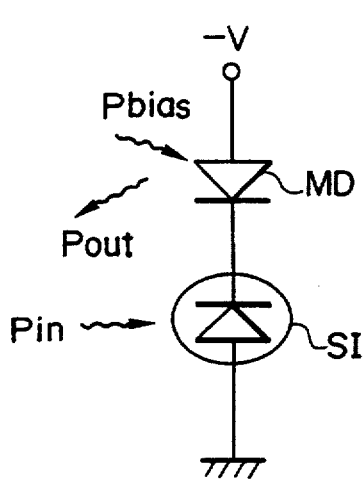
F I G. 30A
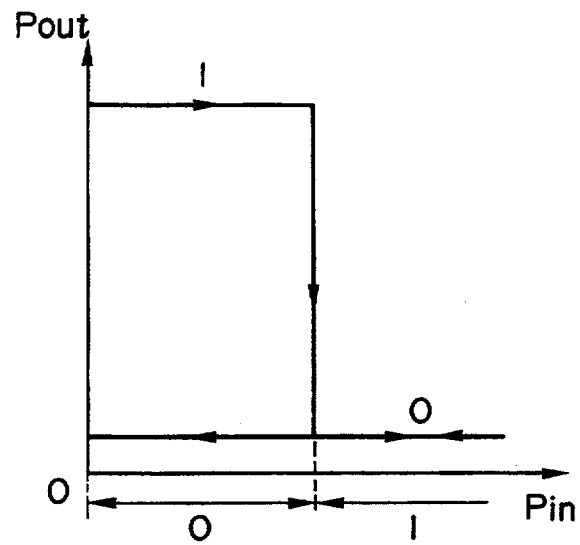
F I G. 30B
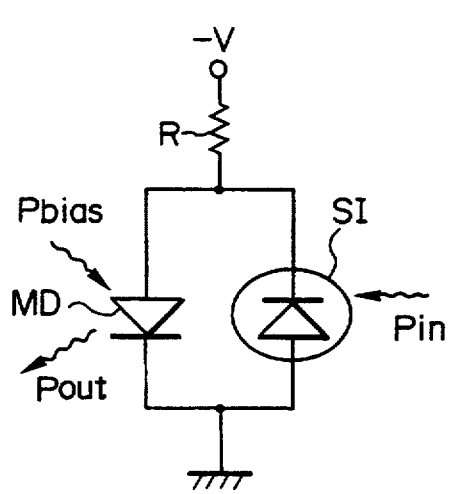
F I G. 31A
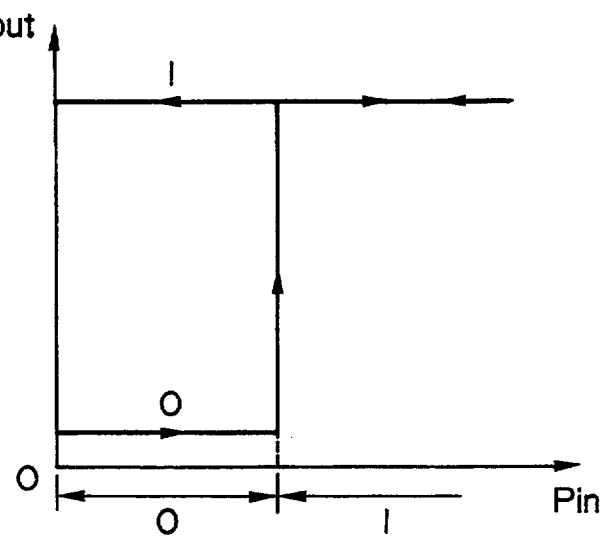
F I G. 31B

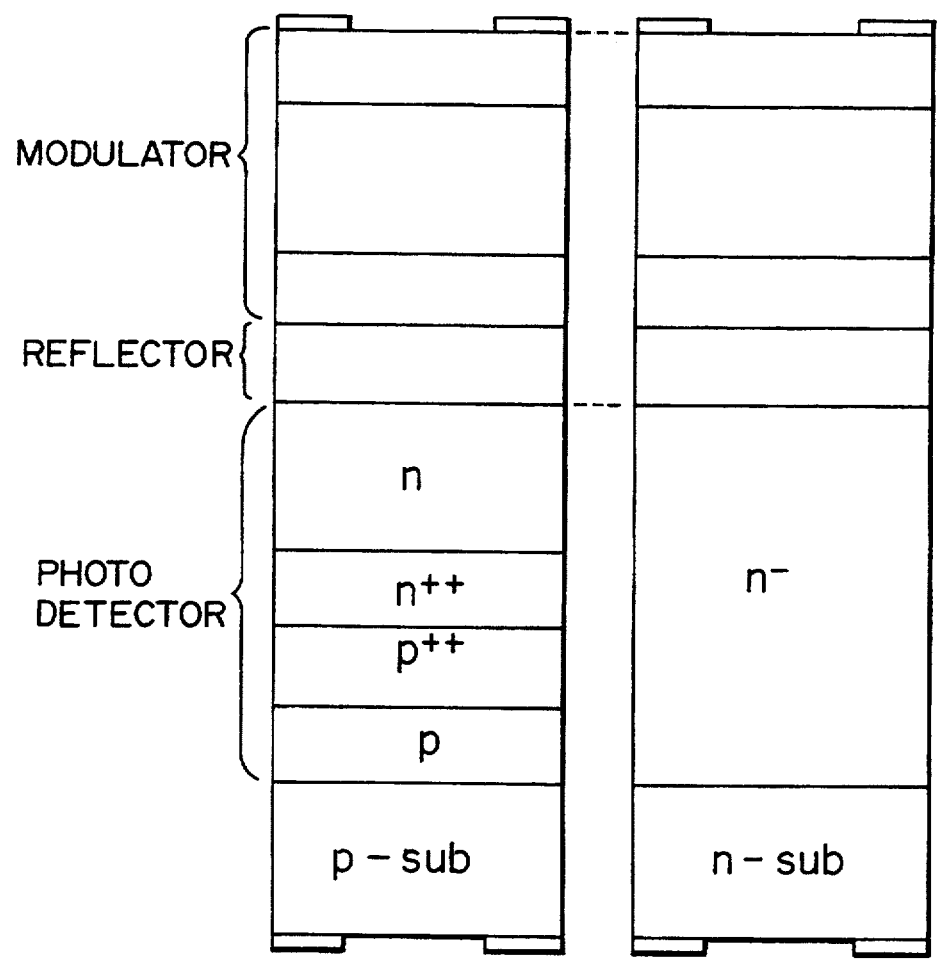
F I G. 36A   F I G. 36B

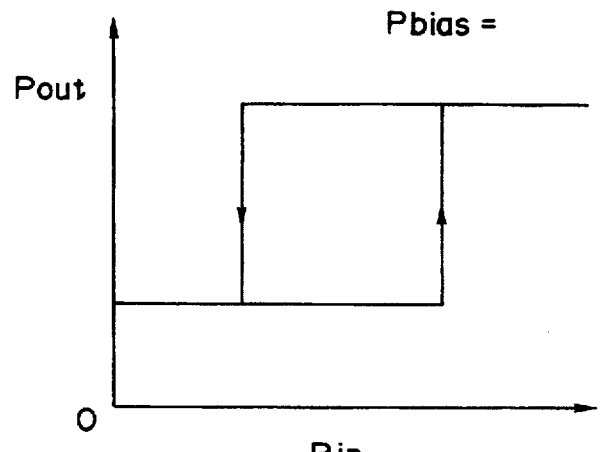
F I G. 38B

OPTICAL MODULATOR GATE ARRAY INCLUDING MULTI-QUANTUM WELL PHOTODETECTOR

This is a continuation of application Ser. No. 07/644,308, filed Jan. 22, 1991 now abandoned.

BACKGROUND OF THE INVENTION

The present invention relates to an optical three-terminal element for controlling the intensity light by the intensity of another light.

In addition, the present invention relates to an optical gate array for controlling two-dimensional data of second light by two-dimensional data of first light using such an optical three-terminal element.

A strong demand has arisen for development of an optical gate array, using an optical three-terminal element, as a key device for performing optical data processing and optical signal processing. As an element of this type, an element called "symmetric self-electrooptic-effect device (S-SEED)" has been proposed, as described in "Applied Physics Letters" volume 52, p. 1,419. In this element, two multi quantum well (MQW) pin type optical modulators formed on the same semiconductor substrate are connected in series with each other through an external electrode, and a constant-voltage power supply is connected to both ends of the series circuit of the modulators. With this arrangement, a transmitted light component of light radiated on the second pin type optical modulator is changed by the intensity of light input to the first pin type optical modulator. This element can control a transmitted light component, of light biased with a predetermined intensity, by means of input light having the same wavelength. An arrangement and characteristics of the element will be described below with reference to FIG. 38($a$) and 38($b$).

FIGS. 38($a$) and 38($b$) respectively show the arrangement and characteristics of a conventional element (S-SEED). FIG. 38($a$) is a sectional view of the element. FIG. 38($b$) is a graph showing the light input/output characteristics of the element. Referring to FIG. 38($a$), reference numeral 100 denotes a pin structure; 101, a p-AlGaAs clad layer; 102, an i-AlGaAs/GaAs MQW layer; 103, an n-AlGaAs clad layer; 104, an insulating layer consisting of i-AlGaAs and p-AlGaAs; 105, a GaAs substrate; 106, an insulating layer; 107, an electrode; and 108, a constant-voltage power supply. Reference symbol $P_{in}$ denotes input light; $P_{bias}$, bias light; and $P_{out}$, output light.

In such an arrangement, the pin structure 100 consisting of the p-AlGaAs clad layer 101, the i-AlGaAs/GaAs MQW layer 102, and the n-AlGaAs clad layer 103 is stacked on the GaAs substrate 105 through the insulating layer consisting of i-AlGaAs and p-AlGaAs. A side surface of the pin structure 100 is coated with the insulating layer 106. The n-AlGaAs clad layer 103 of the first pin structure 100 and a p-AlGaAs clad layer 101 of a second pin structure $100_1$ are connected to each other through the electrode 107. If the input light $P_{in}$ and the bias light $P_{bias}$ are respective incident on the first and second pin structures 100 and $100_1$ to obtain transmitted light as the output light $P_{out}$, $P_{in}-P_{out}$ characteristics exhibit positive logic type bistable characteristics shown in FIG. 38($b$). Light intensity modulation is performed by using a quantum confined Stark effect (QCSE), i.e., modulating the transmittance of the i-AlGaAs/GaAs MQW layer 102 at its exciton absorption wavelength by changing a reverse bias voltage applied to the pin structure 100.

The following three problems, however, are posed in the conventional optical gate array.

First, the contrast ratio of each pin structure, i.e., the intensity ratio of output light $P_{out}$ before and after switching, is as low as 2:1 to 3:1. For this reason, in order to arrange a plurality of such elements in series to be cascade-operated, two pin structures having the same characteristics must be arranged in parallel to be differentially switched, thus requiring a complicated arrangement.

Second, input light and bias light must be independently radiated on two adjacent pin structures from the same direction, and hence an operation of an element is very difficult. For example, when a logic operation is be performed between two two-dimensional optical patterns, images must be projected on the flat surface of the array while they are kept separated and shifted from each other by an amount corresponding to the distance between the two structures. This requires a high-precision, complicated optical system.

Third, since the photodetective pin structure and the modulating pin structure have the same structure, the light input/output characteristics are limited to positive logic gate characteristics, and only a gain of about 1 is obtained.

SUMMARY OF THE INVENTION

It is, therefore, an object of the present invention to solve the above-described problems and to provide an optical three-terminal element and an optical gate array which has a large contrast ratio and allows a simple arrangement and easy operation of the element, and which can greatly increase the degree of freedom in design in terms of logic types, gains, and the like.

(A) In order to achieve the above object, according to the present invention, there is provided an optical gate array comprising a photodetector, an optical modulator, and a reflecting structure arranged therebetween, wherein the photodetector, the optical modulator, and the reflecting structure are composed of semiconductor materials, the optical modulator includes an MQW (Multi Quantum Well), the reflecting structure is constituted by a distributed Bragg reflector formed by alternately stacking semiconductor layers having different refractivities, the photodetector and the optical modulator are arranged to receive light from different directions, modulation characteristics of the optical modulator are controlled by the intensity of light radiated on the photodetector, the reflecting structure connects the modulator and the photodetector electrically and isolates lights radiated on both, and a plurality of optical gates, each constituted by the photodetector, the optical modulator, and the reflection structure, are two-dimensionally arranged.

(B) According to the present invention, in an optical gate array for controlling two-dimensional data of second light by two-dimensional data of first light, the following components are vertically stacked on a semiconductor substrate (204) and are two-dimensionally arranged: a photodetective portion (203), having a photodiode or phototransistor structure, for changing its electrical output in accordance with the intensity of the first light; and an optical modulating portion (201), constituted by a pin structure including a multi quantum well structure in one layer, and a multilayer reflecting structure in a p- or n-type layer, for changing the reflectivity of the second light by using the electrical output.

According to the optical gate array of the present invention, in order to obtain a high contrast, the MQW-pin structure optical modulating portion has the following three arrangements:

(1) The thickness of the i-MQW layer is set to be equal to or larger than a value which allows depletion in a zero bias state at its residual carrier concentration.

Since the contrast ratio is exponentially increased in relation to the thickness of the i-MQW layer, the thickness of the i-MQW layer is increased to the allowable limit to which a QCSE effect can be obtained.

(2) The total thickness of the barrier layer of the i-MQW layer is set to be less than ½ that of the well layer.

Since light is subjected to absorption modulation in only the well layer, of the i-MQW layer, the thickness of the barrier layer is minimized to increase the number of film formation cycles, i.e., the total number of well layers.

(3) The p- or n-type layer has a DBR (distributed Bragg reflector) structure.

Since incident light is totally reflected by the DBR layer, the effective absorption wavelength is increased to be twice as large as that of the i-MQW layer.

In this optical gate array, since a high contrast ratio can be obtained, a differential switching operation between two pin structures need not be performed, unlike the conventional element. Therefore, a cascade-operation among a plurality of optical gate arrays can be performed with a simple arrangement using a single pin structure.

In addition, since input light and bias light are respectively incident from opposite directions with the substrate being considered as an boundary, and output light is obtained as bias light, the input light and the bias/output light can be easily separated. Especially, a logic operation between two two-dimensional optical patterns can be performed by simply projecting the patterns on the upper and lower surfaces of the optical gate array, respectively. Therefore, no high-precision, complicated optical system is required.

Furthermore, since the photodetective portion and the modulating portion are vertically stacked, and their layer arrangements can be arbitrarily selected, light input/output characteristics (e.g., gains, switching light intensity, logic types, and the like) can be arbitrarily designed. For example, if the photodetective portion is constituted by a phototransistor structure, ON/OFF control of high-intensity bias light can be performed by switching with a gain, i.e., weak light.

Ⓒ According to the present invention, in an optical gate array for controlling two-dimensional data of second light by two-dimensional input data of first light, and holding its output state, the following components are vertically stacked on a semiconductor substrate (303) and are two-dimensionally arranged: a pnpn optical thyristor (301) for changing its electrical output upon radiation of the first light thereon, and holding its state even after the light is turned off; and an MQW-pin modulator (302), constituted by a structure including a multi quantum well structure in an i-type layer, and a multilayer reflecting structure in a p- or n-type layer, for changing the intensity of reflected light or transmitted light of the second light in accordance with a voltage applied thereto.

In addition to the characteristics of the above-described optical gate array B, this element of the present invention has complete memory characteristics, i.e., a function of holding a light output state after switching even when input light is turned off.

Since the detector portion is constituted by an optical thyristor, switching can be performed by input light having a power of several μW, and a response time of several ns can be obtained.

Ⓓ Furthermore, in a first optical gate array, the following components are vertically stacked on a semiconductor substrate (401) and are two-dimensionally arranged: a photodetector portion (402) for changing its electrical output upon radiation of first light thereon; and an optical modulating portion (403) having a function of changing the intensity of reflected light of second light in accordance with the electrical output, and including a multi quantum well (MQW) structure in an i-type layer, and a multilayer reflecting structure in a p- or n-type layer, and a pair of electrodes (405, 406) are arranged to electrically connect the photodetector portion in parallel with the optical modulating portion.

A second optical gate array is designed such that a load resistor (419) and a constant-voltage power supply (420) are connected between a pair of electrodes identical to the electrodes in the first optical gate array, and the load resistor is constituted by a resistive thin film formed on the same semiconductor substrate. These optical gate arrays have a higher response time than the optical gate array Ⓑ.

Ⓔ Moreover according to the present invention, in an optical gate array, the following components are vertically or horizontally arranged on a semiconductor substrate (CS) and are two-dimensionally arranged: a plurality of photodetector portions (S) for changing their electrical outputs upon radiation of first light thereon; and an optical modulating portion (M) having a function of changing the intensity of reflected light of second light in accordance with these electrical outputs, and comprising a pin structure including a multi quantum well (MQW) structure in an i-layer, and a multilayer reflecting structure in a p- or n-type layer.

In addition to the characteristics of the optical gate arrays Ⓑ to Ⓓ, this optical gate array can perform a multivalued logic operation by using one gate because it includes a plurality of photodetector portions per gate.

BRIEF DESCRIPTION OF THE DRAWINGS

FIGS. 1(a) and 1(b) are views for explaining an arrangement of an optical gate array according to an embodiment of the present invention;

FIGS. 2(a) to 2(d) are views for explaining an operation principle of an MQW-pin modulating portion according to the present invention;

FIG. 6 is a sectional view showing a GaAs element in which an intermediate electrode is used to connect a photodetective portion to a modulating portion, for explaining an example of an optical gate array according to the present invention;

FIG. 13 is an equivalent circuit diagram of an element according to the present invention;

FIG. 14 is a graph for explaining an operation principle of the element;

FIGS. 25(a) and 25(b) are graphs showing light input/output characteristics;

FIGS. 28(a) to 28(c), 29(a) to 29(c), 30(a), 30(b), 31(a) and 31(b) are views showing characteristics of a photodetector portion;

FIGS. 36(a) and 36(b) are sectional views each showing another embodiment of an photodetector portion;

FIG. 38(b) is a graph showing light input/output characteristics of the conventional optical gate array.

DESCRIPTION OF THE PREFERRED EMBODIMENTS

Figure 3A:
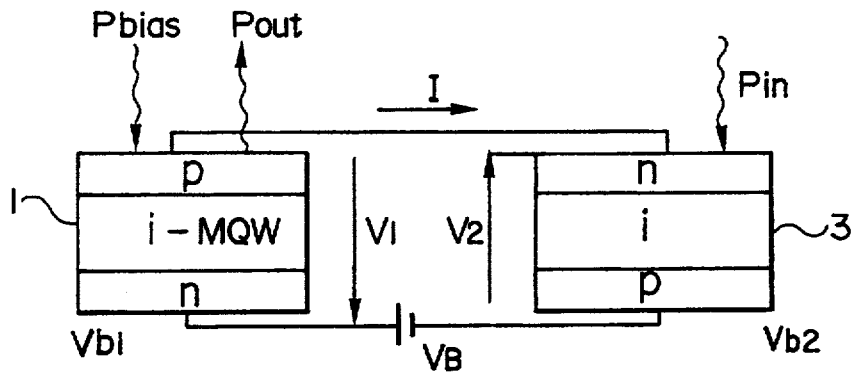
FIGS. 3(a) to 3(c) are views for explaining an operation principle of an optical gate array according to the present invention.

An optical gate array using an optical three-terminal element according to the present invention will be described below.

FIGS. 1(a) and 1(b) are views for explaining the optical gate array of the present invention. FIG. 1(a) shows an arrangement of the optical gate array. FIG. 1(b) is an equivalent circuit diagram of FIG. 1(a). Referring to FIGS. 1(a) and 1(b), the following components are sequentially stacked on a semiconductor substrate 204: an MQW-pin structure optical modulating portion 201 for changing the intensity of reflected light $P_o$ with respect to bias light $P_b$ by means of a voltage applied thereto; a tunnel junction portion 202 for electrically connecting a photodiode (to be described later) 203 to the optical modulating portion 201; and the photodiode 203 for producing a photocurrent which is changed in accordance with input light $P_i$. Note that the MQW-pin structure optical modulating portion 201 includes a DBR structure for totally reflecting the bias light $P_b$. These pixel constituent elements (each consisting of the MQW-pin structure optical modulating portion 201, the tunnel junction portion 202, and the photodiode 203) are arranged on the same substrate flat surface in the form of a matrix to form a two-dimensional array. First light as input light is radiated onto the lower surface of the substrate, and second light as bias light is radiated on the upper element surface at the same time, thus extracting reflected light as output light. The uppermost and lowermost layers of each pixel constituent element are electrically connected to each other through an electrode 262 and the semiconductor substrate 204. A constant-voltage power supply 209 is connected to electrodes 260 and 261 arranged on both ends of these elements. As shown in FIG. 1(b), in the optical gate array having such an arrangement, series circuits, each consisting of the MQW-pin structure optical modulating portion 201 and the photodiode 203 connected in series with each other in the same bias direction in terms of polarity, are connected in parallel with each other in accordance with the number of pixels, and the constant-voltage power supply 209 is connected to both ends of each series circuit. Note that the constant-voltage power supply 209 is connected to reverse-bias the MQW-pin structure optical modulating portion 201 and the photodiode 203 as they are both reversely biased. The respective pixel constituent elements are independently operated in response to the input light $P_i$.

An operation principle of the optical gate array of the present invention will be described below with reference to FIGS. 2(a) to 3(c).

An operation of the MQW-pin structure optical modulating portion 201 will be described first with reference to FIGS. 2(a) to 2(d). FIGS. 2(b) and 2(c) respectively show changes in absorption spectrum of an i-MQW layer and changes in reflection spectrum when a reverse bias is applied to the MQW-pin structure optical modulating portion 201 having an arrangement shown in FIG. 2(a). With an increase in reverse voltage V, an exciton absorption peak (1e-1hh) is shifted to the long wavelength side due to the quantum confined Stark effect (QCSE). With this shift, an absorption dip appearing on the reflection spectrum of the MQW-pin structure optical modulating portion 201 is shifted to the long wavelength side. If, in this case, the wavelength of light radiated on the MQW-pin structure optical modulating portion 201 is tuned to an exciton absorption peak ($\lambda_1$) in a reverse bias state (V=$V_B$), the intensity of the reflected light is decreased with an increase in the bias voltage V. On the other hand, if the wavelength of light radiated on the MQW pin structure optical modulating portion 201 is tuned to an exciton absorption peak ($\lambda_2$) in a zero bias state (V=0), the intensity of the reflected light is increased with an increase in the bias voltage V. That is, the intensity of output light can be modulated in accordance with a voltage to be applied to the pin structure optical modulating portion 201.

Figure 3B:
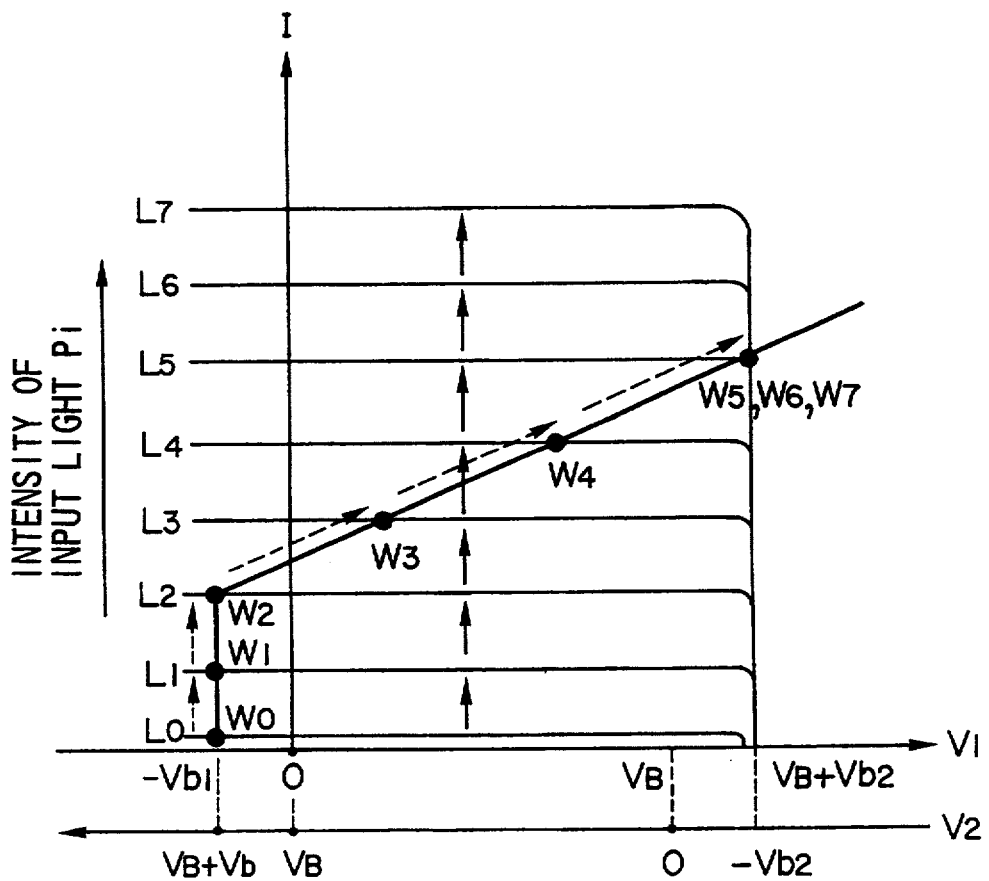
Figure 3C:
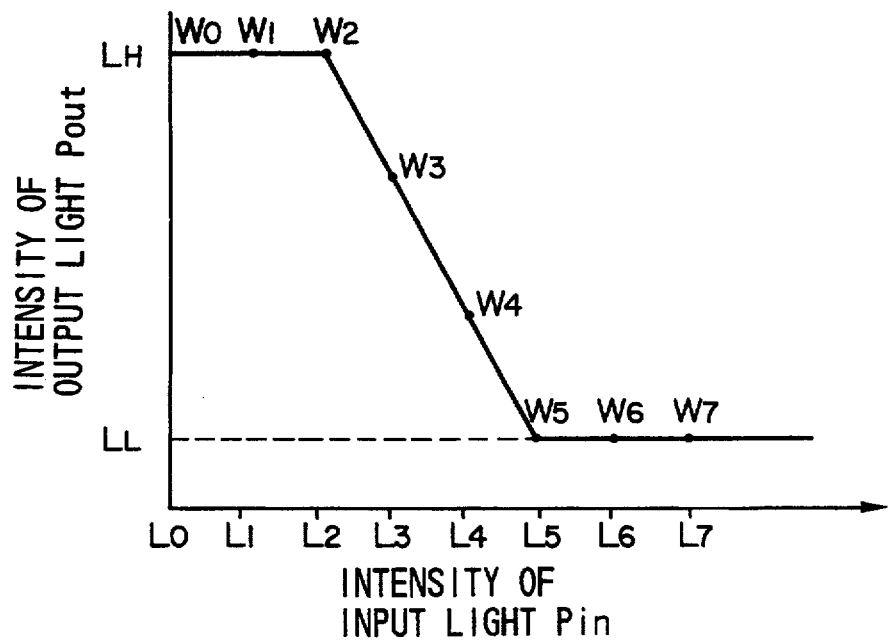

An operation of the optical gate array will be described next in consideration of a combination of the MQW-pin structure optical modulating portion 201 and the photodiode 203 with reference to FIGS. 3(a) to 3(c). FIG. 3(a) shows a structure of an optical gate obtained by combining the MQW-pin structure optical modulating portion 201 and the photodiode 203. FIG. 3(b) show an I-V curve of the MQW-pin structure optical modulating portion 201 and a load curve of the combination of photodiode 203 and the constant-voltage power supply 209 in an overlapping state. Referring to FIGS. 3(a) and 3(b), reference symbols $V_1$ and $V_2$ respectively denote reverse voltages applied to the MQW-pin structure optical modulating portion 201 and to the photodiode 203, i.e., defined as potentials of n-type layers with respect to p-type layers; I, a photocurrent flowing in a positive direction, i.e., flowing from the MQW-pin structure optical modulating portion 201 to the photodiode 203; $V_{b1}$, a built-in voltage of the MQW-pin structure optical modulating portion 201; and $V_{b2}$, a built-in voltage of the photodiode 203. If the respective voltages are defined in this manner, $V_1+V_2$ is constant and equal to a power supply voltage V of the constant-voltage power supply 209. That is, a sum of the reverse bias voltages of the MQW-in structure optical modulating portion 201 and the photodiode 203 is constant, and hence the voltage of the MQW-pin structure optical modulating portion 201 is decreased with an increase in voltage of the photodiode 203.

Assume that the intensity of input light $P_{in}$ incident on the photodiode 203 is increased from zero while bias light $P_{bias}$ having a predetermined intensity is radiated on the MQW-pin structure optical modulating portion 201. In this case, if the reflection intensity of the bias light $P_{bias}$, is monitored, it is found that the I-V curve of the photodiode 203 is shifted upward along the I axis (current I) with an increase in input light $P_{in}$ as follows: $L_0, L_1, L_2, \ldots L_7$, as shown in FIG. 3(b). As a result, the operating point of the MQW-pin structure optical modulating portion 201 is moved as follows: $W_0, W_1, W_2, \ldots W_5$. In this case, the voltage $V_1$ of the pin structure optical modulating portion 201 is abruptly increased from the operating point $W_2$ to the operating point $W_5$. Since output light $P_{out}$ from the pin structure optical modulating portion 201 is decreased with an increase in bias voltage V as described above, negative logic gate characteristics appear in $P_{in}$ −$P_{out}$ characteristics, as shown in FIG. 3(c). Note that even if a phototransistor is connected to the optical modulating portion 201 in place of the photodiode 203, the same operation principle can be applied except for an increase in ratio of an output current to input light, i.e., an increase in optical gain.

Points to be improved to obtain a high contrast in the MQW-pin structure optical modulating portion 201 of the optical gate array of the present invention will be described below by exemplifying AlGaAs/GaAs elements.

First, the residual carrier concentration of an i-MQW layer was decreased to less than $10^{14}$cm$^{-3}$ lower than a normal value by about 100 times so as to increase the maximum thickness of i-type layer, obtained upon depletion in a zero bias period, to 4 μm four times a conventional value. This value was applied to an optical gate array.

Second, the thickness of an AlGaAs barrier layer was set to be 30 Å, ⅓ a conventional value, so as to increase the number of well layers included in the i-MQW layer 1.5 times or more. If the thickness of the i-MQW layer is set to be 4 μm, 310 stacking cycles can be ensured in a structure associated with the present invention (barrier layer: 30 Å; well layer: 100 Å) unlike a conventional MQW structure (barrier layer: 100 Å; well layer: 100 Å).

Third, an n-type layer is formed to have a DBR structure in which n-AlAs layers (715 Å) and n-Al$_{0.3}$Ga$_{0.7}$As layers (629 Å) are alternately stacked on each other in 25 stacking cycles, thus doubling the effective absorption length.

According to such an arrangement, a contrast ratio (100:1) 30 times a conventional value or more can be obtained. Note that these points to be improved can be applied to other materials such as InGaAs/InP, InGaAs/InAlAs, and GaAs/InGaAs.

Examples of the present invention will be described below in the following order with reference to FIGS. 4 to 11:

(1) a GaAs element in which a tunnel junction is used to connect a photodetective portion to a modulating portion;

(2) a GaAs element in which an intermediate electrode is used to connect a photodetective portion to a modulating portion;

(3) a GaAs element in which an AlGaAs epitaxial substrate is used;

(4) a GaAs element in which a phototransistor structure is used for a photodetective portion;

(5) an InP element having the same arrangement as that of the element (1); and (6) an InP element having the same arrangement as that of the element (4).

Figure 4:
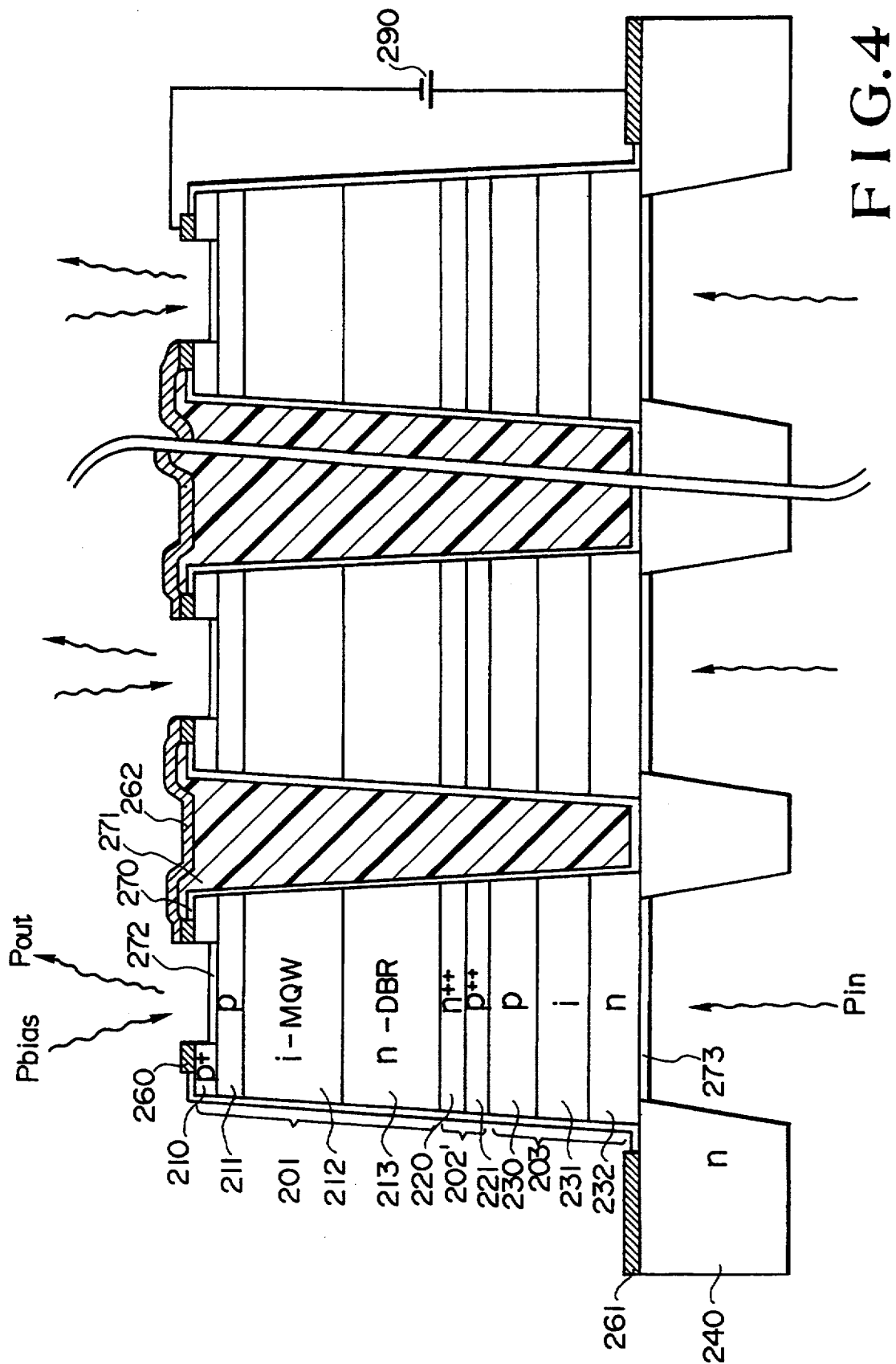
FIG. 4 is a sectional view, showing a GaAs element in which a tunnel junction is used to connect a photodetective portion to a modulating portion, for explaining an example of an optical gate array according to the present invention.

(1) GaAs element in which tunnel junction is used to connect photodetective portion to modulating portion FIG. 4 is a sectional view of an element. Referring to FIG. 4, the following three components were stacked on an Si-doped n-GaAs substrate 240 (thickness: 350 μm) by molecular beam epitaxial deposition: a reflection mode MQW-pin structure optical modulating portion 201 obtained by sequentially stacking a p-GaAs cap layer 210 (thickness: 0.1 μm), a p-Al$_{0.3}$Ga$_{0.7}$As clad layer 211 (thickness: 0.5 μm), an i-MQW layer 212 formed by alternately stacking undoped GaAs well layers (thickness: 100 Å) and undoped Al$_{0.3}$Ga$_{0.7}$As barrier layers (thickness: 30 Å) in 310 stacking cycles, and an n-DBR layer 213 formed by alternately stacking n-AlAs layers (thickness: 715 Å) and n-Al$_{0.3}$Ga$_{0.7}$As layers (thickness: 629 Å) in 25 stacking cycles; a tunnel interconnection layer 202' consisting of an n$^{++}$-GaAs layer 220 (thickness: 0.1 μm) and a p$^{++}$-GaAs layer 221 (thickness: 0.1 μm); and a DH (double-hetero) structure pin photodiode 203 consisting of a p-Al$_{0.3}$G$_{0.7}$As layer 230 (thickness: 0.5 μm), an i-GaAs layer 231 (thickness: 5 μm), and an n-Al$_{0.3}$Ga$_{0.7}$As layer 232 (thickness: 0.5

μm). Note that Be and Si were respectively used as p- and n-type dopants.

A 1.5-cm square chip was cut from a growth wafer. 50×50 pixel constituent elements each having a diameter of 100 μm were formed in a 1-cm square central portion of the chip in the form of a matrix by mesa division. An annular AuZnNi ohmic electrode 260 (thickness: 100 Å) having an outer diameter of 80 μm and an inner diameter of 60 μm was formed on the upper surface of the p-GaAs cap layer. An ohmic electrode 261 (thickness: 1,000 Å) was formed on a chip peripheral portion where a surface portion of the GaAs substrate was exposed by etching. A side surface of the pixel constituting element was protected by an SiN film 270. A polyimide film 271 was buried in each gap between adjacent elements. In order to connect the AuZnNi ohmic electrodes 260 to each other, an AuCr electrode (thickness: 2,000 Å) was formed on the entire upper surface of the structure except for light input- /output portions (the inner part of each annular electrode). After the p-GaAs layer 210 of the photodetective portion and the GaAs substrate 240 on the lower surface side of the element were removed by selective etching, antireflection films 272 and 273 were formed. After the chip was bonded to a glass substrate having pattern electrodes by using transparent epoxy, the AuCr electrode 262 and the AuGeNi electrode 261 were respectively connected to a pair of pattern electrodes on the glass substrate by wire boding. In addition, the positive and negative terminals of a 30-V constant-voltage power supply were respectively connected to the substrate and element sides.

Figure 5:
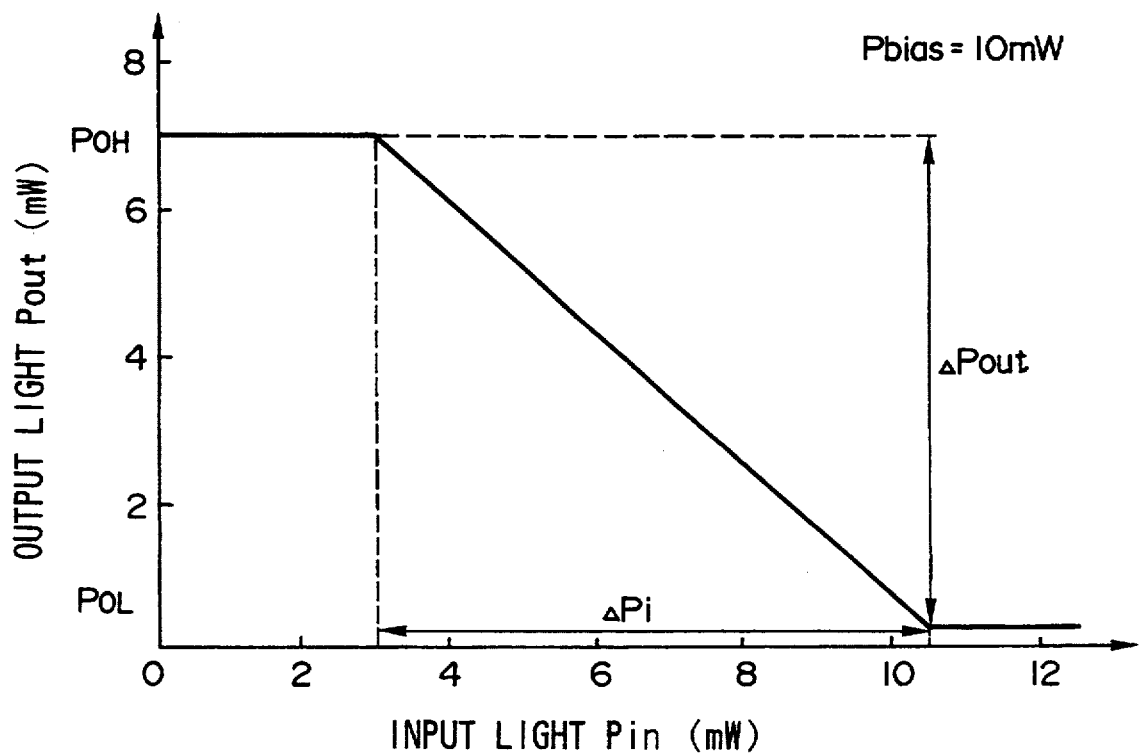
FIG. 5 is a graph showing light input/output characteristics of the element in FIG. 4.

FIG. 5 shows light input/output characteristics of the pixel constituent element. A semiconductor laser beam having a wavelength of 850 nm was used together with input light $P_{in}$ and bias light $P_{bias}$. The input light $P_{in}$ was incident on the lower surface of the substrate while its intensity was changed in the range from 0 to 15 mW. A laser beam having an intensity of 10 mW was focused to have a spot size of 50 μm or less and was radiated, as the bias light $P_{bias}$, on the light input/output portion on the upper surface of the element, and the intensity of reflected light $P_{out}$ was measured by a power meter. As shown in FIG. 5, $P_{in}-P_{out}$ characteristics exhibited negative logic threshold value characteristics. A contrast ratio ($P_{oH}/P_{oL}$) was 30:1, and a gain ($\Delta P_o/\Delta P_i$) was about 1. When a semiconductor laser for radiating input light was driven by a pulse generator, and the response of reflected light was measured by a photodiode, a response time of 20 ns was obtained. Note that when an i-MQW layer having a conventional structure (AlGaAs layer: 100 Å; GaAs layer: 100 Å; 50 cycles) was used, a contrast ratio was 3:1. Therefore, it was confirmed that the contrast ratio was increased ten times by improving the MQW structure.

(2) GaAs element in which intermediate electrode is used to connect photodetective portion to modulating portion In the element shown in FIG. 4, since the tunnel junction is used to connect the photodetective portion to the modulating portion, the internal resistance is increased to decrease the response time. In addition, the maximum intensity of bias light which can be used is limited by a tunnel peak current value. Furthermore, since thermal diffusion of Be as a dopant for the p++-GaAs layer constituting the tunnel interconnection layer 202' is conspicuous, the growth temperature and time of the MQW-pin structure stacked on thereon must be accurately controlled.

FIG. 6 is a sectional view of an element in which a metal interconnection layer, i.e., an intermediate electrode, is used in place of the tunnel interconnection layer 202'. Referring to FIG. 6, the following components are sequentially stacked on an Si-doped GaAs semiconductor substrate 240: a reflection mode MQW-pin structure optical modulating portion 201 having the same structure as that described with reference to FIG. 4; an interconnection layer 204' consisting of an n+-GaAs layer 242 (thickness: 0.5 μm) and a p+-GaAs layer 243 (thickness: 0.5 μm); and a pin diode 203 having the same structure as that described with reference to FIG. 4.

A 1.5-cm square chip was cut from a growth wafer. A 20×20 array was then formed in a 1-cm square central portion of the chip by performing mesa etching three times, as follows:

first step: etching to expose the n+-GaAs layer 242 by using a dot matrix pattern (diameter: 100 μm; pitch: 500 μm) as a mask second step: etching to expose the p+-GaAs layer 243 by using a dot matrix pattern (diameter: 150 μm; pitch: 500 μm) as a mask third step: etching to expose the GaAs substrate 240 by using a dot matrix pattern (diameter: 200 μm; pitch: 500 μm) as a mask The surfaces, of the n+-GaAs layer 242 and the p+-GaAs layer 243, exposed by the first and second mesa etching were connected to each other through an annular AuCr electrode 263 (outer diameter: 175 μm; inner diameter: 125 μm). Since the resistance loss at the connecting portion between the photodetective portion and the modulating portion was reduced, the response time was increased to 10 ns. The contrast ratio and the gain were the same as those obtained by the element (1).

(3) GaAs element having AlGaAs epitaxial substrate

Figure 7:
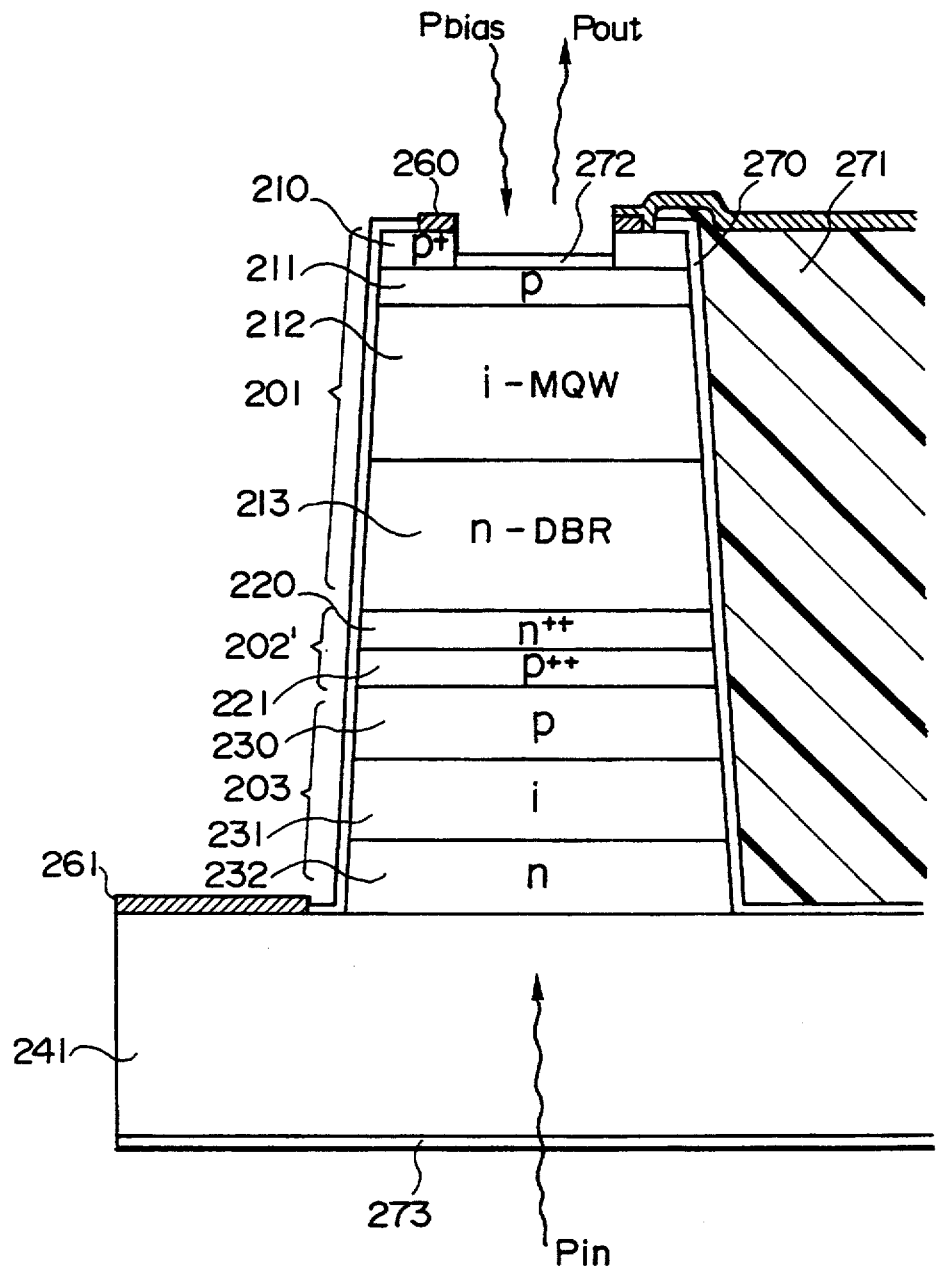
FIG. 7 is a sectional view, showing a GaAs element including an AlGaAs epitaxial substrate, for explaining an example of an optical gate array according to the present invention.

Another problem posed in the element shown in FIG. 4 is that a portion, of the GaAs substrate, at the photodetective portion on the substrate side must be completely removed because the GaAs substrate absorbs light at an operating wavelength of 850 nm. FIG. 7 is a sectional view of an element for solving this problem. Referring to FIG. 7, the same element structure as that shown in FIG. 4 is formed on an AlGaAs epitaxial substrate (Al composition: 0.15; thickness: 300 μm; Te concentration: $1 \times 10^{18}$ cm$^{-3}$) formed by the liquid-phase epitaxial growth method. The band gap of the AlGaAs epitaxial substrate was 780 nm in wavelength, and the transmittance at 850 nm was 60%. The contrast ratio of this element was 30:1, and the gain was about 1. The response time was decreased to 40 ns due to the ohmic resistance of an AuGeNi electrode formed on the AlGaAs substrate.

Figure 8:
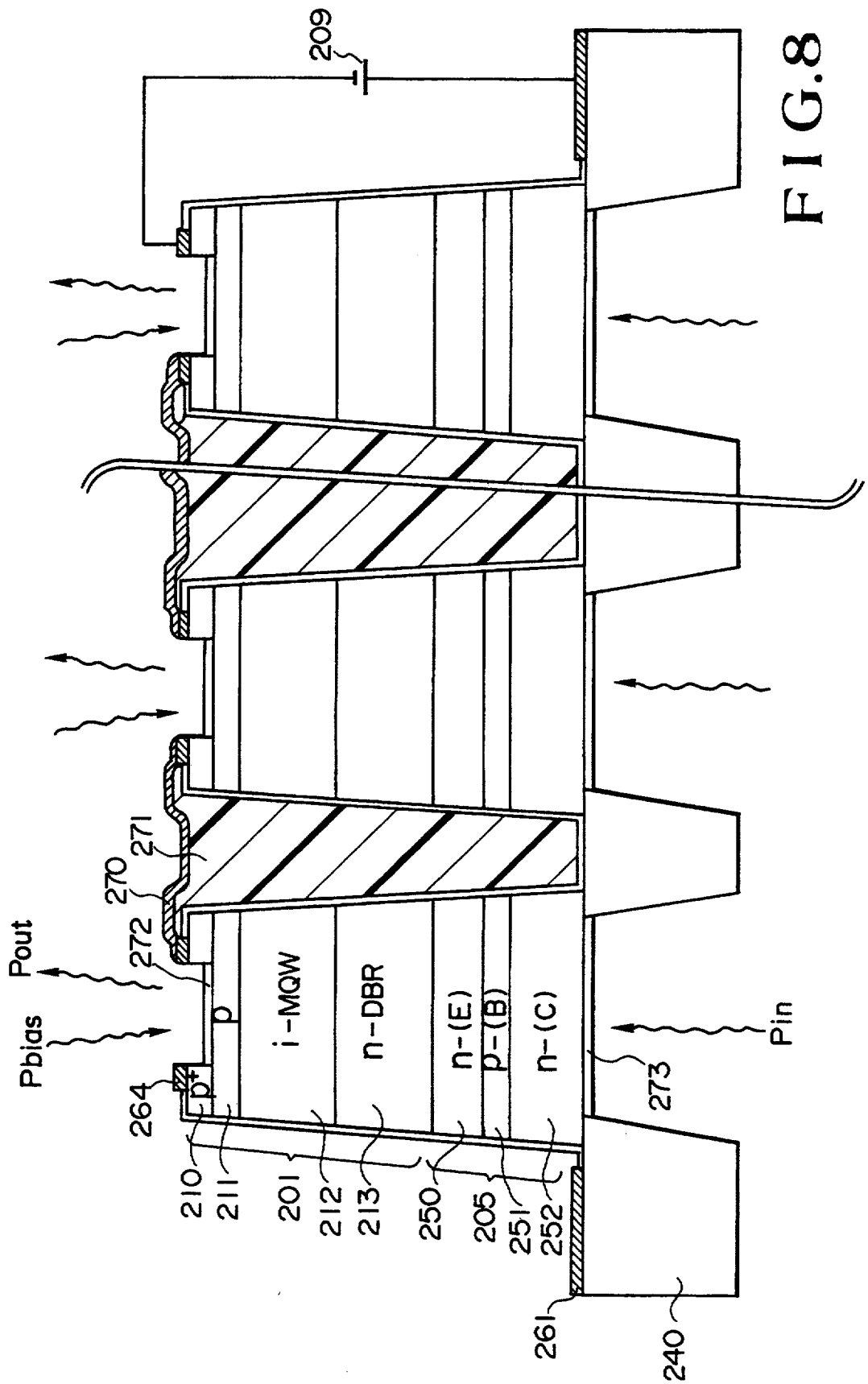
FIGS. 8, 9 and 10 are sectional views each showing a GaAs element in which a phototransistor structure is used for a photodetective portion of an optical gate array according to the present invention.

(4) GaAs element having phototransistor structure used for photodetective portion In the optical gate arrays shown in FIGS. 4 to 7, since a photodiode having no amplification effect is used for a photodetective portion, the gain is small, and ON-/OFF control of high-intensity light by means of weak light is difficult to perform. FIG. 8 is a sectional view of an element in which a heterojunction phototransistor (HPT) structure is used for a photodetective portion so as to allow a switching operation with a high gain. The following components were formed on an Si-doped GaAs substrate by molecular beam epitaxial deposition: a reflection mode MQW-pin structure optical modulating portion 201 having the same structure as that shown in FIG. 4; and an HPT structure 205 consisting of an n-Al$_{0.3}$Ga$_{0.7}$As emitter layer 250 (thickness: 2 μm), a p-GaAs base layer 252 (thickness: 0.25 μm), and an n-GaAs collector layer 252 (thickness: 4 μm). Other structures were the same as those of the element shown in FIG. 4, and a 50×50 array was formed in a 1-cm square portion. The positive and negative terminals of a 30-V constant-voltage power supply were respectively connected to the substrate and element sides.

Figure 11:
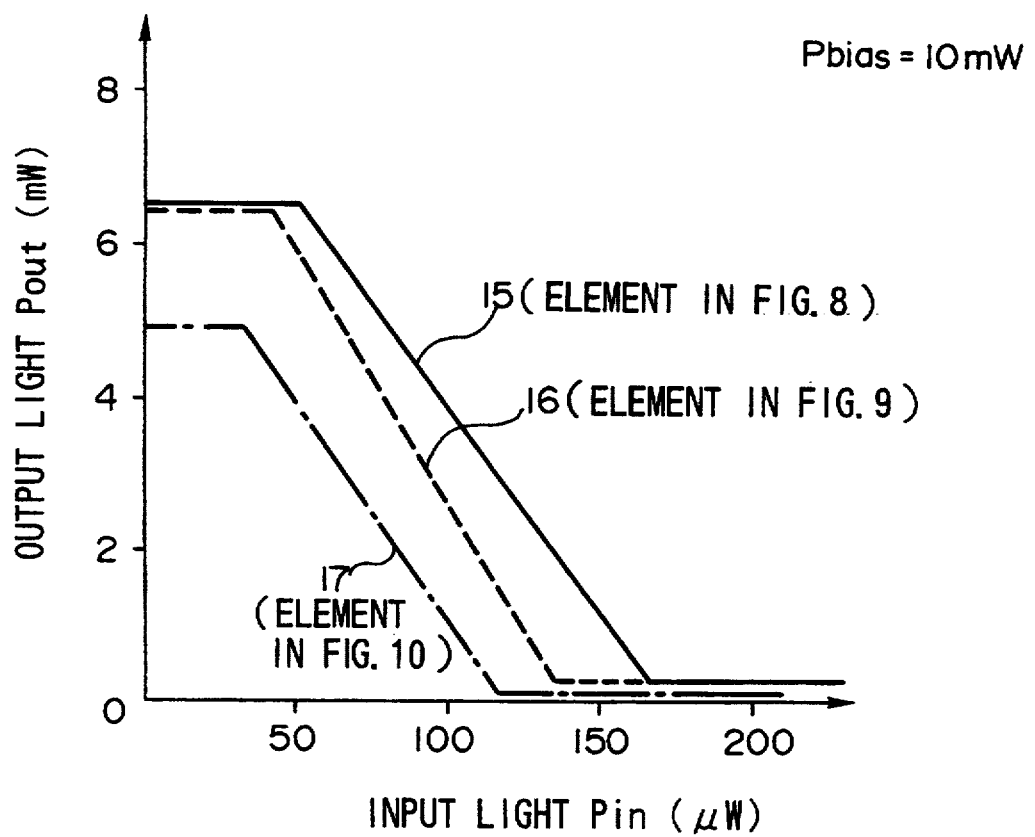
FIG. 11 is a graph showing light input/output characteristics of the elements shown in FIGS. 8 to 10.

The light input/output characteristics of the above-described element are indicated by a solid curve in FIG. 11. A semiconductor laser beam having a wavelength of 850 nm was used together with input light P$_{in}$ and bias light P$_{bias}$. The input light P$_{in}$ was incident on the lower surface of the substrate while its intensity was changed in the range from 0 to 200 μW. A laser beam having an intensity of 10 mW was focused to have a spot size of 50 μm and was radiated, as the bias light P$_{bias}$, onto the light input/output portion on the upper surface of the element, while the intensity of reflected light P$_{out}$ was measured by a power meter. Negative gate characteristics appeared at P$_{in}$=50 μW. The contrast ratio (P$_{oH}$/P$_{oL}$) was 30:1, and the gain (ΔP$_o$/ΔP$_i$) was 60. When a semiconductor laser for radiating input light was driven using a pulse generator, and the response of reflected light was measured by a photodiode, a response time of 10 ns was obtained.

Figure 9:
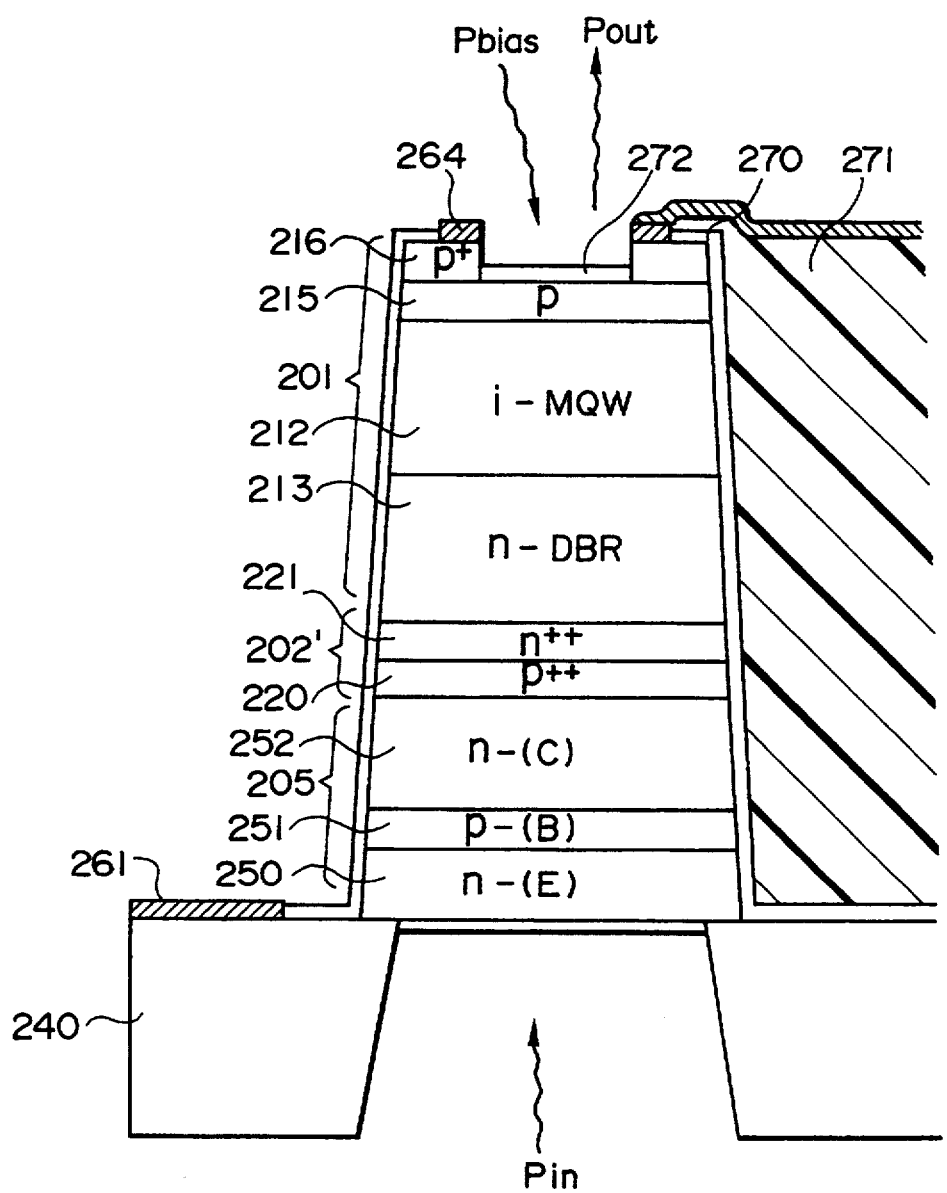

FIG. 9 shows a layer arrangement of an element in which the layer arrangement of the HPT structure is reversed to obtain a larger gain than the element shown in FIG. 8. More specifically, in an HPT structure 205, an n-Al$_{0.3}$Ga$_{0.7}$As emitter layer 250 (thickness: 2 μm), a p-GaAs base layer 251 (thickness: 0.25 μm), and an n-GaAs collector layer 252 (thickness: 4 μm) are sequentially stacked on a substrate in the order named. Since input light P$_{in}$ is incident from the emitter side, high sensitivity is ensured, and the gain of the HPT structure 205 is increased.

The light input/output characteristics of the above-described element are indicated by a dotted curve in FIG. 11. The gain was increased to 75 which was 1.25 times that of the element shown in FIG. 8, and the response time was 20 ns.

Since the HPT structure includes a p++-GaAs base layer doped with Be at a high concentration, thermal aging tends to occur due to annealing. In the structures shown in FIGS. 8 and 9, since the MQW-pin structure optical modulating portion 201 is staked on the HPT structure 205, the growth time and temperature must be accurately controlled, and a careful consideration must be given to annealing in the element manufacturing process.

Figure 10:
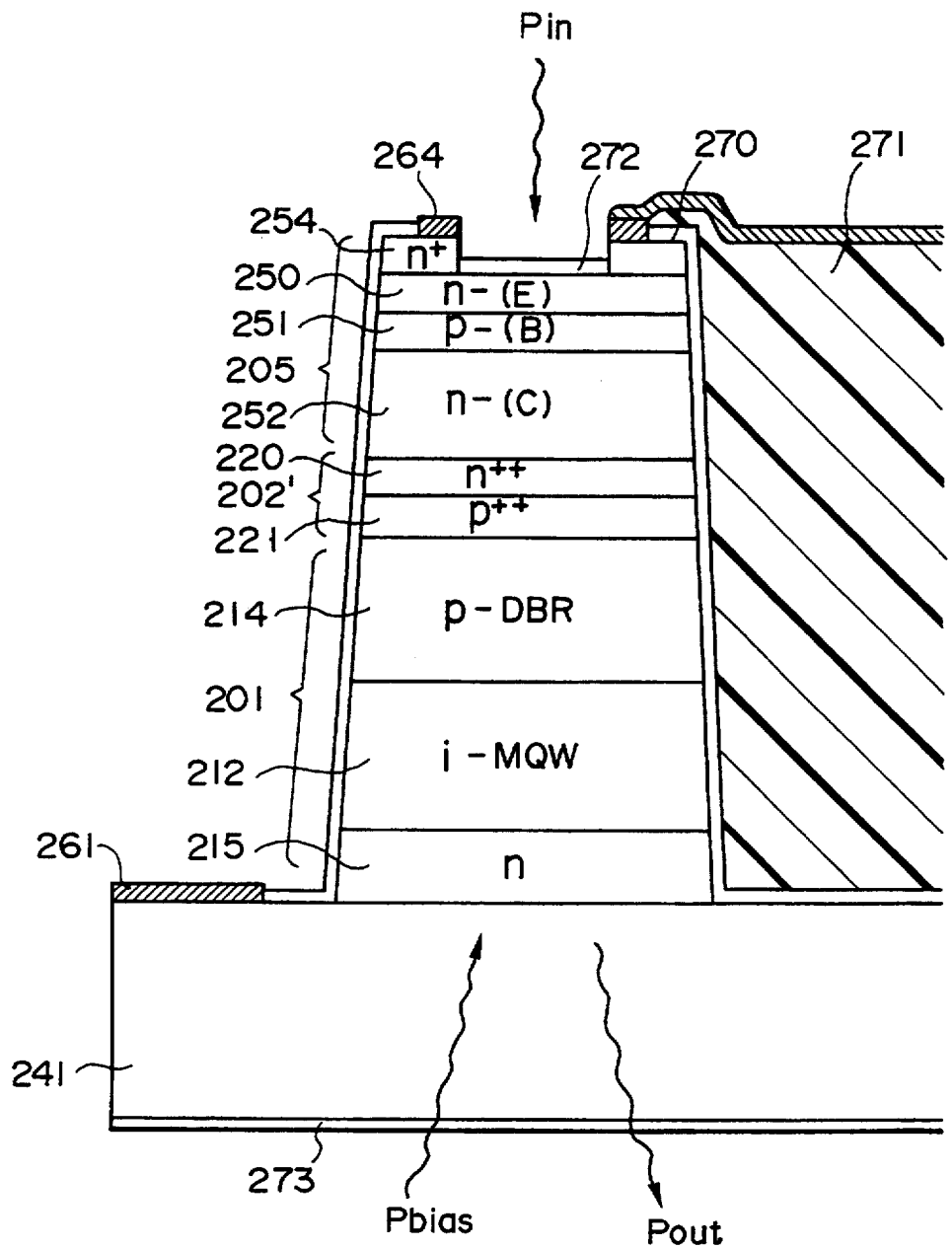

FIG. 10 is a sectional view of an element for eliminating such difficulties in the manufacture. More specifically, the following components are stacked on a Te-doped n-Al$_{0.15}$Ga$_{0.85}$As substrate 241 (thickness: 100 μm): an HPT structure 205 consisting of an n-Al$_{0.3}$Ga$_{0.7}$As emitter layer 250 (thickness: 2 μm), a p-GaAs base layer 251 (thickness: 0.25 μm), and an n-GaAs collector layer 252 (thickness: 4 μm); a tunnel interconnection layer 202' consisting of an n++-GaAs layer 220 (thickness: 0.1 μm) and a p++-GaAs layer 221 (thickness: 0.1 μm); and a reflection mode MQW-pin structure optical modulating portion 201 formed by sequentially stacking a p-DBR layer 214 formed by alternately stacking p-AlAs layers (thickness: 715 Å) and P-Al$_{0.3}$Ga$_{0.7}$As layers (thickness: 629 Å) in 25 stacking cycles, an i-MQW layer 212 formed by alternately stacking undoped GaAs well layers (thickness: 100 Å) and undoped Al$_{0.3}$G$_{0.7}$As barrier layers (thickness: 30 Å) in 310 stacking cycles, and an n-Al$_{0.3}$Ga$_{0.7}$As clad layer 215 (thickness: 0.5 μm). An annular electrode 264 on the upper surface of the element is composed of AuGeNi.

The light input/output characteristics of the above-described element are indicated by an alternate long and short dashed curve in FIG. 11. Input light P$_{in}$ was incident onto the upper surface of the element while its intensity was changed in the range from 0 to 200 μW. A 10-mW laser beam was focused to have a spot size of 50 μm and was radiated, as bias light P$_{bias}$, onto a light input/output portion on the lower surface of the substrate. The intensity of reflected light P$_{out}$ was measured by a power meter. Since the bias light P$_{bias}$ and the reflected light P$_{out}$ were transmitted through the AlGaAs substrate, the intensity of the output light P$_{out}$ was reduced to 0.7 times. However, the contrast ratio, gain, and response time of this element were the same as those of the element shown in FIG. 8.

(5) InP element having the same structure as that of element (1)

Elements each having the same arrangement as that of the element shown in FIG. 7 was manufactured by using the following two materials. Since light having a wavelength corresponding to the operating wavelength (1.3 to 1.5 μm) of the optical gate array was transmitted through an InP substrate, a substrate portion on a photodetective portion was not removed.

InGaAs/InP

A reflection mode MQW-pin structure optical modulating portion 201 was constituted by: a p+-In$_{0.53}$Ga$_{0.47}$As cap layer 210 (thickness: 0.1 μm); a p-InP clad layer 211 (thickness: 0.5 μm); an i-MQW layer 212 formed by alternately stacking undoped In$_{0.53}$Ga$_{0.47}$As well layers (thickness: 80 Å) and undoped InP barrier layers (thickness: 30 Å) in 270 stacking cycles; and an n-DBR layer 213 formed by alternately stacking n-InP layers (thickness: 1,222 Å) and n-In$_{0.63}$Ga$_{0.37}$As$_{0.8}$P$_{0.2}$ (thickness: 1,130 Å) in 40 stacking cycles. A tunnel interconnection layer 202' was constituted by an n++-In$_{0.53}$Ga$_{0.47}$As layer 220 (thickness: 0.1 μm) and a p++-In$_{0.53}$Ga$_{0.47}$As layer 221 (thickness; 0.1 μm). A photodiode 203 was constituted by a p-InP layer 230 (thickness: 0.5 μm), an i-In$_{0.53}$Ga$_{0.47}$As layer 231 (thickness: 2 μm), and an n-InP layer 232 (thickness: 0.5 μm). An n-InP substrate 240 (thickness: 200 μm) was used as a substrate. Epitaxial growth was performed by a gas source MBE method. The size of the array and the manufacturing method were the same as those employed for the element (3). A semiconductor laser beam having a wavelength of 1,550 nm was used both as input light P$_{in}$ and bias light P$_{bias}$. The input light P$_{in}$ was incident on the lower surface of the substrate while its intensity was changed in the range from 0 to 20 mW. A 10-mW laser beam was focused to have a spot size to 50 μm and was radiated, as the bias light P$_{bias}$, onto a light input/output portion on the upper surface of the element. The intensity of reflected light P$_{out}$ was measured by a power meter. The positive and negative terminals of a 25-V constant-voltage power supply were respectively connected to the substrate and element sides. Negative gate characteristics appeared in P$_{in}$−P$_{out}$ characteristics at P$_{in}$=9.4 mW. The contrast ratio (P$_{oH}$/P$_{oL}$) was 20:1, and the response time was 20 ns.

InGaAs/InAlAs

A reflection mode MQW-pin structure optical modulating portion 201 was constituted by: a p+-In$_{0.53}$Ga$_{0.47}$As cap layer 210 (thickness: 0.1 μm); a p-In$_{0.52}$Al$_{0.48}$As clad layer 211 (thickness; 0.5 μm); an i-MQW layer 212 formed by alternately stacking undoped In$_{0.53}$Ga$_{0.47}$As well layers (thickness: 70 Å) and undoped In$_{0.52}$Al$_{0.48}$As barrier layers (thickness: 30 Å) in 300 stacking cycles; and an n-DBR layer 213 formed by alternately stacking n-In$_{0.52}$Al$_{0.48}$As layers (thickness: 1,225 Å) and n-In$_{0.52}$(Al$_{0.25}$Ga$_{0.75}$)$_{0.48}$As layers (thickness: 1,120 Å) in 213 stacking cycles. A tunnel interconnection layer 202' was constituted by an n++-In$_{0.53}$Ga$_{0.47}$As layer 220 (thickness: 0.1 μm) and a p++-In$_{0.53}$Ga$_{0.47}$As layer 221 (thickness: 0.1 μm). A photodiode 203 was constituted by a p-In$_{0.52}$Al$_{0.48}$As layer 230 (thickness: 0.5 μm), an i-In$_{0.53}$Ga$_{0.47}$As layer 231 (thickness: 2 μm), and an n-In$_{0.53}$Al$_{0.48}$As layer 232 (thickness: 0.5 μm). An n-InP substrate 240 (thickness: 200 μm) was used as a substrate. Epitaxial growth was performed by an MBE method. The size of the array and the manufacturing method were the same as those employed for the element (3). A semiconductor laser beam having a wavelength 1,550 nm was used both as input light P$_{in}$ and bias light P$_{bias}$. The input light P$_{in}$ was incident on the lower surface of the substrate while its intensity was changed in the range from 0 to 15 mW. A 10-mW laser beam was focused to have a spot size of 50 μm or less and was radiated, as the bias light P$_{bias}$, onto a light input/output portion on the upper surface of the element. The positive and negative terminals of a 25-V constant-voltage power supply were respectively connected to the substrate and element sides. Negative logic threshold value characteristics appeared in P$_{in}$−P$_{out}$ characteristics. The contrast ratio (P$_{oH}$/P$_{oL}$) was 25:1, and the response time was 20 ns.

(6) InP element having the same structure as that of element (4)

Elements each having the same arrangement as that shown in FIG. 8 were manufactured by using the following two materials. Since light having a wavelength corresponding to the operating wavelength (1.3 to 1.5 μm) of the optical gate array was transmitted through an InP substrate, a substrate portion on a photodetective portion was not removed.

InGaAs/InP

A reflection mode MQW-pin structure optical modulating portion 201 was constituted by: a p+-In$_{0.53}$Ga$_{0.47}$As cap layer 210 (thickness: 0.1 μm); a p-InP clad layer 211 (thickness: 0.5 μm); an i-MQW layer 212 formed by alternately stacking undoped In$_{0.53}$Ga$_{0.47}$As well layers (thickness: 80 Å) and undoped InP barrier layers (thickness: 30 Å) in 270 stacking cycles; and an n-DBR layer 213 formed by alternately stacking n-InP layers (thickness: 1,222 Å) and n-In$_{0.63}$Ga$_{0.37}$As$_{0.8}$P$_{0.2}$ (thickness: 1,130 Å) in 40 stacking cycles. An HPT structure 205 was constituted by an n-InP emitter layer 250 (thickness: 2 μm), a p-In$_{0.53}$Ga$_{0.47}$As base layer 251 (thickness: 0.25 μm), and an n-In$_{0.53}$Ga$_{0.47}$As collector layer 252 (thickness: 4 μm). An n-InP substrate 240 (thickness: 200 μm) was used as a substrate. Epitaxial growth was performed by a gas source MBE method. The size of the array and the manufacturing method were the same as those employed for the element (4). A semiconductor laser beam having a wavelength of 1,550 nm was used both as input light P$_{in}$ and bias light P$_{bias}$. The input light P$_{in}$ was incident on the lower surface of the substrate while its intensity was changed in the range from 0 to 300 μW. A 10-W laser beam was focused to have a spot size of 50 μm or less and was radiated, as the bias light P$_{bias}$, onto a light input/output portion of the upper surface of the element. The intensity of reflected light P$_{out}$ was measured by a power meter. The positive and negative terminals of a 25-V constant-voltage power supply were respectively connected to the substrate and element sides. Negative logic threshold value characteristics appeared in P$_{in}$−P$_{out}$ characteristics at P$_{in}$=180 μW. The contrast ratio (P$_{oH}$/P$_{oL}$) was 20:1, and the response time was 10 ns.

InGaAs/InAlAs

A reflection mode MQW-pin structure optical modulating portion 201 was constituted by: a p+-In$_{0.53}$Ga$_{0.47}$As cap layer 210 (thickness: 0.1 μm); a p-In$_{0.52}$Al$_{0.48}$As clad layer 211 (thickness: 0.5 μm); an i-MQW layer 212 formed by alternately stacking undoped In$_{0.53}$Ga$_{0.47}$As well layers (thickness: 70 Å) and undoped In$_{0.52}$Al$_{0.48}$As layers (thickness: 30 Å) in 300 stacking cycles; and an n-DBR layer 213 formed by alternately stacking n-In$_{0.52}$Al$_{0.48}$As layers (thickness: 1,225 Å) and n-In$_{0.52}$(Al$_{0.25}$Ga$_{0.75}$)$_{0.48}$As layers (thickness: 1,120 Å) in 40 stacking cycles. An HPT structure 205 was constituted by an n-In$_{0.52}$Al$_{0.48}$As emitter layer 250 (thickness: 2 μm), a p-In$_{0.53}$Ga$_{0.47}$As base layer 251 (thickness: 0.25 μm), and an n-In$_{0.53}$Ga$_{0.47}$As collector layer 252 (thickness: 4 μm). An n-InP substrate 240 (thickness: 200 μm) was used as a substrate. Epitaxial growth was performed by an MBE method. The size of the array and the manufacturing method were the same as those employed for the element (3). A semiconductor laser beam having a wavelength of 1,520 nm was used both as input light P$_{in}$ and bias light P$_{bias}$. The input light P$_{in}$ was incident on the lower surface of the substrate while its intensity was changed in the range from 0 to 300 μW. A 10-mW laser beam was focused to have a spot diameter to 50 μm or less and was radiated, as the bias light P$_{bias}$, onto a light input/output portion on the upper surface of the element. The intensity of reflected light P$_{out}$ was measured by a power meter. The positive and negative terminals of a 25-V constant-voltage power supply were respectively connected to the substrate and element sides. Negative logic threshold value characteristics appeared in P$_{in}$−P$_{out}$ characteristics at P$_{in}$=180 μW. The contrast ratio (P$_{oH}$/P$_{oL}$) was 25:1, and the response time was 10 ns.

The following modifications can be made by changing the structure of the examples described above:

(1) a structure obtained by using a p-type substrate in place of an n-type substrate and inverting the conductivity types of all the layers;

(2) a structure obtained by reversing the stacking order of an MQW-pin structure optical modulating portion and a photodiode or an HPT structure, as shown in, e.g., FIG. 10;

(3) an optical gate array to be driven in a 0.95-μm band, in which an i-MQW layer is constituted by GaAs/InGaAs or AlGaAs/InGaAs, a DBR layer is constituted by AlAs/GaAs, and a photodetective portion is constituted by an InGaAs pin diode or an HPT structure;

(4) an element having a photodetective portion constituted by one of the following components, i.e., ①  a phototransistor having a pnp structure, ② a pin phototransistor including an i-MQW layer, and ③ an HPT structure including an i-MQW layer between a base and a collector; and (5) an element in which an Si substrate is used as a substrate and a GaAs or InP layer structure is formed by hetero-epitaxial growth.

Figure 12A:
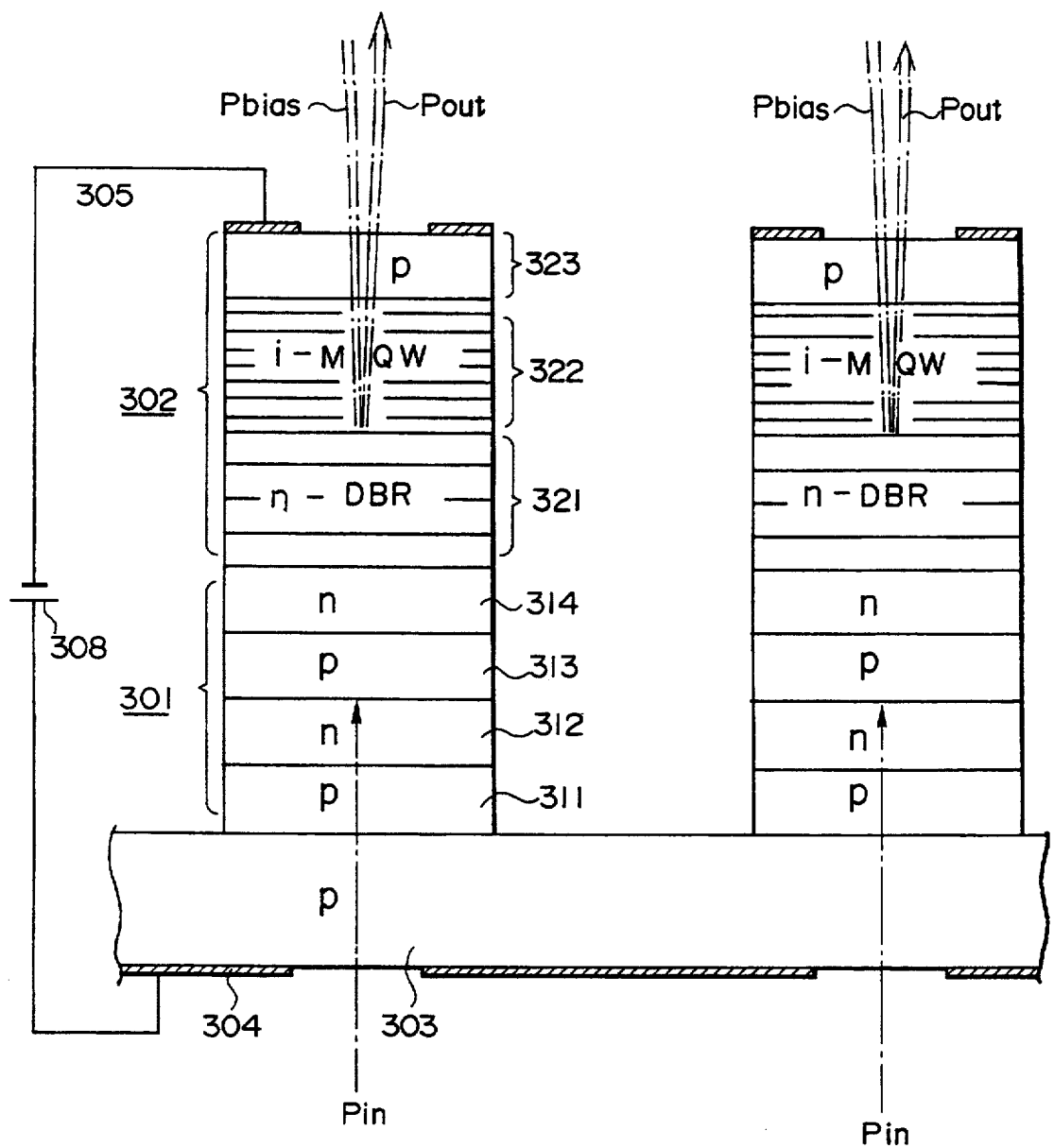
FIG. 12(a) is a sectional view for explaining an arrangement in which a thyristor is used for a photodetector of an optical gate array according to the present invention.

FIG. 12(a) is a sectional view of a fundamental structure of another embodiment of the present invention. A pnpn optical thyristor 301 and a MQW-pin modulator 302 are stacked on a p-type semiconductor substrate 303. The pnpn optical thyristor 301 consists of a p-type layer 311, an n-type layer 312, a p-type layer 313, and an n-type layer 314. The MQW-pin modulator 302 consists of an n-DBR structure 321, an i-MQW layer 322, and a p-type clad layer 323. Electrodes 304 and 305 are respectively formed on surfaces of the semiconductor substrate 303 and the pin modulating portion 302. The positive and negative terminals of a constant-voltage power supply 308 are respectively Connected to the substrate and element sides. Input light $P_{in}$ is incident on the substrate 303, and output light $P_{out}$ is obtained as reflected light of bias light $P_{bias}$ radiated on the pin modulator 302.

Figure 12B:
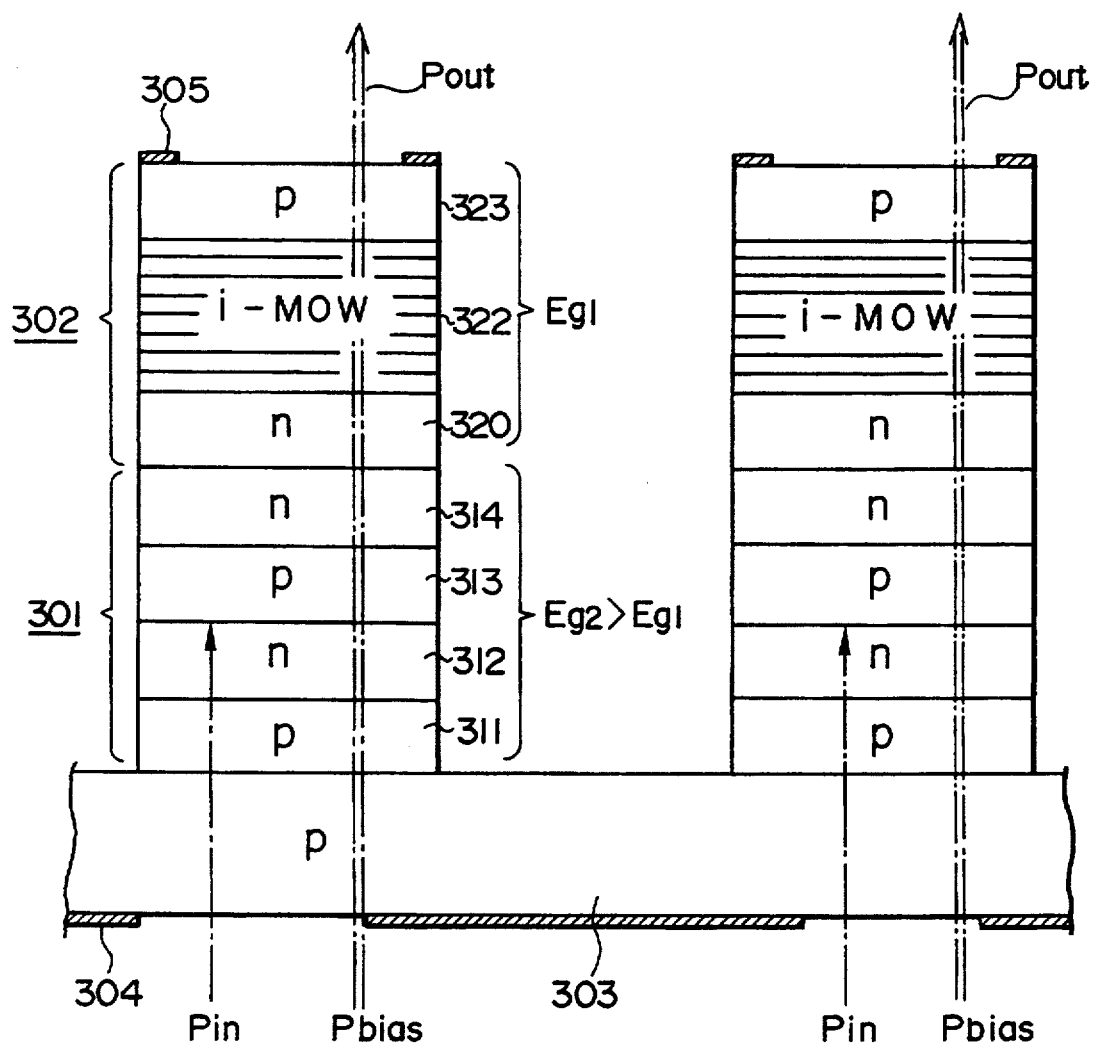
FIG. 12(b) is a sectional view showing a transmission type optical gate array.

FIG. 12(b) shows a structure in which a pnpn optical thyristor 301 and an MQW-pin modulator 302 are stacked on a p-type semiconductor substrate 303. The MQW-pin modulator 302 consists of an n-type layer 320, an i-MQW layer 322, and a p-type clad layer 323. In this case, an energy band gap $Eg_2$ of the optical thyristor 301 is set to be smaller than an energy band gap $Eg_1$ of the pin modulator 302. Both input light $P_{in}$ (energy $h\nu_2$) and bias light $P_{bias}$ (energy $h\nu_1$ ($<h\nu_2$)) are incident on the substrate 303. Output light $P_{out}$ is obtained from the pin modulator 302 as transmitted light of bias light.

Note that other structures may be obtained by using an n-type semiconductor substrate and inverting the conductivity types of all the layers of the structures shown in FIGS. 12(a) and 12(b). In addition, an MQW-pin structure and an optical thyristor may be stacked on a semiconductor in the order named, so that the radiation directions of input and output light beams can be reversed.

FIG. 13 is an equivalent circuit diagram of an element of the present invention.

In this element, as shown in FIG. 13, a pnpn optical thyristor 301, an MQW-pin modulator 302, and a constant-voltage power supply 308 (voltage $V_B$) are connected in series with each other. Referring to FIG. 13, reference symbol $V_1$ denotes a reverse bias voltage (the potential of an n-type layer with respect to that of a p-type layer) applied to the MQW-pin modulator 302; $V_2$, a forward bias voltage (the potential of the p-type layer with respect to that of the n-type layer) applied to the optical thyristor 301; and I, a current flowing from the positive pole of the constant-voltage power supply 308 to the negative pole through the optical thyristor 301 and the MQW-pin modulator 302. A sum of the voltages $V_1$ and $V_2$ is always kept to be the voltage $V_B$. That is, a voltage to be applied to the MQW-pin modulator 302 is increased with a decrease in voltage to be applied to the optical thyristor 301.

Changes in the voltage $V_1$ applied to the MQW-pin modulator 302 will be described below wherein the intensity of input light $P_{in}$ incident on the optical thyristor 301 is increased from 0. FIG. 14 shows I-V curves of the MQW-pin modulator 302 and the optical thyristor 301, which overlap each other on a $V_1$-I coordinate system. Referring to FIG. 14, reference numeral ① denotes an I-V curve, of the MQW-pin modulator, obtained upon radiation of bias light $P_{bias}$; and ③, an I-V curve, of the optical thyristor 301, obtained when no input light $P_{in}$ is radiated. An operating point for $P_{in}=0$ is denoted by reference symbol A. At this point, the MQW-pin modulator 2 is substantially set in a zero bias state. An I-V curve ④ is a curve of the optical thyristor 1 which is obtained when the intensity of the input light $P_{in}$ reaches $P_1$. At this time, since the operating point Jumps from a point B to a point C, the voltage $V_1$ is abruptly increased. That is, the MQW-pin modulator is quickly switched from the zero bias state to a full bias state. In this case, even if the intensity of the input light $P_{in}$ exceeds $P_1$ (⑤) or is decreased to 0 (③), the operation point stays at the point C.

In order to return the operating point from the point C to the point A, the bias light $P_{bias}$ is temporarily turned off while $P_{in}=0$. That is, if the MQW-pin modulator is set in a dark state, the I-V curve ② appears, and the operating point jumps to a point D. When the bias light $P_{bias}$ is tuned on again, the operating point returns from the point D to the point A. Alternatively, the voltage $V_B$ may be turned off while $P_{in}=0$.

Figure 15A:
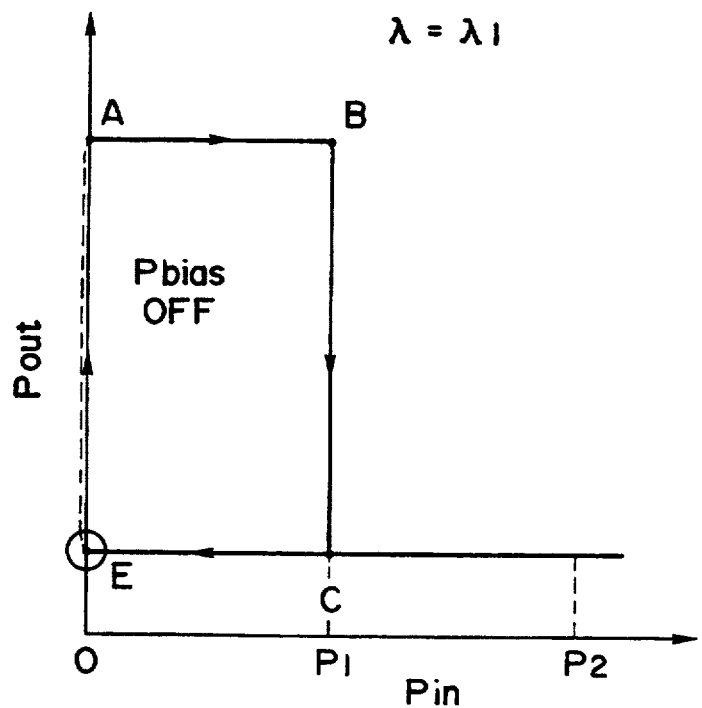
FIGS. 15(a) to 15(d) and FIGS. 16(a) to 16(d) are graphs and timing charts, showing light input/output characteristics, for explaining elements of the present invention.
Figure 15B:
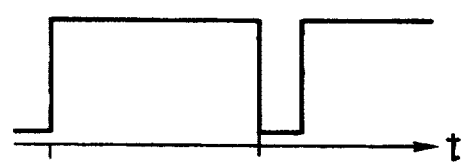
Figure 15C:
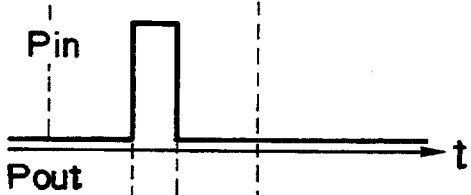
Figure 15D:
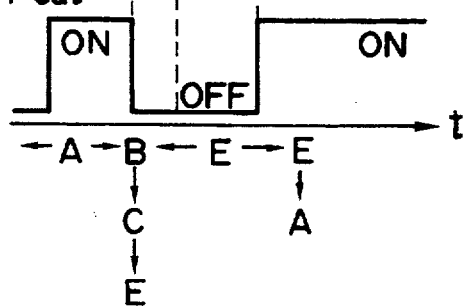

FIGS. 15(a) to 16(d) respectively show $P_{in}-P_{out}$ characteristics obtained when operation states are defined by $\lambda_1$ and $\lambda_2$ in FIG. 2. FIG. 15(a) shows $P_{in}-P_{out}$ characteristics for $\lambda_1$. FIGS. 15(b) to 15(d) respectively show ON-OFF states of bias light, input light, and output light at the respective operating points. When the input light $P_{in}$ is zero, the MQW-pin modulator is in a zero bias state, i.e., a transmission state (A). However, since the MQW-pin modulator is switched to an absorption state when $P_{in}=P_1$, output light $P_{out}$ is abruptly decreased (B→C). Even if $P_{in}=0$, since the MQW-pin modulator is kept in the absorption state, the value of $P_{out}$ is kept small (C→E). If, in this case, the bias light $P_{bias}$, is turned off as a pulse, the MQW-pin modulator is reset in a transmission state (E→A). In this manner, the light input/output characteristics exhibit negative bistable characteristics including perfect memory characteristics.

Figure 16A:
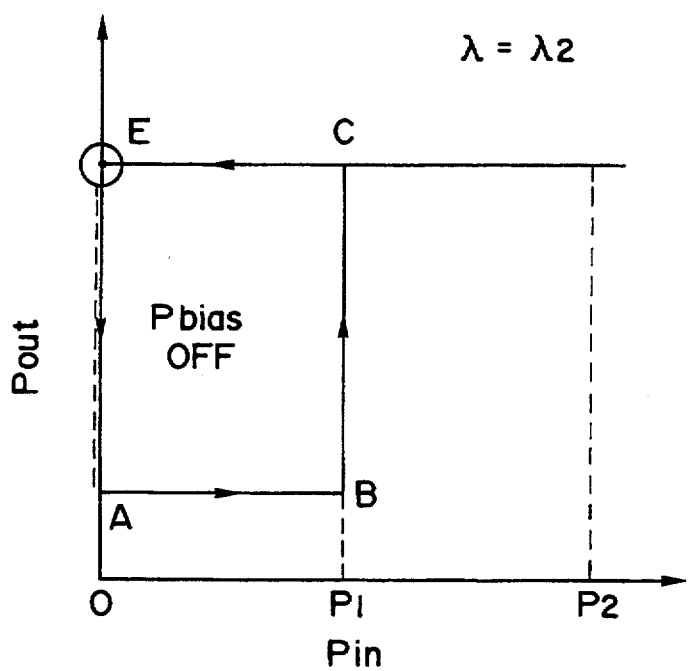

FIG. 16(a) shows $P_{in}-P_{out}$ characteristics for $\lambda_2$. The characteristics exhibit positive bistable characteristics, as shown in FIG. 16(a).

Figure 16B:
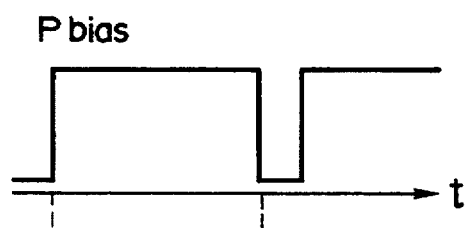
Figure 16C:
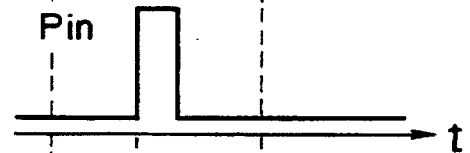
Figure 16D:
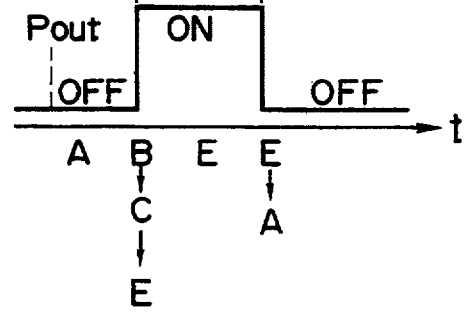

Note that FIGS. 16(b) to 16(d) respectively show ON-OFF states of bias light, input light, and output light at the respective operating points.

Examples of the present invention will be described below.

EXAMPLE 1

GaAs/AlGaAs reflection type element

Figure 17:
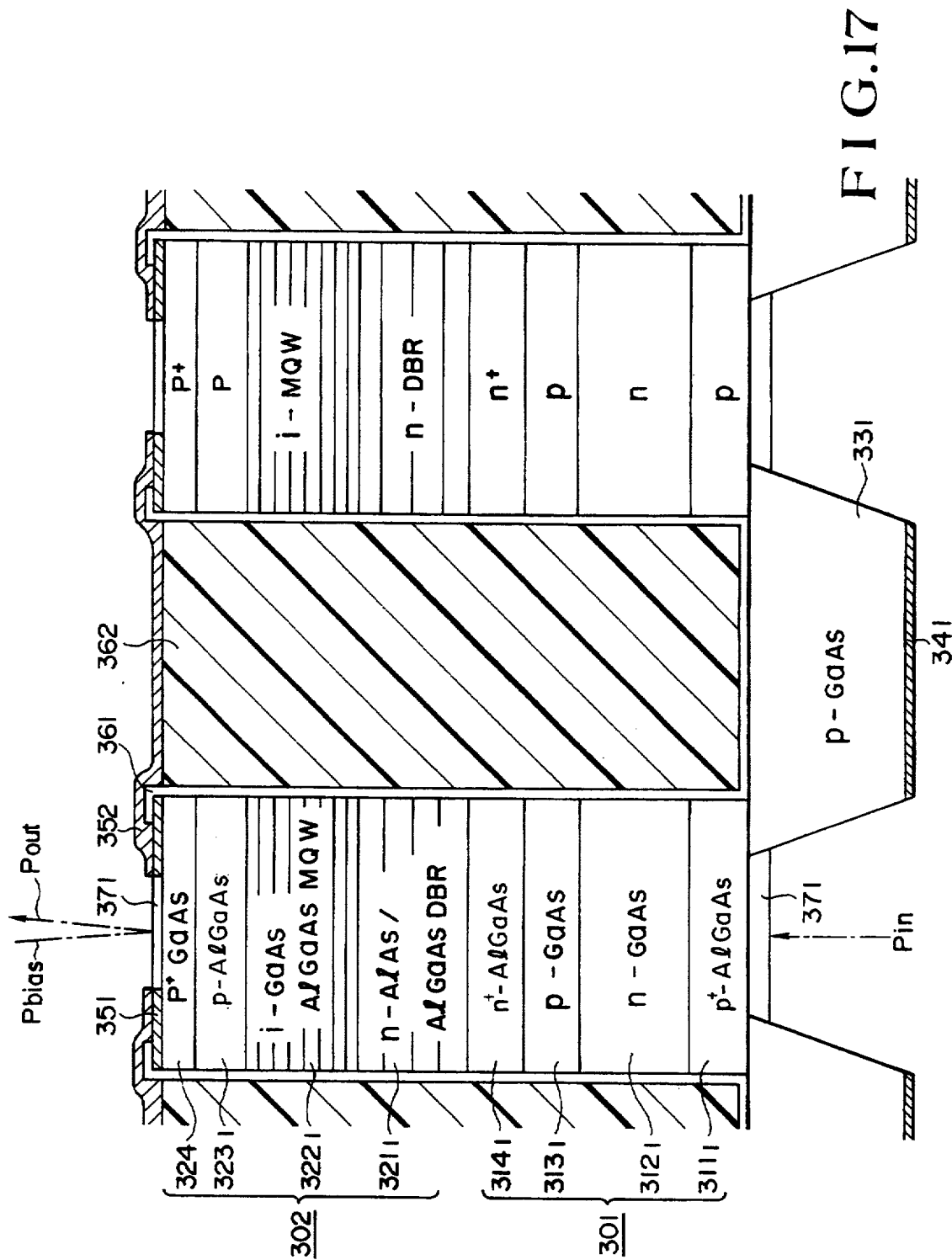
FIG. 17 is a sectional view showing a layer arrangement of a GaAs/AlGaAs reflection type element.

As shown in FIG. 17, the following components were stacked on a Zn-doped GaAs substrate 331 by molecular beam epitaxial deposition: a pnp optical thyristor 301 consisting of a p$^+$-AlGaAs layer 311$_1$ (thickness: 1 μm), an n-GaAs layer 312$_1$ (thickness: 2 μm), a p-GaAs layer 313$_1$ (thickness: 0.2 μm), and an n$^+$-AlGaAs layer 314$_1$ (thickness: 0.5 μm); and a p$^+$-GaAs layer 302 consisting of an n-DBR layer 321$_1$ formed by alternately stacking n-AlAs layers (thickness: 629 Å) and n-Al$_{0.3}$Ga$_{0.7}$As layers (thickness: 715 Å) in 25 stacking cycles, an i-MQW layer 322$_1$ formed by alternately stacking undoped GaAs layers (thickness: 100 Å) and undoped Al$_{0.3}$Ga$_{0.7}$As layers (thickness: 50 Å) in 270 stacking cycles, a p-Al$_{0.3}$Ga$_{0.7}$As layer 323$_1$ (thickness: 0.5 μm), and a p$^+$-GaAs layer 324 (thickness: 0.1 μm). In this case, Be and Si were respectively used as p- and n-type dopants.

A 1.5-cm square chip was cut from a growth wafer. A 50×50 matrix was formed in a 1-cm square central portion of the chip by mesa division (diameter: 100 μm; pitch: 200 μm), thus forming a bit element. An annular AuZnNi ohmic electrode 351 (thickness: 1,000 Å) having an outer diameter of 80 μm and an inner diameter of 60 μm was formed on the upper surface of the p-GaAs cap layer 324. A AuZnNi/Cr/Au ohmic electrode 341 (thickness: 1,000 Å) was formed on the entire lower surface of the substrate. A side surface of the bit constituent element was insulated by an SiN film 361, and a gap between adjacent elements was filled with a polyimide layer 362. In order to connect the AuZnNi ohmic electrodes 351, on the upper surface, with each other, an AuCr electrode 352 (thickness: 2,000 Å) was formed in a light input/output portion (inside the annular electrode). After the p-GaAs layer on a photodetective portion and the GaAs substrate 331 on the lower surface of the element were selectively etched, an antireflection film 371 was formed. After the chip was bonded to a glass substrate having patterned electrodes by using transparent epoxy, the surface electrode and the substrate electrode were respectively connected to a pair of patterned electrodes on the glass substrate by wire bonding. The positive and negative terminals of a 30-V constant-voltage power supply 308 were respectively connected to the substrate and surface sides.

Figure 18:
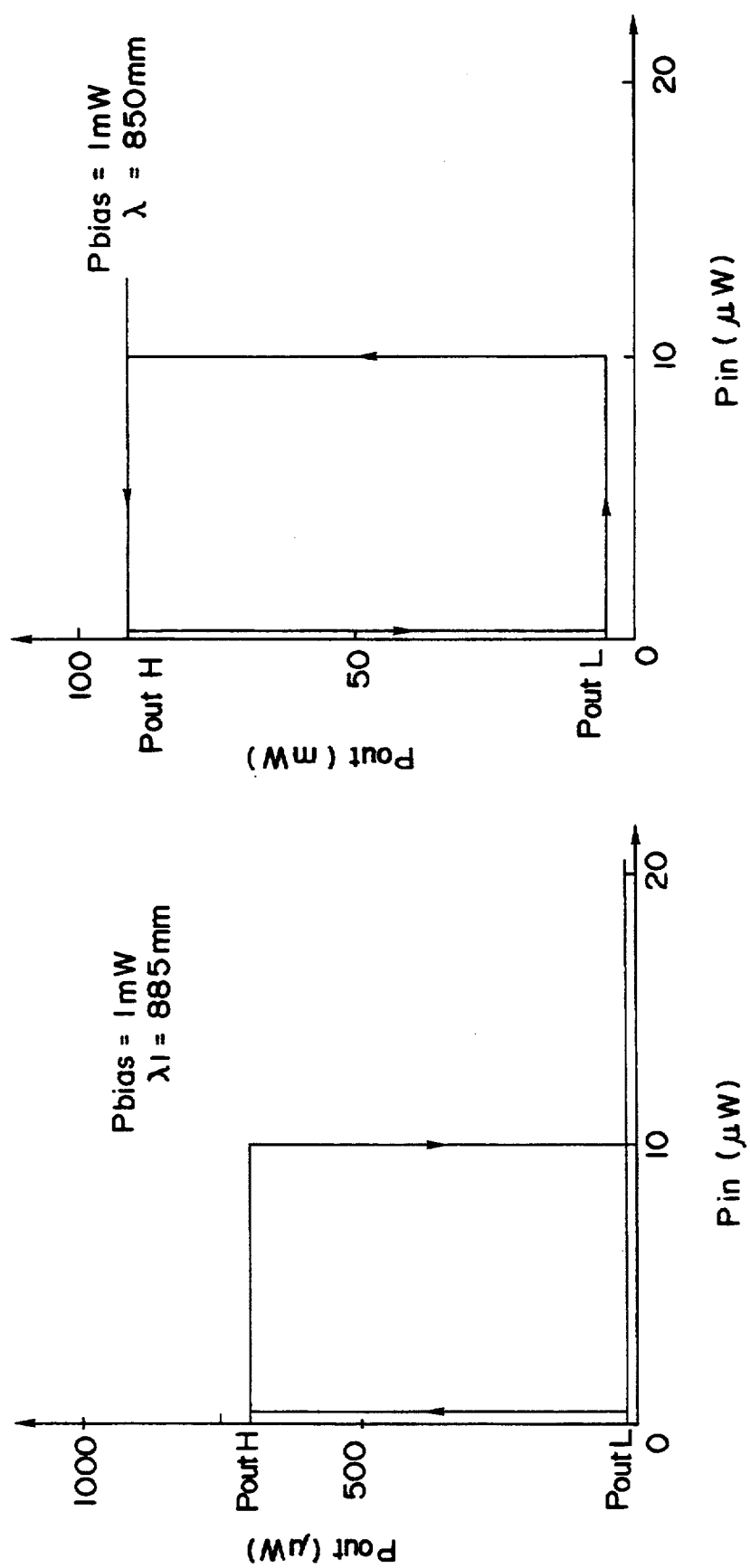
FIGS. 18(a) and 18(b) are graphs showing light input/output characteristics of the element in FIG. 17.

FIGS. 18(a) and 18(b) show light input/output characteristics of the pixel constituent element shown in FIG. 17. A semiconductor laser beam having a wavelength of 850 to 855 nm was used both as input light and bias light. Input light was incident on the lower surface of the substrate while its intensity was changed in the range from 0 to 100 μW. A 1-mW laser beam was focused to have a spot size of 50 μm or less and was radiated, as bias light, onto the light input/output portion on the element surface. Reflected light intensity $P_{out}$ was measured by a power meter. As shown in FIG. 18(a), the $P_{in}-P_{out}$ characteristics exhibited negative logic type bistable characteristics when λ=855 nm. The contrast ratio ($P_{outH}/P_{outL}$) was 30:1, and the response time was 50 ns. It was confirmed that a low transmission state was maintained even when $P_{in}$ was returned to zero, and the state was reset to a high transmission state when $P_{bias}$ was turned off.

When λ=850 nm, the $P_{in}-P_{out}$ characteristics exhibited positive logic type bistable characteristics, as shown in FIG. 18(b). The contrast ratio was 40:1, and the response time was 30 ns. In this case, the above-mentioned memory and reset operations were also confirmed.

Figure 19:
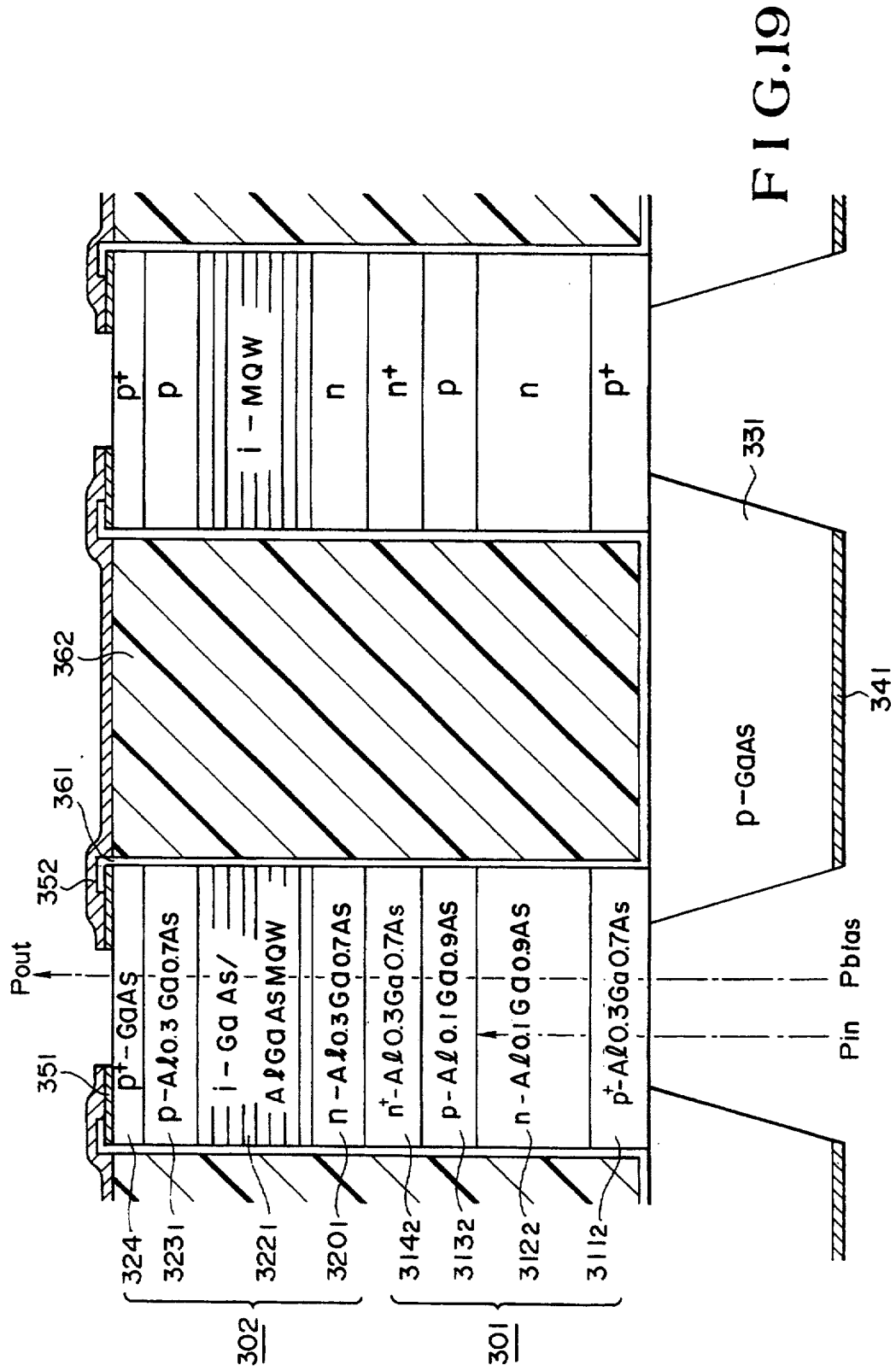
FIG. 19 is a sectional view showing a layer structure of a GaAs/AlGaAs/transmission type element.

FIG. 19 shows a transmission type element, in which an optical thyristor 301 and an MQW-pin modulator 302 were stacked on a Zn-doped GaAs substrate 331 by molecular beam epitaxial deposition. The optical thyristor 301 consisted of a p+-$Al_{0.3}Ga_{0.9}As$ layer $311_2$ (thickness: 1 μm), an n-$Al_{0.1}Ga_{0.9}As$ layer $312_2$ (thickness: 2 μm), a p-$Al_{0.1}Ga_{0.9}As$ layer $313_2$ (thickness: 0.2 μm), and an n+-$Al_{0.3}Ga_{0.7}As$ layer $314_2$ (thickness: 0.5 μm). The MQW-pin modulator 302 consisted of an n-$Al_{0.3}Ga_{0.7}As$ layer $320_1$ (thickness: 0.5 μm), an i-MQW layer $322_1$ formed by alternately stacking undoped GaAs layers (thickness: 100 Å) and undoped $Al_{0.3}Ga_{0.7}As$ layers (thickness: 50 Å) in 270 stacking cycles, a p-$Al_{0.3}Ga_{0.7}As$ layer $323_1$ (thickness: 0.5 μm), and a p+-GaAs layer 324 (thickness; 0.1 μm).

Semiconductor laser beams having wavelengths of 750 nm and 855 nm were respectively used as input light and bias light. The input light was incident on the lower surface of the substrate while its intensity was changed in the range from 0 to 100 μW. A 1-mW laser beam was focused to have a spot size of 50 μm or less and was radiated, as bias light, onto the lower surface of the substrate. A transmitted light intensity $P_{out}$ was measured by a power meter. The $P_{in}-P_{out}$ characteristics exhibited negative bistable characteristics. The contrast ratio ($P_{outH}/P_{outL}$) was 18:1, and the response time was 50 ns.

EXAMPLE 2

GaAs/InGaAs reflection type element

An optical thyristor 301 and an MQW-pin modulator 302 were stacked on a Zn-doped GaAs substrate by molecular beam epitaxial deposition. The optical thyristor 301 consisted of a p+-AlGaAs layer (thickness: 1 μm), an n-GaAs layer (thickness: 2 μm), a p-GaAs layer (thickness: 0.2 μm), and an n+-AlGaAs layer (thickness: 0.5 μm). The MQW-pin modulator 302 consisted of an n-DBR layer formed by alternately stacking n-AlAs layers (thickness: 758 Å) and n-GaAs layers (thickness: 629 Å) in 25 stacking cycles, an i-MQW layer formed by alternately stacking undoped $In_{0.15}Ga_{0.85}As$ layers (thickness: 100 Å) and undoped GaAs layers (thickness: 100 Å) in 100 stacking cycles, and a p+-GaAs layer (thickness: 0.5 μm).

This element was manufactured by the same process as described with reference to the transmission type element except that etching of the GaAs layer on the substrate side was omitted.

A solid-state laser beam having a wavelength of 850 nm and 1,050 nm was used both as input light and bias light, respectively. The input light was incident on the lower surface of the substrate while its intensity $P_{in}$ was changed in the range from 0 to 100 μW. A 1-mW laser beam was focused to have a spot size of 50 μm or less and was radiated, as bias light, onto a light input/output portion on the element surface. Reflected light intensity $P_{out}$ was measured by a power meter. The $P_{in}-P_{out}$ characteristics exhibited negative bistable characteristics. The contrast ratio ($P_{outH}/P_{outL}$) was 10:1, and the response time was 80 nS.

EXAMPLE 3

InGaAs/InAlAs reflection type element

An optical thyristor 301 and an MQW-pin modulator 302 were stacked on a Zn-doped InP substrate by molecular beam epitaxial deposition. The optical thyristor 301 consisted of a p+-$In_{0.52}Al_{0.45}As$ layer (thickness: 1 μm), an n-$In_{0.53}Ga_{0.47}As$ layer (thickness: 2 μm), a p-$In_{0.53}Ga_{0.47}As$ layer (thickness: 0.2 μm), and an n+-$In_{0.52}Al_{0.45}As$ layer (thickness: 0.5 μm). The MQW-pin modulator 302 consisted of an n-DBR layer formed by alternately stacking n-$In_{0.52}Ga_{0.47}As$ layers (thickness: 1,225 μm) and n-$In_{0.52}(Al_{0.25}Ga_{0.75})_{0.48}As$ layers (thickness: 1,120 Å) in 40 stacking cycles, an i-MQW layer formed by alternately stacking undoped $In_{0.53}Ga_{0.47}As$ well layers (thickness: 70 Å) and undoped $In_{0.52}Al_{0.48}As$ layers (thickness: 50 Å) in 250 stacking cycles, a p-$In_{0.52}Al_{0.48}As$ clad layer (thickness: 0.5 μm), and a p+-$In_{0.53}Ga_{0.47}As$ cap layer (thickness: 0.1 μm).

A semiconductor laser beam having a wavelength of 1,520 nm was used both as input light and bias light. The input light was incident on the lower surface of the substrate while its intensity $P_{in}$ was changed in the range from 0 to 10 μW. A 10-mW laser beam was focused to have a spot size of 50 μm or less and was radiated, as bias light, onto a light input/output portion on the element surface. The $P_{in}-P_{out}$ characteristics exhibited negative logic type bistable characteristics. The contrast ratio ($P_{outH}/P_{outL}$) was 25:1, and the response time was 100 ns.

EXAMPLE 4

InGaAs/InP reflection type element

An optical thyristor 301 and an MQW-pin modulator 302 were grown on a Zn-doped InP substrate by a gas source MBE method. The optical thyristor 301 consisted of a p$^+$-In$_{0.53}$GA$_{0.47}$As layer (thickness: 1 μm), an n-In$_{0.53}$Ga$_{0.47}$As layer (thickness: 2 μm), a p-In$_{0.53}$Ga$_{0.47}$As layer (thickness: 0.2 μm), and an n$^+$-In$_{0.53}$Ga$_{0.47}$As layer (thickness: 0.5 μm). The MQW-pin modulator 302 consisted of an n-DBR layer formed by alternately stacking n-InP layers (thickness: 1,222 Å) and n-In$_{0.63}$Ga$_{0.37}$As$_{0.80}$P$_{0.20}$ layers (thickness: 1,130 Å) in 40 stacking cycles, an i-MQW layer formed by alternately stacking undoped In$_{0.53}$Ga$_{0.47}$As well layers (thickness: 80 Å) and undoped InP barrier layers (thickness: 50 Å) in 230 stacking cycles, a p-InP clad layer (thickness: 0.5 μm), and a p$^+$-In$_{0.53}$Ga$_{0.47}$As cap layer (thickness: 0.1 μm).

A semiconductor laser beam having a wavelength of 1,550 nm was used both as input light and bias light. The input light was incident on the lower surface of the substrate while its intensity $P_{in}$ was changed in the range from 0 to 100 μW. A 1-mW laser beam was focused to have a spot size of 50 μm or less and was radiated, as bias light, onto a light input/output portion on the element surface. The $P_{in}-P_{out}$ characteristics exhibited negative logic type bistable characteristics. The contrast ratio ($P_{outH}/P_{outL}$) was 20:1, and the response time was 100 ns.

Figure 20A:
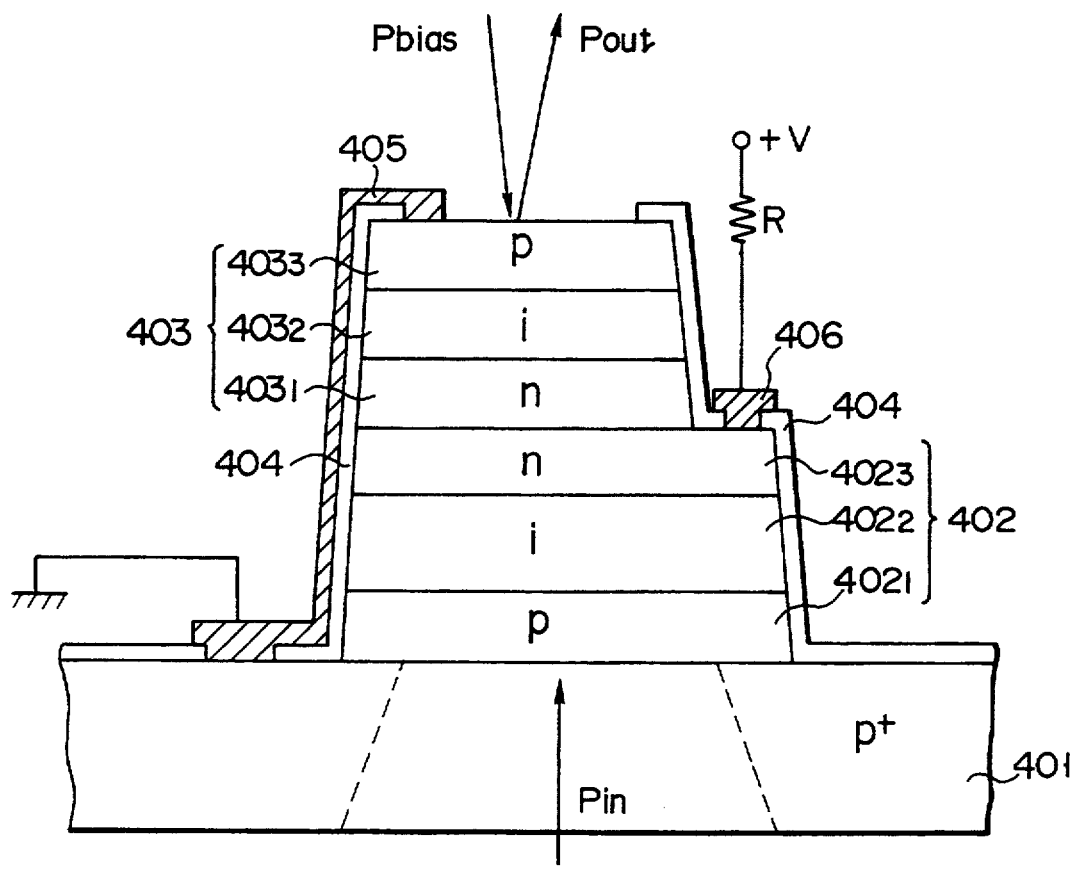
FIGS. 20(a) to 20(f) are sectional views each showing a main part of an arrangement of an optical gate array element according to another embodiment of the present invention.

FIGS. 20(a) to 20(f) are sectional views respectively showing arrangements of optical gate arrays according to other embodiments of the present invention. Referring to FIG. 20(a), a photodetector portion is constituted by a pin photodiode (to be referred to as a PD type hereinafter). FIG. 20(a) shows a structure having a photodiode 402 and an MQW modulator 403 stacked on a p$^+$-type semiconductor substrate 401. The photodiode 402 consists of a p-type layer 402$_1$, an i-type layer 402$_2$, and an n-type layer 402$_3$. The MQW modulator 403 consists of an n-DBR layer 403$_1$ formed by alternately stacking two types of thin semiconductor layers having different refractive indexes a plurality of times, an i-MQW layer 403$_2$ formed by alternately stacking two types of thin semiconductor layers having different band gaps a plurality of times, and a p-type layer 403$_3$. The p-type layer 403$_3$ of the MQW modulator 403 and the p$^+$-semiconductor substrate 401 are connected to each other through a first electrode 405 formed on an insulating film 404. A second electrode 406 extends from the n-type layer 402$_3$ of the photodiode 402. A constant-voltage power supply and a load resistor (neither are shown) are connected between the electrodes 405 and 406.

In this arrangement, input light $P_{in}$ is incident on the photodiode 402 from the p$^+$-type semiconductor 401 side. Output light $P_{out}$ is emitted as reflected light of bias light $P_{bias}$ radiated on the MQW modulator 403. When the input light $P_{in}$ is absorbed by the p$^+$-type semiconductor substrate 401, the substrate 401 is partially etched to allow light to be transmitted therethrough.

Figure 20B:
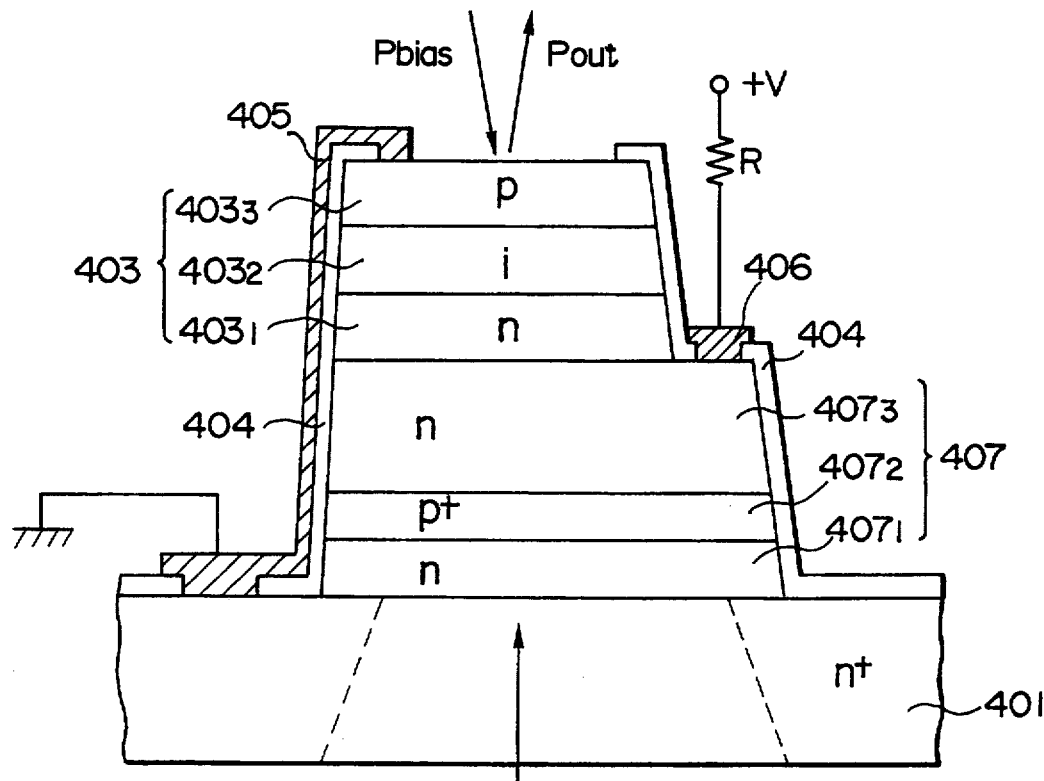

FIG. 20(b) is a sectional view showing an arrangement of still another embodiment of the present invention. FIG. 20(b) shows a case wherein a photodetector portion is constituted by a hetero-phototransistor (to be referred to as an HPT type hereinafter). Referring to FIG. 20(b), an HPT 407 and an MQW modulator 403 are stacked on an n$^+$-type semiconductor substrate 401. The HPT 407 consists of an n-emitter layer 407$_1$, a p-base layer 407$_2$, and an n-collector layer 407$_3$. The MQW modulator 403 has the same structure as that shown in FIG. 20(a). In this case, in order to increase the gain of the photodetector portion, the n-emitter layer 407$_1$ is composed of a semiconductor having a band gap larger than that of a semiconductor used for the p-base layer 407$_2$. The p-type layer 403$_3$ of the MQW modulator 403 and the p$^+$-type semiconductor substrate 401 are connected to each other through a first electrode 405. A second electrode 406 extends from the n-collector layer 407$_3$ of the HPT 407.

In this arrangement, input light $P_{in}$ is incident on the HPT 407 from the p$^+$-type semiconductor substrate 401 side. Output light $P_{out}$ is emitted as reflected light of bias light $P_{bias}$ radiated on the MQW modulator 403.

Figure 20C:
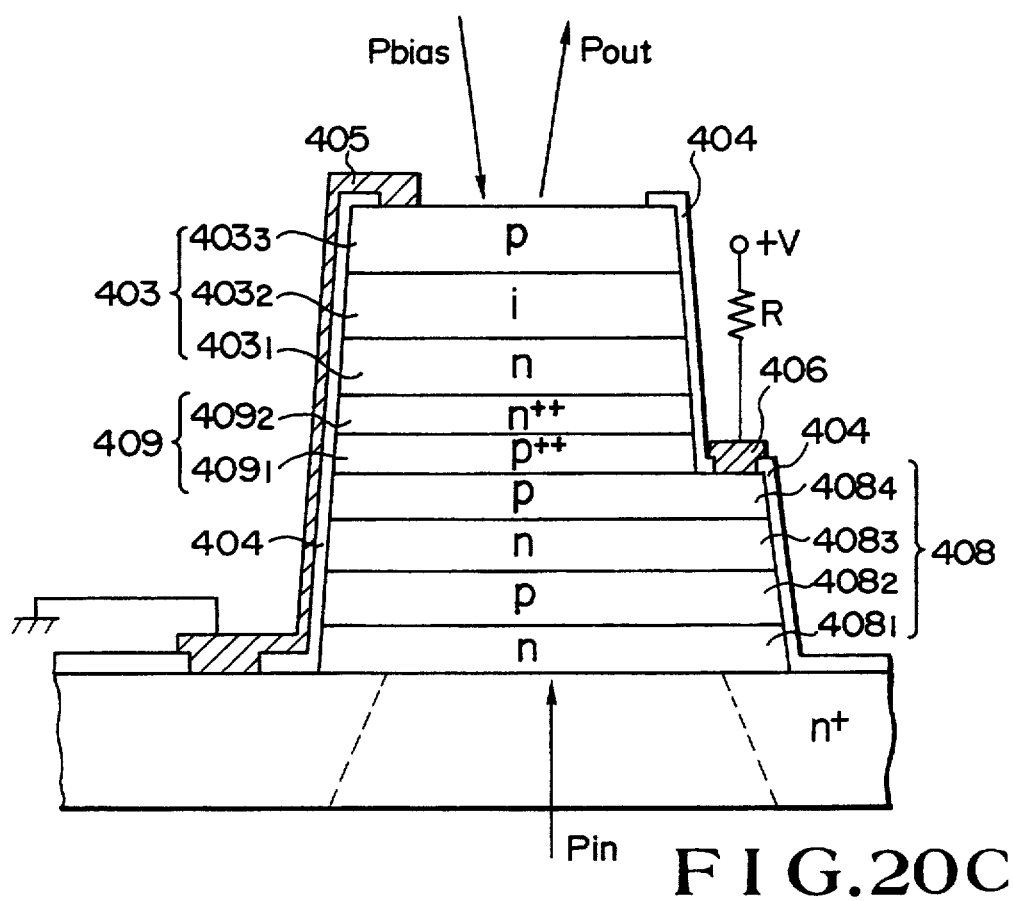

FIG. 20(c) is a sectional view showing an arrangement of still another embodiment of the present invention. FIG. 20(c) shows a case wherein a photodetector portion is constituted by a pnpn optical thyristor (to be referred to as a PNPN type hereinafter). Referring to FIG. 20(c), a thyristor 408, a tunnel junction 409, and an MQW modulator 403 are sequentially stacked on an n$^+$-type semiconductor substrate 401. The thyristor 408 consists of a first n-type layer 408$_1$, a first p-type layer 408$_2$, a second n-type layer 408$_3$, and a second p-type layer 408$_4$. The tunnel junction 409 consists of a p$^{++}$-type layer 409$_1$ and an n$^{++}$-type layer 409$_2$ and serves to short-circuit the second p-type layer 403$_2$ of the thyristor 408 and an n-DBR layer 403$_1$ of the MQW modulator 403. The MQW modulator 403 has the same structure as that shown in FIG. 20(a). The p-type layer 403$_3$ of the MQW modulator 403 and the n-type semiconductor substrate 401 are connected to each other through a first electrode 405. A second electrode 406 extends from the first p-type layer 408$_4$ of the thyristor 408.

In this arrangement, input light $P_{in}$ is incident on the thyristor 408 from the p$^+$-type semiconductor substrate 401 side. Output light $P_{out}$ is emitted as reflected light of bias light $P_{bias}$ radiated on the MQW modulator 403.

Figure 20D:
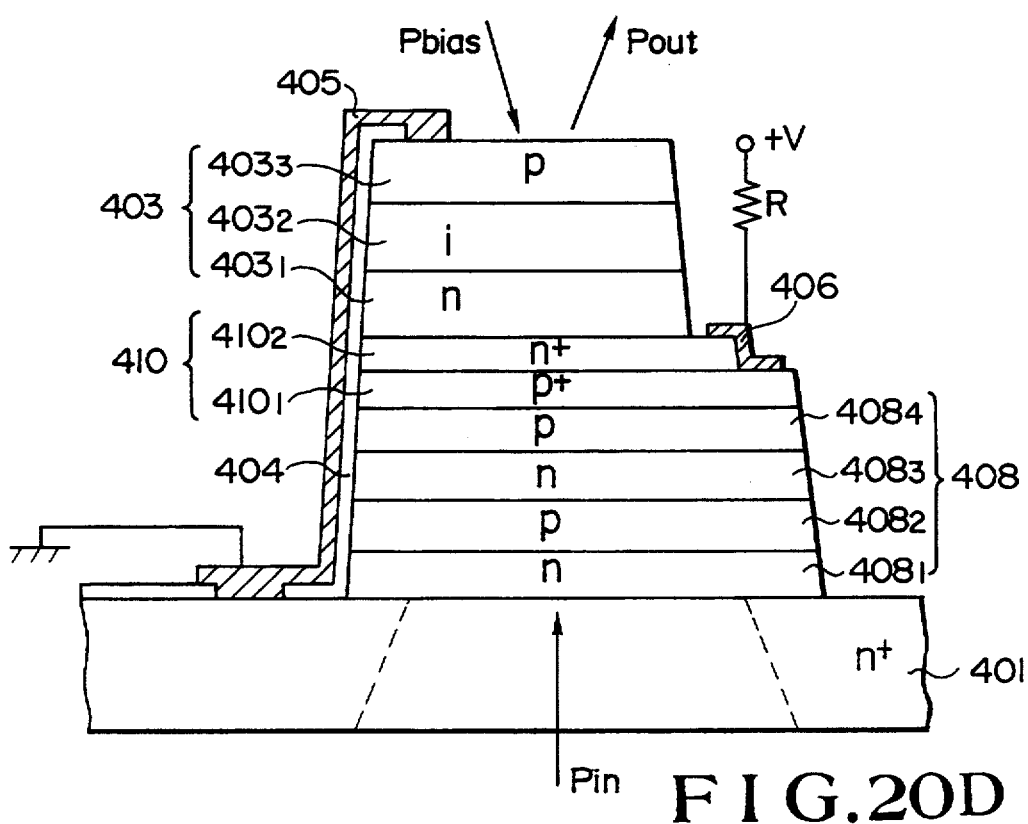

FIG. 20(d) is a sectional view showing an arrangement of still another embodiment of the present invention. FIG. 20(d) shows a case wherein a thyristor 408 and an MQW modulator 403 are short-circuited by using an interconnection layer 410 consisting of p$^+$- and n$^+$-type layers 410$_1$ and 410$_2$ and electrodes 405 and 406 in place of the tunnel junction 409 in FIG. 20(c).

In the optical gate arrays shown in FIGS. 20(a) to 20(d), since no load resistors are incorporated, external resistors are respectively connected to the optical gate array elements, and the elements are subsequently connected to one constant-voltage power supply.

Figure 20E:
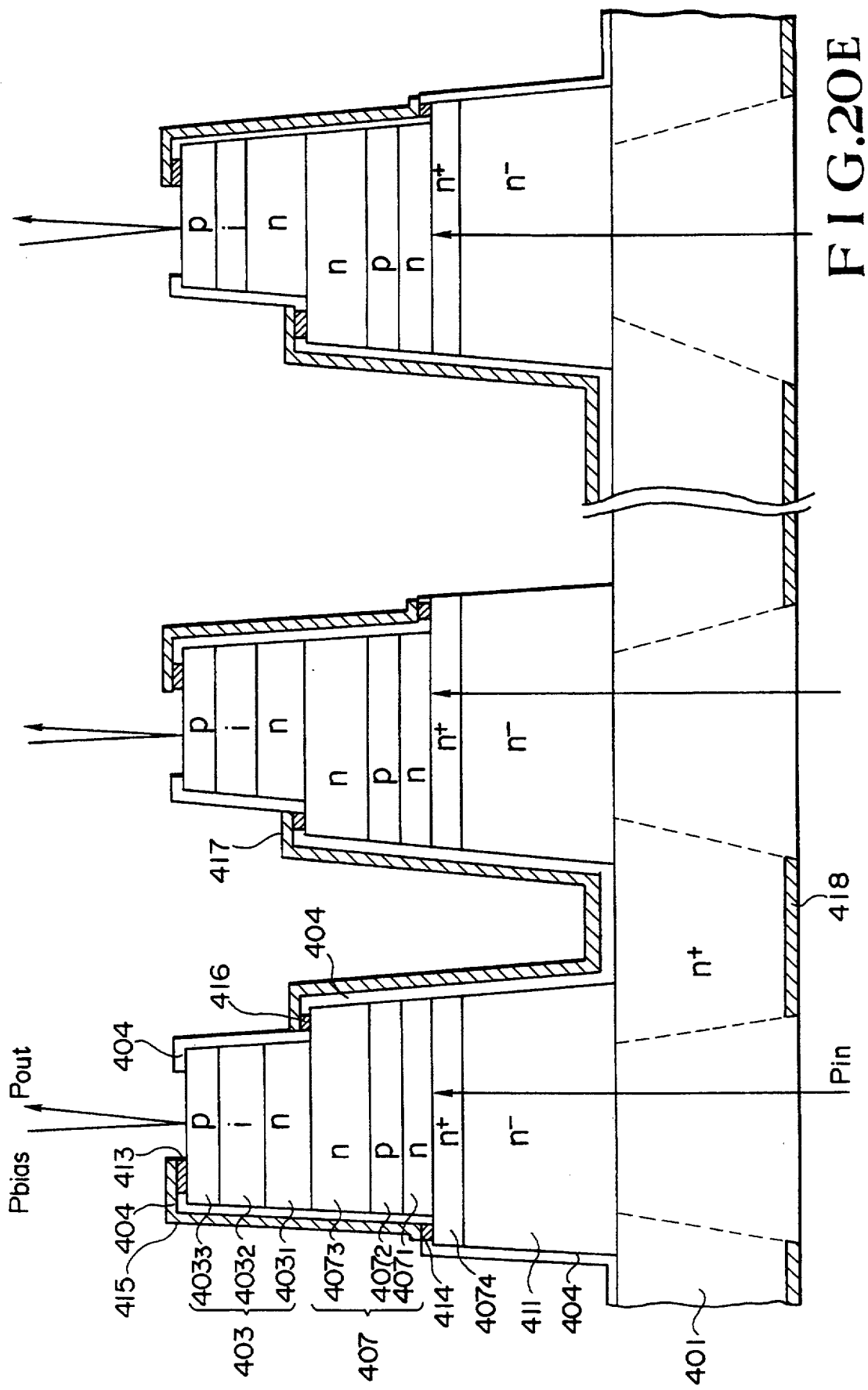
Figure 20F:
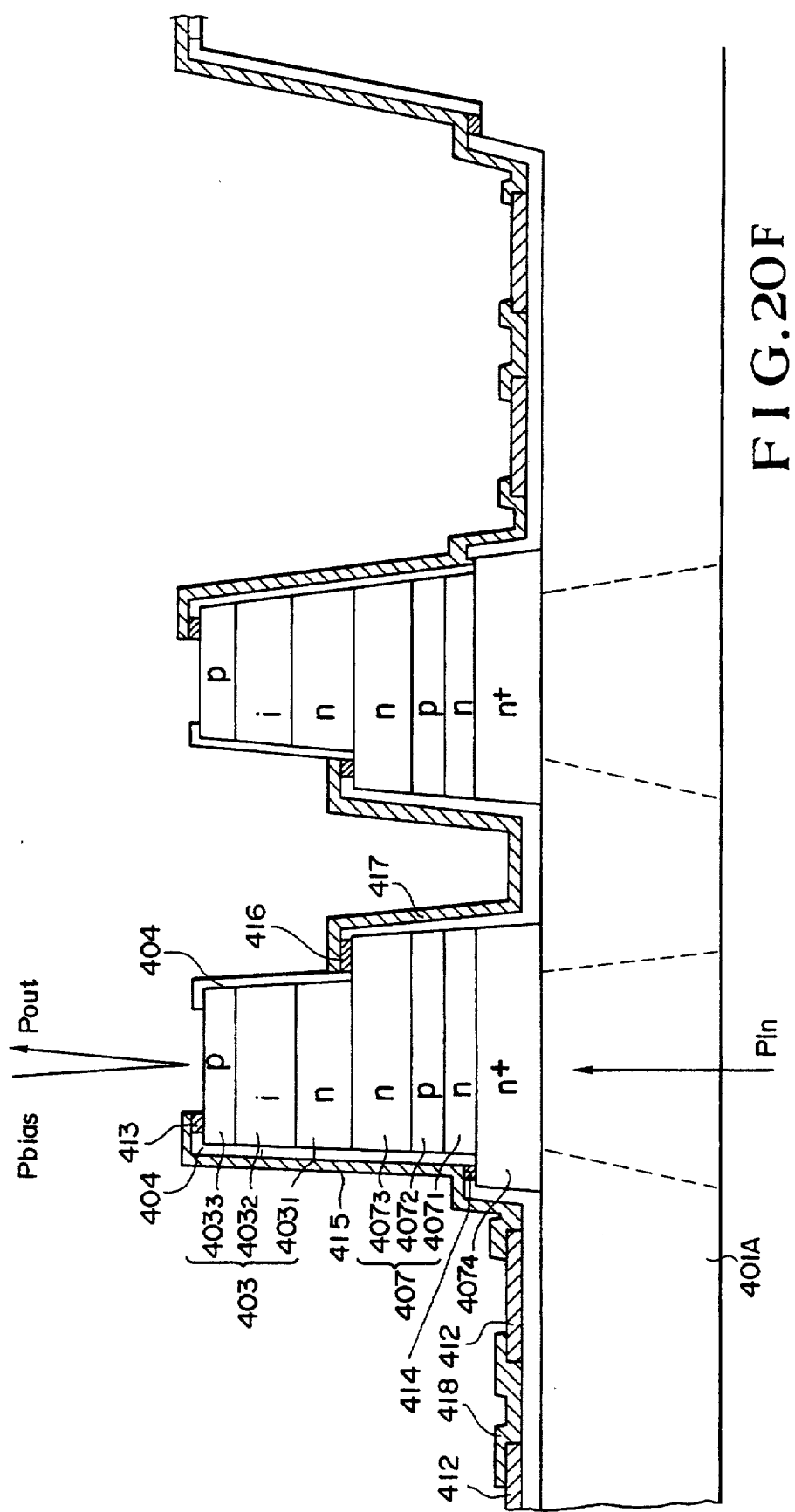

FIGS. 20(e) and 20(f) show optical gate arrays in which load resistors are formed as monolithic components, and a pair of electrodes formed on a modulator and a resistor layer are commonly connected to all the array constituent elements. FIG. 20(e) shows a case wherein a resistive epitaxial film 411 consisting of an n$^-$-type layer is formed between a semiconductor substrate 401 and an HPT 407 through a contact layer 407$_4$.

FIG. 20(f) shows a case wherein a resistive deposition film 412 is formed on a semi-insulating substrate 401A.

Referring to FIGS. 20(e) and 20(f), a third electrode 413 is an ohmic electrode of a p-layer $403_3$ of an MQW modulator 403; a fourth electrode 414, an ohmic electrode of the contact layer $407_4$ connected to an n-emitter layer $407_1$ of the HPT 407; a fifth electrode 415, an electrode for connecting the third and fourth electrodes 413 and 414 to each other; a sixth electrode 416, an ohmic electrode extending from an n-type layer $403_1$ of the MQW modulator 403 and from an n-collector layer $407_3$ of the HPT 407; a seventh electrode 417, an electrode for connecting the sixth electrodes 416 of adjacent array constituent elements to each other; and an eighth electrode 418, an electrode for connecting electrodes extending from the resistive epitaxial films 411 of the adjacent array constituent elements. A constant-voltage power supply is connected between the seventh and eighth electrodes 417 and 418. Note that in the structure shown in FIG. 20(f), the resistive deposition film 412 formed on the semi-insulating substrate 401A is connected between the fifth and eighth electrodes 415 and 418.

The conductivity types of all the layers in the arrangements described with reference to FIGS. 20(a) to 20(f) may be inverted to realize other arrangements. In addition, a modulator and a photodetector portion may be stacked on a semiconductor substrate in the order named to reverse the input and output directions of light.

Figure 21A:
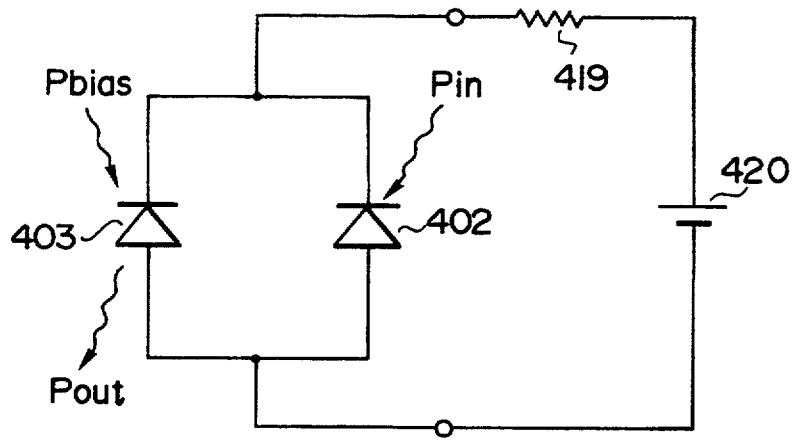
FIGS. 21(a) to 21(c) are equivalent circuit diagrams.
Figure 21B:
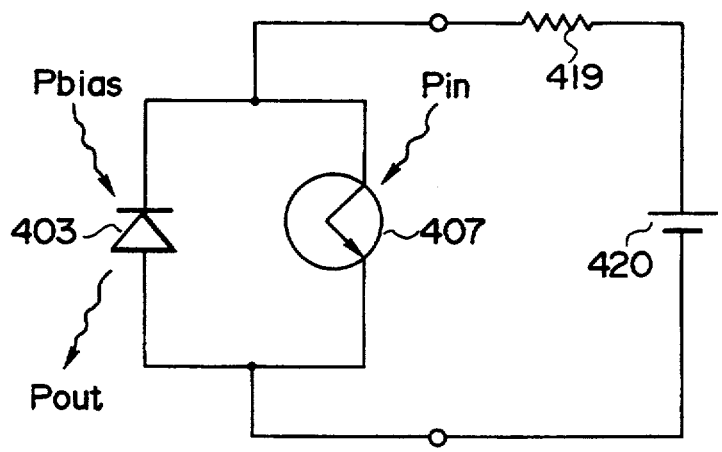
Figure 21C:
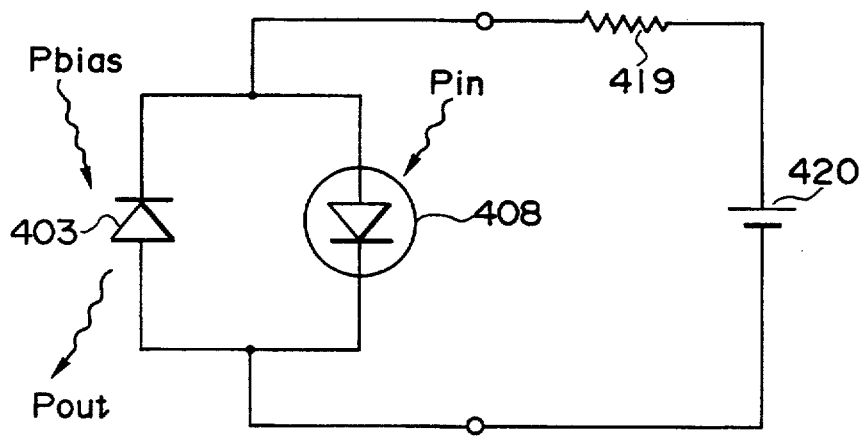

FIGS. 21(a) to 21(c) are equivalent circuit diagrams of optical gate arrays according to the present invention. FIG. 21(a) shows a PD type, in which an MQW modulator 403 and a photodiode 402 are connected in parallel with each other in the same bias direction in terms of polarity. In addition, a load resistor 419 consisting of the resistive epitaxial film 411 or the resistive deposition film 412 and a constant-voltage power supply 420 are connected to both ends of the parallel circuit. In this case, both the MQW modulator 403 and the photodiode 402 are reverse-biased. FIG. 21(b) shows an HPT type, in which an MQW modulator 403 and a hetero-phototransistor 407 are connected in parallel with each other. In addition, a load resistor 419 and a constant-voltage power supply 420 are connected to both ends of the parallel circuit. In this case, the MQW modulator 403 is reverse-biased, whereas the hetero-phototransistor 407 is forward-biased. FIG. 21(c) shows a PNPN type, in which an MQW modulator 403 and a thyristor 408 are connected in parallel with each other. In addition, a load resistor 419 and a constant-voltage power supply 420 are connected to both ends of the parallel circuit. In this case, the MQW modulator 403 is reverse-biased, whereas the thyristor 408 is forward-biased.

An operation principle and characteristics of each optical gate array according to the present invention will be described below with reference to FIGS. 22 to 25(b).

Figure 22:
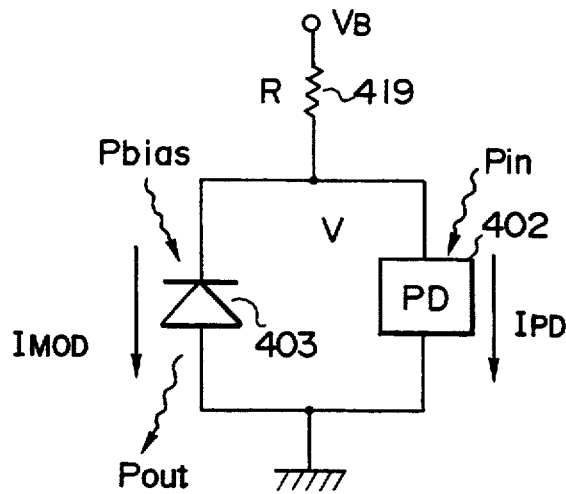
FIG. 22 is an equivalent circuit diagram.

FIG. 22 is an equivalent circuit diagram of a generalized optical gate array. Referring to FIG. 22, if a voltage to be applied to an MQW modulator 403 is represented by V, the relationship between the voltage V and a photocurrent $I_{PD}$ of a photodetector (e.g., a photodiode 402) can be represented by the following equation:

$$V = V_B - R(I_{PD} + I_{MOD}) = V_0 - R \cdot I_{PD}$$

for $V_0 = V_B - R \cdot I_{MOD}$ where $V_B$ is the voltage of a bias power supply, R is the resistance value of a load resistor, and $I_{MOD}$ is the photocurrent supplied from the modulator.

In addition, the voltage $V_0$ is a voltage to be applied to the MQW modulator 403 when the photodetector is in a dark state ($I_{PD} = 0$). It is apparent from this equation that the voltage V is decreased in proportion to the current $I_{PD}$.

Figure 23A:
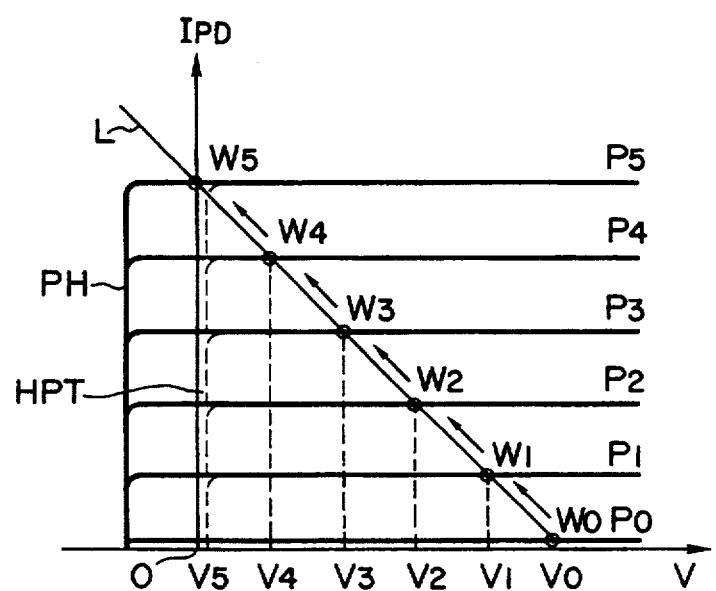
FIGS. 23(a) and 23(b) are graphs for explaining operation principles of a PD type element and an HPT type element.
Figure 23B:
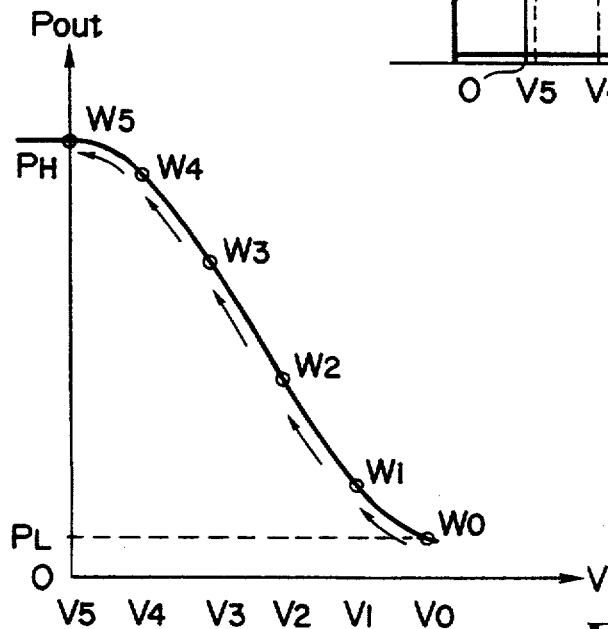

FIGS. 23(a) and 23(b) are graphs for explaining how an light output $P_{out}$ from the MQW modulator 403 is changed with an increase in light input $P_{in}$ when a photodetector is constituted by a photodiode or a phototransistor. Referring to FIG. 23(a), a solid line indicates I-V characteristics of the photodiode (FD); and a dotted line, I-V characteristics of the phototransistor (HPT). FIG. 23(b) shows $P_{out}$-V characteristics of the MQW modulator. As shown in FIGS. 23(a) and 23(b), as the light input $P_{in}$ is increased from $P_0^0$ to $P_1$, $P_2$, ..., $P_5$, the current $I_{PD}$ is increased in proportion to the light input $P_{in}$. With this increase in current $I_{PD}$, the operating point of the photodiode is continuously moved on a load line L corresponding to a load resistor R in a direction indicated by arrows, i.e., in an order of $W_0$, $W_1$, $W_2$, ..., $W_5$. Therefore, the voltage V is decreased in an order of $V_0$, $V_1$, $V_2$, ..., $V_5$. Since the photodiode and the MQW modulator are connected in parallel with each other, a voltage applied to the photodiode is equivalent to a voltage applied to the MQW modulator. As described above, the light output $P_{out}$ is increased with a decrease in voltage V applied to the MQW modulator 403.

As described above, the light input/output characteristics of the PD and HPT types exhibit gate characteristics shown in FIG. 25(a). The intensity of the light input $P_{in}$ at which switching occurs corresponds to a region where the product of a current generated by the photodetector and a load resistor is on the same order as that of the voltage of a constant-voltage power supply. In this case, a logically OR product is obtained when the operating wavelength ($V_B \sim I_{PD} \cdot R$) corresponds to an absorption end, and a logically NOR product is obtained when the operating wavelength corresponds to an exciton wavelength.

Figure 24A:
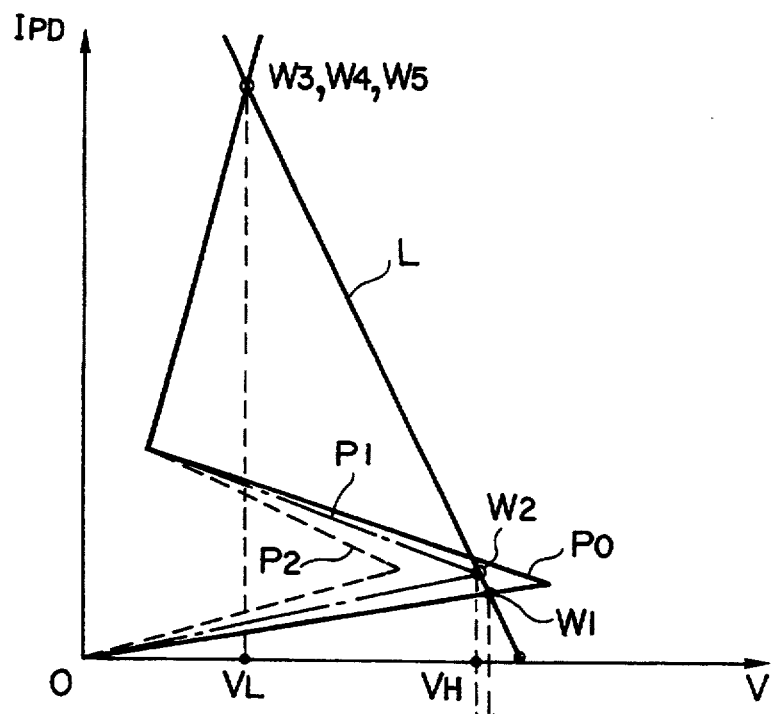
FIGS. 24(a) and 24(b) are graphs for explaining an operation principle of a pnpn type element.
Figure 24B:
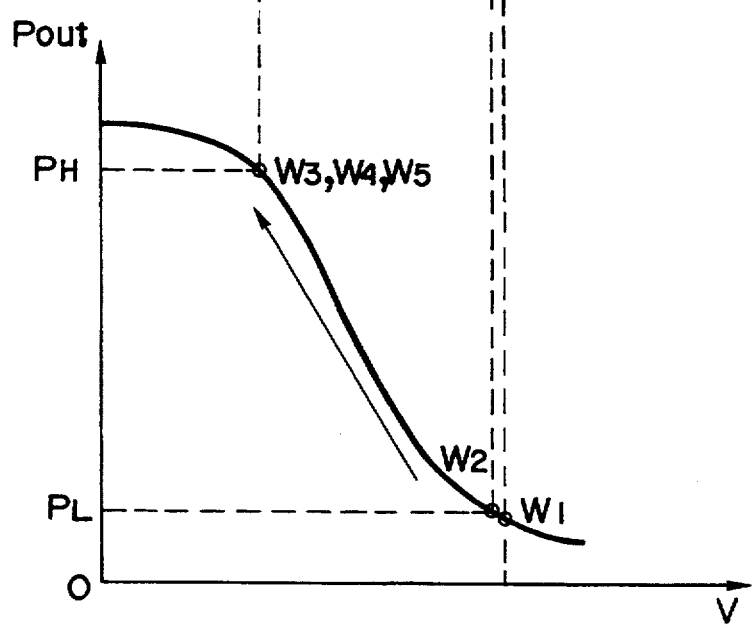

FIGS. 24(a) and 24(b) are graphs for explaining how a light output $P_{out}$ from an MQW modulator is changed with an increase in light input $P_{in}$ when a photodetector is constituted by a photothyristor. FIG. 24(a) shows I-V characteristics of the photothyristor. FIG. 24(b) shows light output $P_{out}$-V characteristics of the modulator. As the light input $P_{in}$ is increased from $P_0 = 0$ to $P_1$ and $P_2$, the breakdown voltage of the photothyristor is decreased. With this decrease, the operating point of the thyristor is discontinuously moved on a load line L corresponding to a load resistor R in a direction indicated by an arrow from $W_2$ to $W_3$, and the voltage is abruptly decreased from $V_H$ to $V_L$. Since the thyristor and the MQW modulator are connected in parallel with each other, the voltage applied to the thyristor is equivalent to the voltage applied to the MQW modulator. As described above, if the voltage of the MQW modulator 403 is abruptly decreased, the light output $P_{out}$ is abruptly increased.

Since the operating point stays at the point $W_3$ even if the light input $P_{in}$ is set to be zero, the light output $P_{out}$ is kept in a high output state. In order to restore the initial state, the constant-voltage power supply may be turned off, or the thyristor portion may be short-circuited.

As described above, the light input/output characteristics of the PNPN type element exhibit gate characteristics including a memory function, as shown in FIG. 25(b). The intensity of the light input $P_{in}$ at which switching occurs corresponds to a point at which switching of the thyristor occurs. An OR product is obtained when the operating wavelength corresponds to an absorption end. A NOR product is obtained when it corresponds to an exciton wavelength.

Examples in which PD type, HPT type, and PNPN type elements are realized by GaAs/AlGaAs materials will be described below with reference to items (1) to (3). Examples in which especially HPT type elements are realized by other materials, i.e., GaAs/InGaAs, InGaAs/InAlAs, and InGaAs/InP materials will be described with reference to items (4) to (6). Examples of GaAs/AlGaAs HPT type elements in which each resistive thin film is stacked to form a monolithic layer will be described with reference to items (7) and (8).

(1) GaAs/AlGaAs PD type element

As shown in FIG. 20(a), A pin photodiode structure and an MQW-pin structure was stacked on a Zn-doped GaAs substrate by molecular beam epitaxial deposition. The pin photodiode structure was constituted by a p-$Al_{0.3}Ga_{0.7}As$ layer (thickness: 0.5 μm), an i-GaAs layer (thickness: 4 μm), and an n-$Al_{0.3}G_{0.7}As$ layer (thickness: 0.5 μm). The MQW-pin structure was constituted by an n-DBR layer formed by alternately stacking n-AlAs layers (thickness: 629 Å) and n-$Al_{0.3}GA_{0.7}As$ layers (thickness: 715 Å) in 25 stacking cycles, an i-MQW layer formed by alternately stacking undoped GaAs layers (thickness: 100 Å) and undoped $Al_{0.3}Ga_{0.7}As$ layers (thickness: 50 Å) in 270 stacking cycles, a p-$Al_{0.3}Ga_{0.7}As$ layer (thickness: 0.5 μm), and a p+-GaAs layer (thickness: 0.1 μm). Be and Si were respectively used as p- and n-type dopants.

A 1.5-cm square chip was cut from a growth wafer. A 50×50 matrix (size: 100 μm square; pitch: 200 μm) was formed in a 1-cm square central portion of the chip by mesa division, thus forming a bit constituent element. Note that an n-layer portion, of the pin photodiode, corresponding to an area of 100 μm×40 μm was selectively etched. An AuZnNi ohmic electrode (thickness: 1,000 Å) having an area of 80 μm×20 μm was formed on the upper surface of the p-GaAs cap layer, an AuGeNi electrode (thickness: 1,000 Å) having an area of 80 μm×40 μm was formed on the exposed portion of the n-type layer, and an AuZnNi ohmic electrode (thickness: 1,000 Å) was formed on a substrate surface portion exposed by mesa etching. A side surface of the bit constituent element was insulated by an SiN film. A first Cr/Au electrode was formed to connect the AuZnNi ohmic electrodes on the p-GaAs cap layer and the substrate surface with each other. A second Cr/Au electrode was formed on the AuZnNi electrode formed on the n-type layer. After the p-GaAs layer of the photodetective portion and the GaAs substrate on the lower surface side of the element were removed by selective etching, an $SiO_2/TiO_2$ antireflection multilayer was formed.

A load resistor (10 kΩ) and a constant-voltage power supply (30 V) were connected between the first and second Cr/Au electrodes. A semiconductor laser having a wavelength of 860 nm was used both as input light and bias light. The input light $P_{in}$ was incident on the lower surface of the substrate while its intensity was changed in the range from 0 to 5 mW. A 1-mW laser beam was focused to have a spot size of 20 μm or less and was radiated, as bias light, onto a light input/output portion on the upper surface of the element. The intensity of reflected light $P_{out}$ was measured by a power meter. As shown in FIG. 25(a), when $P_{in}$=1 mW, the $P_{in}-P_{out}$ characteristics exhibited positive logic type gate characteristics. The contrast ratio ($P_{outH}/P_{outL}$) was 100:1, and the response time was 10 ns.

(2) GaAs/AlGaAs HPT type element

As shown in FIG. 20(b), an HPT structure and an MQW-pin structure were stacked on an Si-doped GaAs substrate by molecular beam epitaxial deposition. The HPT structure was constituted by an n-$Al_{0.3}Ga_{0.7}As$ layer (thickness: 0.5 μm), a p-GaAs layer (thickness: 0.2 μm), and an n-GaAs layer (thickness: 2 μm). The MQW-pin structure was constituted by an n-DBR layer formed by alternately stacking n-AlAs layers (thickness: 629 Å) and n-$Al_{0.3}Ga_{0.7}As$ layer (thickness: 715 Å) in 25 stacking cycles, an i-MQW layer formed by alternately stacking undoped GaAs layers (thickness: 100 Å) and undoped $Al_{0.3}Ga_{0.7}As$ layers (thickness: 50 Å) in 270 stacking cycles, a p-$Al_{0.3}Ga_{0.7}As$ layer (thickness: 0.5 μm), and a p+-GaAs layer (thickness: 0.1 μm). Other arrangements of this element were identical to those of the element shown in FIG. 20(a).

A load resistor (10 kΩ) and a constant-voltage power supply (30 V) were connected between first and second Cr/Au electrodes. A semiconductor laser beam having a wavelength of 860 nm was used both as input light and bias light. Input light $P_{in}$ was incident on the lower surface of the substrate while its intensity was changed in the range from 0 to 10 μW. A 1-mW laser beam was focused to have a spot size of 20 μm or less and was radiated, as bias light, onto a light input/output portion on the upper surface of the element. The intensity of reflected light $P_{out}$ was measured by a power meter. As shown in FIG. 25(a), when $P_{in}$=10 μW, the $P_{in}-P_{out}$ characteristics exhibited positive logic type gate characteristics. The contrast ratio ($P_{outH}/P_{outL}$) was 100:1, and the response time was 50 ns.

(3) GaAs/AlGaAs PNPN type element

As shown in FIG. 20(c), a PNPN structure and an MQW-pin structure were stacked on an Si-doped GaAs substrate by molecular beam epitaxial deposition. The PNPN structure was constituted by an n-$Al_{0.3}Ga_{0.7}As$ layer (thickness: 0.5 μm), a p-GaAs layer (thickness: 0.2 μm), an n-GaAs layer (thickness: 2 μm), and a p-$Al_{0.3}Ga_{0.7}As$ layer (thickness: 1 μm). The MQW-pin structure was constituted by an n-DBR layer formed by alternately stacking n-AlAs layers (thickness: 629 Å) and n-$Al_{0.3}Ga_{0.7}As$ layers (thickness: 715 Å) in 25 stacking cycles, an i-MQW layer formed by alternately stacking undoped GaAs layers (thickness: 100 Å) and undoped $Al_{0.3}Ga_{0.7}As$ layers (thickness: 50 Å) in 270 stacking cycles, a p-$Al_{0.3}Ga_{0.7}As$ layer (thickness: 0.5 μm), and a p+-GaAs layer (thickness: 0.1 μm). Other arrangements of this element were identical to those of the element shown in FIG. 20(a).

A load resistor (10 kΩ) and a constant-voltage power supply (30 V) were connected between first and second Cr/Au electrodes. A semiconductor laser beam having a wavelength of 860 nm was used both as input light and bias light. Input light $P_{in}$ was incident on the lower surface of the substrate while its intensity was changed in the range from 0 to 100 μW. A 1-mW laser beam was focused to have a spot size of 20 μm or less and was radiated, as bias light, onto a light input/output portion on the upper surface of the element. The intensity of reflected light $P_{out}$ was measured by a power meter. As shown in FIG. 25(b), when $P_{in}=10$ μW, the $P_{in}-P_{out}$ characteristics exhibited positive logic type gate characteristics having a memory function. The contrast ratio ($P_{outH}/P_{outL}$) was 100:1, and the response time was 10 ns.

(4) GaAs/InGaAs HPT type element

An HPT structure and an MQW-pin structure were stacked on an Si-doped GaAs substrate by molecular beam epitaxial deposition. The HPT structure was constituted by an n-Al$_{0.3}$Ga$_{0.7}$As layer (thickness: 0.5 μm), a p-GaAs layer (thickness: 0.2 μm), and an n-GaAs layer (thickness: 2 μm). The MQW-pin structure was constituted by an n-DBR layer formed by alternately stacking n-AlAs layers (thickness: 758 Å) and n-GaAs layers (thickness: 629 Å) in 25 stacking cycles, an i-MQW layer formed by alternately stacking undoped In$_{0.15}$Ga$_{0.85}$As layers (thickness: 100 Å) and undoped GaAs layers (thickness: 100 Å) in 100 stacking cycles, and a p+-GaAs layer (thickness: 0.5 μm). The element arrangement was identical to that described with reference to the item (1).

A load resistor (10 kΩ) and a constant-voltage power supply (30 V) were connected between first and second Cr/Au electrodes. A semiconductor laser beam having a wavelength of 850 nm was used as input light, whereas a titanium-doped sapphire laser beam having a wavelength of 1,050 nm was used as bias light. Input light $P_{in}$ was incident on the lower surface of the substrate while its intensity was changed in the range from 0 to 100 μW. A 1-mW laser beam was focused to have a spot size of 20 μm or less and was radiated, as bias light, onto a light input/output portion on the upper surface of the element. The intensity of reflected light $P_{out}$ was measured by a power meter. The $P_{in}-P_{out}$ characteristics exhibited positive logic type gate characteristics. The contrast ratio ($P_{outH}/P_{outL}$) was 10:1, and the response time was 50 ns.

(5) InGaAs/InAlAs HPT type element

An HPT structure and an MQW-pin structure were stacked on an Si-doped InP substrate by MBE. The HPT structure was constituted by an n-In$_{0.52}$Al$_{0.48}$As layer (thickness: 0.5 μm), a p-In$_{0.53}$Ga$_{0.47}$As layer (thickness: 0.2 μm), and an n-In$_{0.53}$Ga$_{0.47}$As layer (thickness: 2 μm). The MQW-pin structure was constituted by an n-DBR layer formed by alternately stacking n-In$_{0.52}$Al$_{0.48}$As layers (thickness: 1,225 Å) and n-In$_{0.52}$(Al$_{0.25}$Ga$_{0.75}$)$_{0.48}$As layers (thickness: 1,120 Å) in 40 stacking cycles, an i-MQW layer formed by alternately stacking undoped In$_{0.53}$Ga$_{0.47}$As well layers (thickness: 70 Å) and undoped In$_{0.52}$Al$_{0.48}$As barrier layers (thickness: 50 Å) in 250 stacking cycles, a p-In$_{0.52}$Al$_{0.48}$As clad layer (thickness: 0.5 μm), and a p++-In$_{0.53}$Ga$_{0.47}$As cap layer (thickness: 0.1 μm). The element arrangement was the same as that described with reference to the item (1) except that etching of the InP substrate corresponding to a light input/output portion was omitted.

A load resistor (10 kΩ) and a constant-voltage power supply (30 V) were connected between first and second Cr/Au electrodes. A semiconductor laser beam having a wavelength of 1,520 nm was used both as input light and bias light. Input light $P_{in}$ was incident on the lower surface of the substrate while its intensity was changed in the range from 0 to 100 μW. A 1-mW laser beam was focused to have a spot size of 20 μm or less and was radiated, as bias light, onto the light input/output portion on the upper surface of the element. The intensity of reflected light $P_{out}$ was measured by a power meter. The $P_{in}-P_{out}$ characteristics exhibited positive logic type gate characteristics. The contrast ratio ($P_{outH}/P_{outL}$) was 25:1, and the response time was 50 ns.

(6) InGaAs/InP HPT type element

An HPT structure and an MQW-pin structure were stacked on an Si-doped InP substrate by a gas source MBE method. The HPT structure was constituted by an n-InP layer (thickness: 0.5 μm), a p-In$_{0.53}$Ga$_{0.47}$As layer (thickness: 0.2 μm), and an n-In$_{0.53}$Ga$_{0.47}$As layer (thickness: 2 μm). The MQW-pin structure was constituted by an n-DBR layer formed by alternately stacking n-InP layers (thickness: 1,222 Å) and n-In$_{0.63}$Ga$_{0.37}$As$_{0.80}$P$_{0.20}$ layers (thickness: 1,130 Å) in 40 stacking cycles, an i-MQW layer formed by alternately stacking undoped In$_{0.53}$Ga$_{0.47}$As well layers (thickness: 80 Å) and undoped InP barrier layers (thickness: 50 Å) in 230 stacking cycles, a p-InP clad layer (thickness: 0.5 μm), and a p+-In$_{0.5}$Ga$_{0.47}$As cap layer (thickness: 0.1 μm). The element arrangement was the same as that described with reference to the item (1) except that etching of the InP substrate corresponding to a light input portion was omitted.

A load resistor (10 kΩ) and a constant-voltage power supply (30 V) were connected between first and second Cr/Au electrodes. A semiconductor laser beam having a wavelength of 1,550 nm was used both as input light and bias light. Input light $P_{in}$ was incident on the lower surface of the substrate while its intensity was changed in the range from 0 to 100 μW. A 1-mW laser beam was focused to have a spot size of 20 μm or less and was radiated, as bias light, onto a light input/output portion on the upper surface of the element. The intensity of reflected light $P_{out}$ was measured by a power meter. The $P_{in}-P_{out}$ characteristics exhibited positive logic type gate characteristics. The contrast ratio ($P_{outH}/P_{outL}$) was 20:1, and the response time was 50 ns.

(7) An element having the arrangement shown in FIG. 20(e) was manufactured by using GaAs/AlGaAs materials. This element had the same arrangement as that described with reference to the item (2) except that an n−-AlGaAs layer and an n+-GaAs layer were inserted between the substrate and the n-emitter layer of the HPT structure. In this arrangement, the same light input/output characteristics as those described with reference to the item (2) were obtained.

(8) An element having the arrangement shown in FIG. 20(f) was manufactured by using GaAs/AlGaAs materials. This element had the same arrangement as that in the item (2) except that a semi-insulating substrate was used and an n+-GaAs layer was inserted between the substrate and the n-emitter layer of the HPT structure. A resistive thin film was composed of a polysilicon film. In this arrangement, the same light input/output characteristics as those in the item (2) were obtained.

Figure 26A:
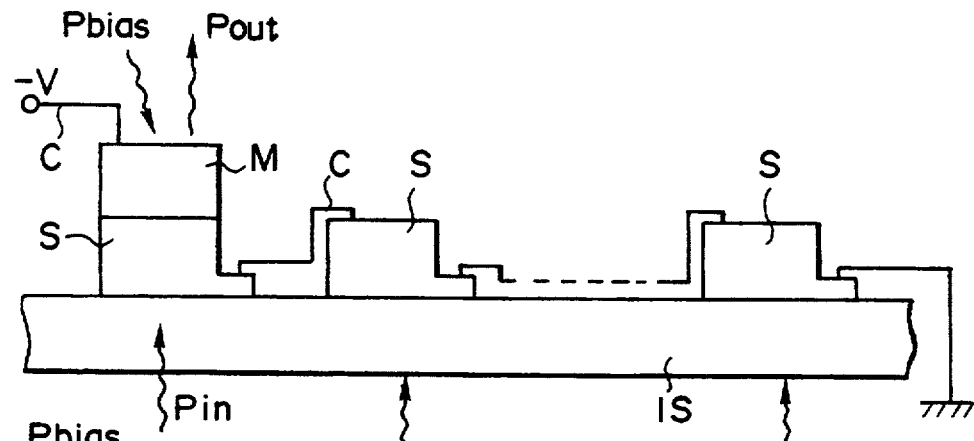
FIGS. 26(a) to 26(d) are sectional views each showing a main part of an element arrangement of an optical gate array according to still another embodiment of the present invention.
Figure 26B:
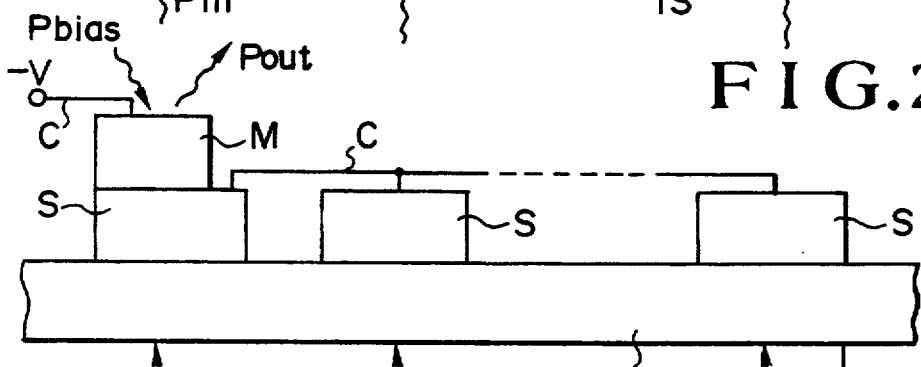
Figure 26C:
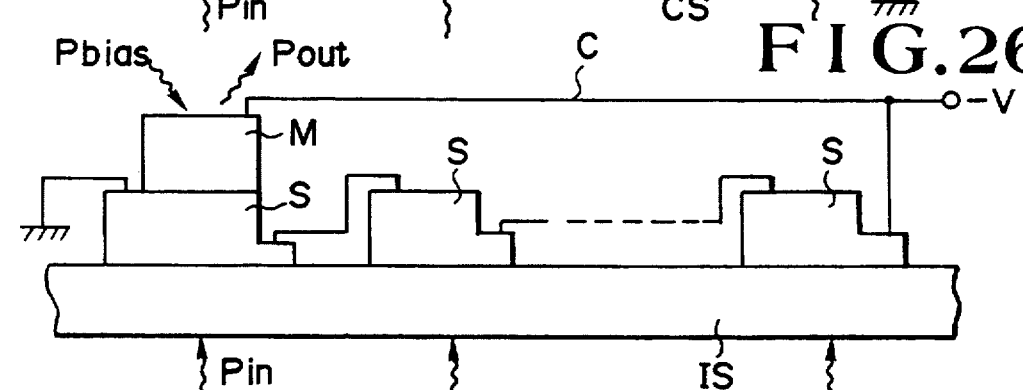
Figure 26D:
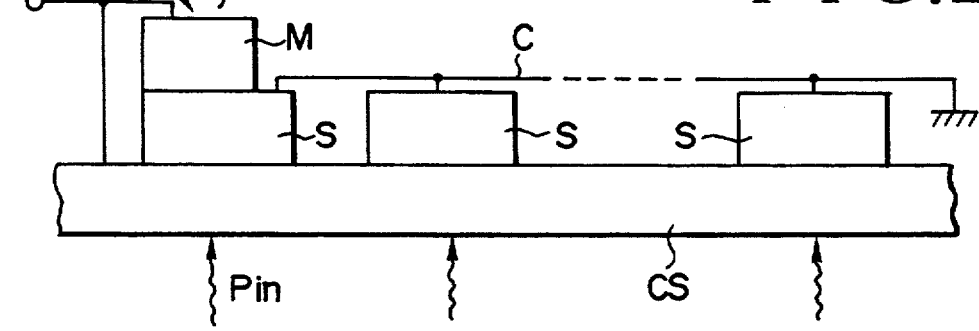
Figures 27A, 27B:
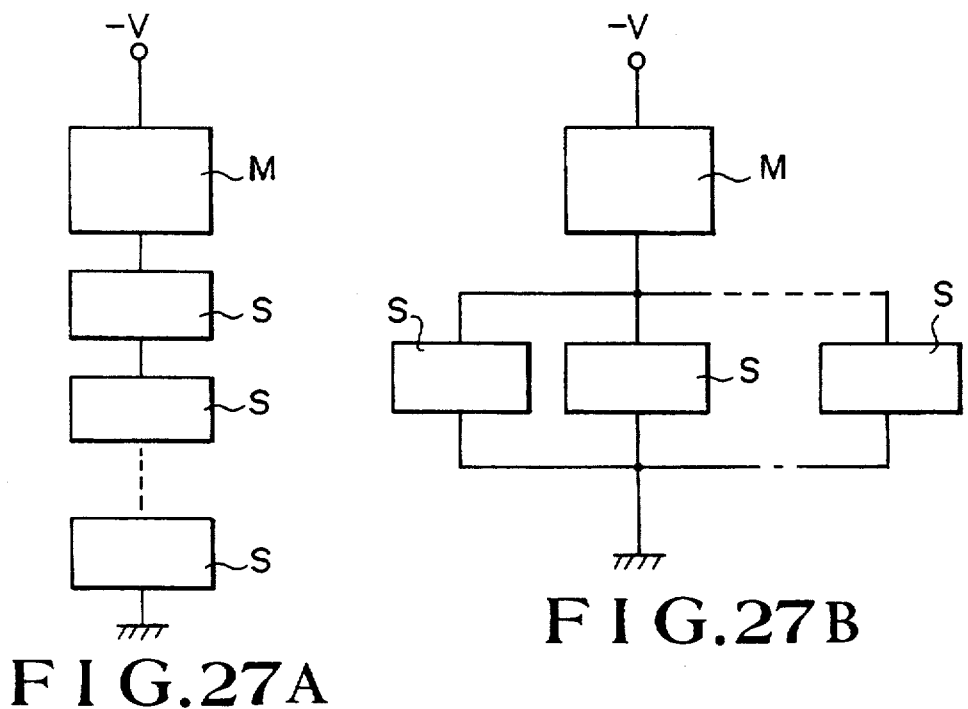
FIGS. 27(a) to 27(d) are block diagrams corresponding to FIGS. 26(a) to 26(d)
Figures 27C, 27D:
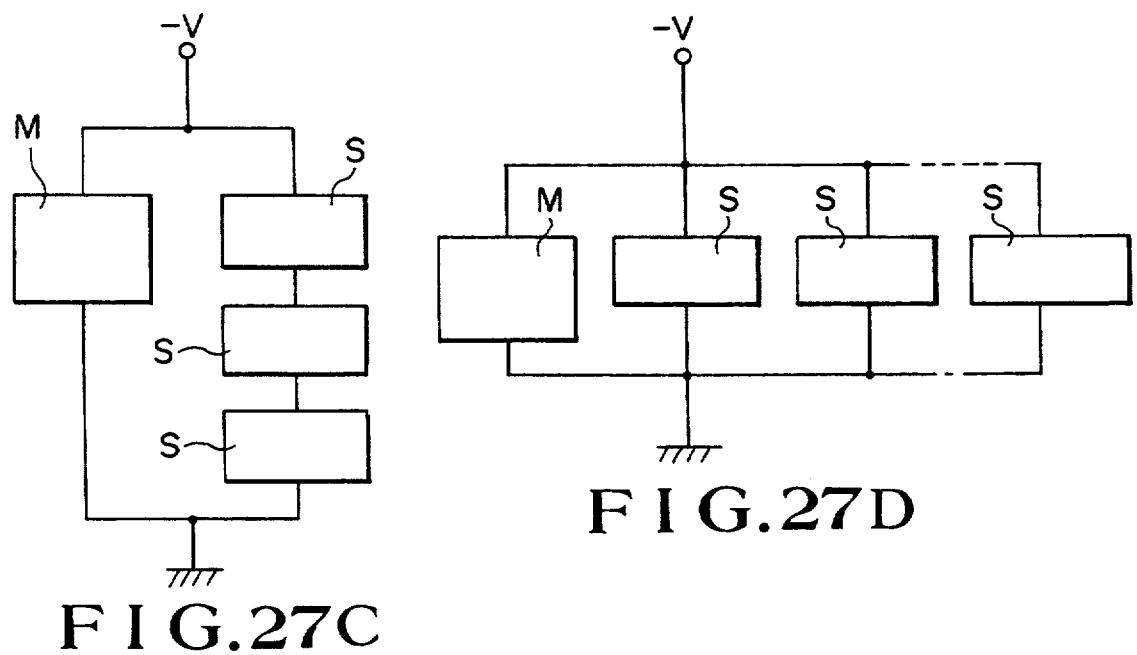

FIGS. 26(a) and 26(d) are sectional views showing schematic arrangements of multi-input optical gate arrays according to other embodiments of the present invention. FIGS. 27(a) to 27(d) are equivalent circuit diagrams corresponding to the optical gate arrays shown in FIGS. 26(a) to 26(d). The fundamental structure of each optical gate array is that a plurality of photodetector portions S are formed on an insulating substrate IS or a conductive semiconductor substrate IS, an optical modulating portion M and a pair of electrodes C are formed on one of the photodetector portions S, and a constant-voltage power supply (not shown) is connected between the electrodes. A plurality of input light beams $P_{in}$ are incident on the photodetector portions S from the substrate side, and output light $P_{out}$ is output as reflected light of bias light $P_{bias}$ radiated on the optical modulating portion M. The following four types of gates can be realized depending on a method of connecting the photodetector portion S to the optical modulating portion M and a method of connecting the plurality of photodetector portions S to each other. The conductivity type of a substrate and electrode extraction positions vary depending on the type of a gate. Table 1 summarizes the above description as follows:

TABLE 1

| Name | Connection between S and M | Connection between S and S | Substrate | First electrode | Second electrode |
|---|---|---|---|---|---|
| series/series (NAND) | series | series | insulative | M | last S |
| series/parallel (NOR) | series | parallel | conductive | M | substrate |
| parallel/series (AND) | parallel | series | insulative | M + last S | first S |
| parallel/parallel (OR) | parallel | parallel | conductive | M + substrate | common to all S |

Each photodetector portion S is constituted by, e.g., a photodiode (PD), a hetero-phototransistor (HPT), or a thyristor (SI). The optical modulating portion M is constituted by a reflection type MQW modulator consisting of a DBR layer formed by alternately stacking pairs of two semiconductor layers having different refractive indexes, an MQW layer formed by alternately stacking pairs of semiconductor thin layers having different band gaps, and a clad layer.

An operation principle of an optical gate array will be described below with reference to FIGS. 28(a) to 32(d).

An operation principle based on an arrangement in which an MQW modulator is coupled to a single photodetector will be described first.

FIG. 28(a) shows an arrangement in which the MQW optical modulator MD and the photodiode PD are connected in series with each other. FIG. 28(b) shows an arrangement in which the MQW optical modulator MD and the phototransistor HPT are connected in series with each other. In either arrangement, when the light input $P_{in}=0$, the photodiode PD or the like is set in an open state. For this reason, the MQW optical modulator MD is set in a zero bias state and hence in a high output state ($P_{out}=1$). When the light input $P_{in}=1$, the photodiode PD or the like is short-circuited. For this reason, the MQW optical modulator MD is set in a reverse bias state and hence in a low output state ($P_{out}=0$). That is, the $P_{in}-P_{out}$ characteristics exhibit NOR gate characteristics, as shown in FIG. 28(c).

FIG. 29(a) shows an arrangement in which the MQW optical modulator MD and the photodiode PD are connected in parallel with each other. FIG. 29(b) shows an arrangement in which the MQW optical modulator MD and the phototransistor HPT are connected in parallel with each other. In either arrangement, a load resistor R is connected between a constant-voltage power supply and the parallel circuit. When the light input $P_{in}=0$, the photodiode PD or the like is set in an open state. For this reason, the MQW optical modulator MD is set in a reverse bias state and hence in a low output state ($P_{out}=0$). When the light input $P_{in}=1$, the photodiode PD or the like is short-circuited. For this reason, the MQW optical modulator MD is set in a zero bias state and hence in a high output state ($P_{out}=1$). That is, the $P_{in}-P_{out}$ characteristics exhibit OR gate characteristics, as shown in FIG. 29(c).

FIG. 30(a) shows an arrangement in which the MQW optical modulator MD and the thyristor SI are connected in series with each other. When the light input $P_{in}=0$, the thyristor SI is in an OFF state. For this reason, the MQW optical modulator MD is set in a zero bias state and hence in a high output state ($P_{out}=1$). When the light input $P_{in}=1$, the thyristor SI is set in an ON state. For this reason, the MQW optical modulator MD is set in a reverse bias state and hence in a low output state ($P_{out}=0$). If the thyristor SI is temporarily set in an ON state, since this state is held even if the light input $P_{in}=0$, the light output $P_{out}=0$ is kept. That is, the $P_{in}-P_{out}$ characteristics exhibit NOR gate characteristics with a memory function, as shown in FIG. 30(b). In order to reset the light output $P_{out}=1$, bias light radiated on the MQW optical modulator MD may be cut off, or the constant-voltage power supply is turned off, or the thyristor SI may be short-circuited.

FIG. 31(a) shows an arrangement in which the MQW optical modulator MD and the thyristor SI are connected in parallel with each other. When the light input $P_{in}=0$, the thyristor SI is in an OFF state. For this reason, the MQW optical modulator MD is set in a reverse bias state and hence in a low output state ($P_{out}=0$). When the light input $P_{in}=1$, the thyristor SI is set in an ON state. For this reason, the MQW optical modulator MD is set in a zero bias state and hence in a high output state ($P_{out}=1$). If the thyristor SI is temporarily set in an ON state, since this state is held even if the light input $P_{in}=0$ is set, the light output $P_{out}=1$ is kept. That is, the $P_{in}-P_{out}$ characteristics exhibit OR gate characteristics with a memory function, as shown in FIG. 31(b). In order to reset the light output $P_{out}=1$, bias light radiated on the MQW optical modulator MD may be cut off, or the constant-voltage power supply may be turned off, or the thyristor SI may be short-circuited.

An operation based on an arrangement in which the photodetector portions S are constituted by a plurality of photodiodes PD will be described below. The following description is applied to each case wherein the photodetector portions S are constituted by the photodiodes PD, or the phototransistors HPT, or the thyristors SI.

Figure 32A:
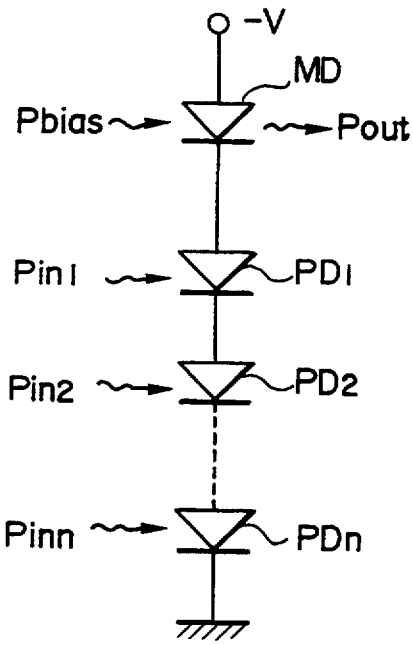
FIGS. 32(a) to 32(d) are equivalent circuit

FIG. 32(a) shows a series/series type, i.e., an arrangement in which all the MQW optical modulator MD and n photodiodes PD are connected in series with each other. Since the MQW optical modulator MD is switched to a low output state ($P_{out}=0$) only when light is input to all the n photodiodes $PD_1$, $PD_2$, ..., $PD_n$ ($P_{in1}=P_{in2}=\ldots=P_{inn}=1$), a NAND gate is obtained (see the following truth table 2).

TABLE 2

| $P_{in1}$ | $P_{in2}$ | ... | $P_{inn}$ | $P_{out}$ |
|---|---|---|---|---|
| 0 | 0 | ... | 0 | 1 |
| 1 | 0 | ... | 0 | 1 |
| 0 | 1 | ... | 0 | 1 |
| 1 | 1 | ... | 0 | 1 |
| . | . | ... | . | . |
| . | . | ... | . | . |

TABLE 2-continued

| $P_{in1}$ | $P_{in2}$ | ... | $P_{inn}$ | $P_{out}$ |
|---|---|---|---|---|
| 1 | 1 | ... | 1 | 0 |

Figure 32B:
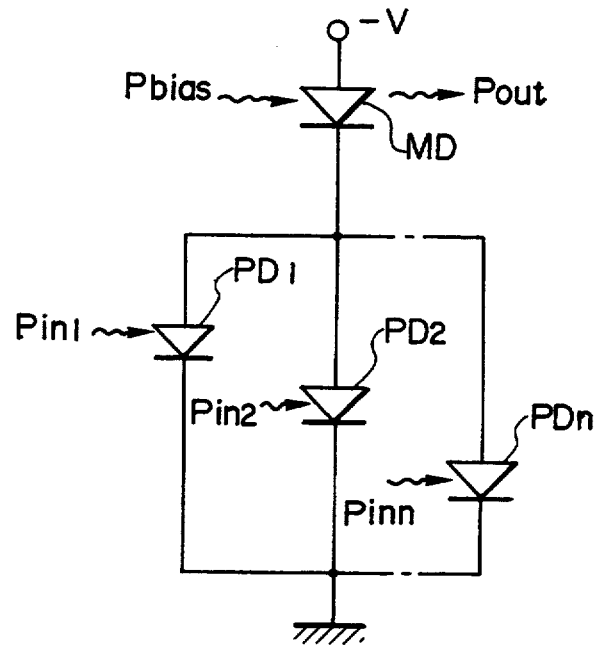

FIG. 32(b) shows a series/parallel type, i.e., an arrangement in which all the n photodiodes PD are connected in parallel with each other, and the MQW optical modulator MD is connected in series therewith. When light is input to one of the n photodiodes PD$_1$, PD$_2$, ..., PD$_n$ ($P_{in1}=1$, $P_{in2}=1$, ..., or $P_{inn}=1$), the MQW optical modulator MD is switched to a low output state ($P_{out}=0$). Therefore, a NOR gate is obtained (see the following truth table 3).

TABLE 3

| $P_{in1}$ | $P_{in2}$ | ... | $P_{inn}$ | $P_{out}$ |
|---|---|---|---|---|
| 0 | 0 | ... | 0 | 1 |
| 1 | 0 | ... | 0 | 0 |
| 0 | 1 | ... | 0 | 0 |
| 1 | 1 | ... | 0 | 0 |
| . | . | ... | . | . |
| . | . |  | . | . |
| . | . |  | . | . |
| 1 | 1 | ... | 1 | 0 |

Figure 32C:
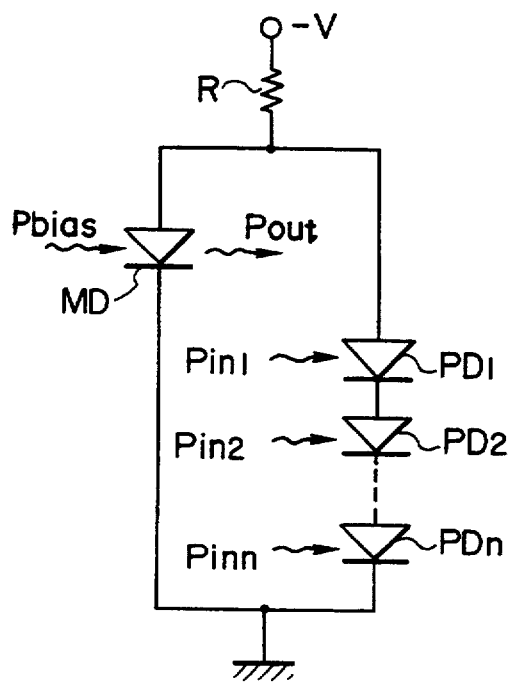

FIG. 32(c) shows a parallel/series type, i.e., an arrangement in which the n photodiodes PD are connected in series with each other, and the MQW optical modulator MD is connected in parallel therewith. Since the MQW optical modulator MD is switched to a high output state ($P_{out}=1$) only when light is input to all the n photodiodes PD$_1$, PD$_2$, ..., PD$_n$ ($P_{in1}=P_{in2}=1$ ... $P_{inn}=1$), an AND gate is obtained (see the following truth table 4).

TABLE 4

| $P_{in1}$ | $P_{in2}$ | ... | $P_{inn}$ | $P_{out}$ |
|---|---|---|---|---|
| 0 | 0 | ... | 0 | 0 |
| 1 | 0 | ... | 0 | 0 |
| 0 | 1 | ... | 0 | 0 |
| 1 | 1 | ... | 0 | 0 |
| . | . | ... | . | . |
| . | . |  | . | . |
| . | . |  | . | . |
| 1 | 1 | ... | 1 | 1 |

Figure 32D:
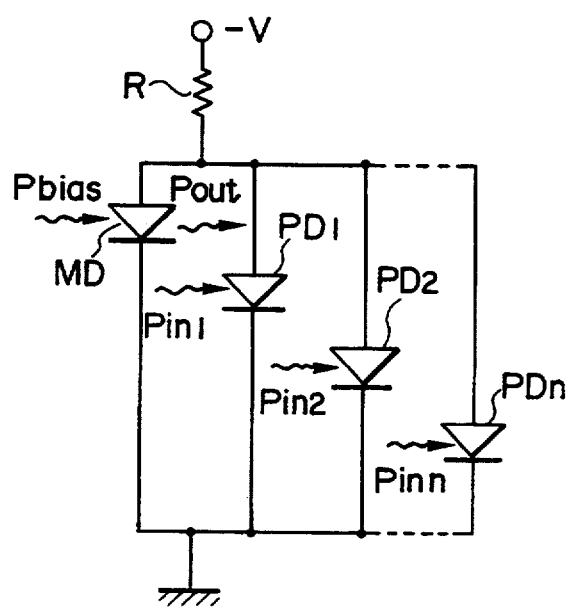

FIG. 32(d) shows a parallel/parallel type, i.e., an arrangement in which all the MQW optical modulator MD and the n photodiodes PD are connected in parallel with each other. When light is input to one of the n photodiodes PD$_1$, PD$_2$, ..., PD$_n$ ($P_{in1}=P_{in2}=1$, ..., or $P_{inn}=1$), the MQW modulator MD is switched to a high output state ($P_{out}=1$). Therefore, an OR gate is obtained (see the following truth table 5).

TABLE 5

| $P_{in1}$ | $P_{in2}$ | ... | $P_{inn}$ | $P_{out}$ |
|---|---|---|---|---|
| 0 | 0 | ... | 0 | 0 |
| 1 | 0 | ... | 0 | 1 |
| 0 | 1 | ... | 0 | 1 |
| 1 | 1 | ... | 0 | 1 |
| . | . | ... | . | . |
| . | . |  | . | . |
| . | . |  | . | . |
| 1 | 1 | ... | 1 | 1 |

As described above, NAND, NOR, AND, and OR gates can be realized depending on the manner of connecting the photodiodes PD and the MQW optical modulator MD to each other and of connecting the photodiodes PD to each other.

Four types gates realized by GaAs/AlGaAs materials, in which the photodiode PD is constituted by a pin photodiode, will be described below as examples (1) to (4). Especially NAND gates ( series/series type ) in which the hetero-phototransistor HPT and the thyristor SI are used in place of the photodiode PD will be described below as examples (5) and (6). In addition, HPT NAND gates and realized by other materials, i.e., GaAs/InGaAs, InGaAs/InAlAs, and InGaAs/InP materials, will be described below as examples (7) to (9).

(1) GaAs/AlGaAs PD NAND gate

Figure 33A:
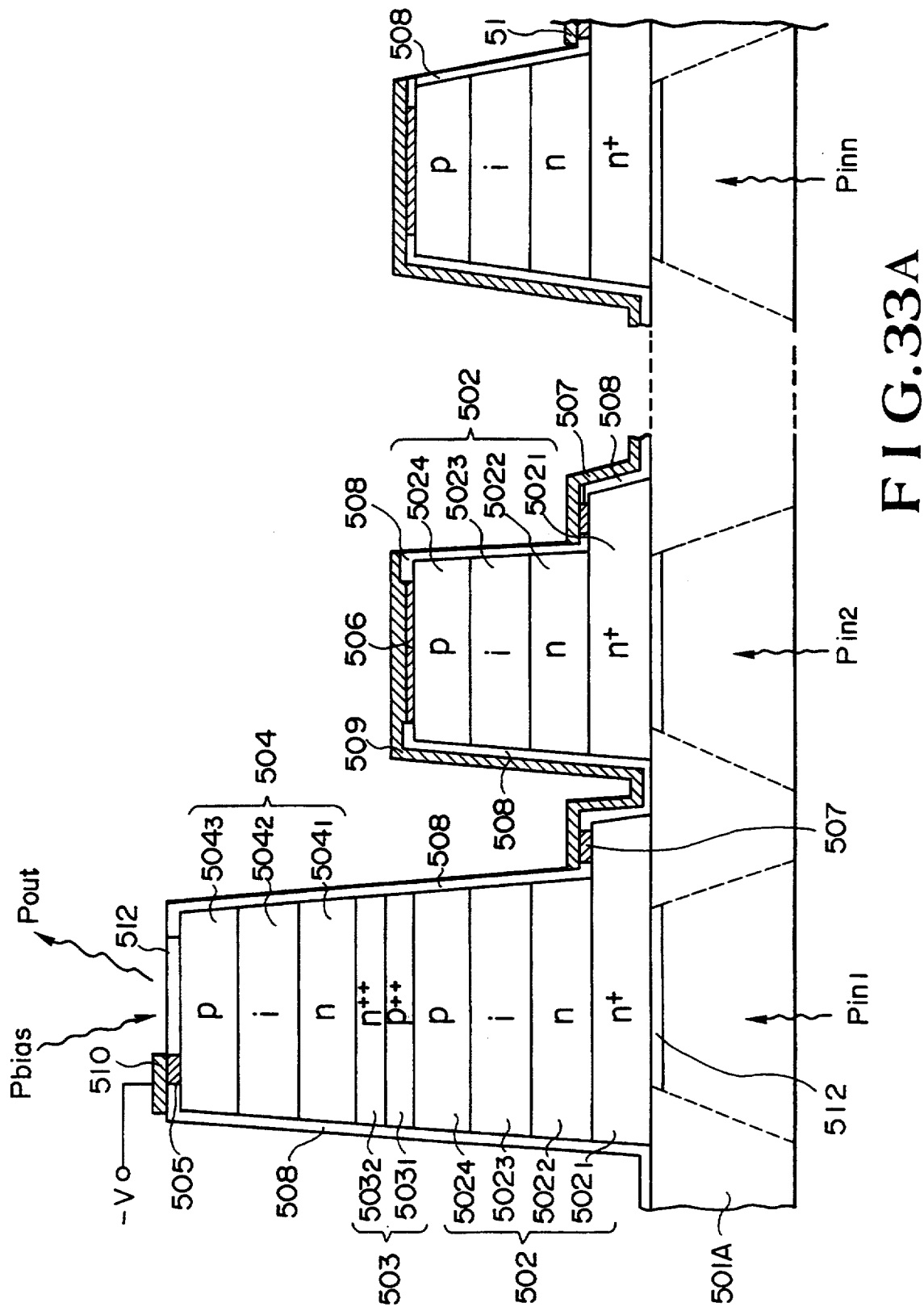
FIGS. 33a to 33(d), 34 and 35 are sectional views each showing an arrangement of an optical gate array according to the present invention.

As shown in FIG. 33(a), a pin photodiode 502, a tunnel junction 503, and an MQW modulator 504 were stacked on a semi-insulating GaAs substrate 501A by molecular beam epitaxial deposition. The pin photodiode 502 was constituted by an n$^+$-GaAs layer 502$_1$ (thickness: 2 μm) as a contact layer, an n-Al$_{0.3}$Ga$_{0.7}$As layer 502$_2$ (thickness: 0.5 μm) an i-GaAs layer 502$_3$ (thickness: 4 μm), and a p-Al$_{0.3}$Ga$_{0.7}$As layer 502$_4$ (thickness: 0.5 μm). The tunnel junction 503 was constituted by a p$^{++}$-GaAs layer 503$_1$ (thickness: 0.1 μm) and an n$^{++}$-GaAs layer 503$_2$ (thickness: 0.1 μm). The MQW modulator 504 was constituted by an n-DBR layer 504$_1$ formed by alternately stacking n-AlAs layers (thickness: 629 Å) and n-Al$_{0.3}$Ga$_{0.7}$As layers (thickness: 715 Å) in 25 stacking cycles, an i-MQW layer 504$_2$ formed by alternately stacking undoped GaAs layers (thickness: 100 Å) and undoped Al$_{0.3}$Ga$_{0.7}$As layers (thickness: 50 Å) in 270 stacking cycles, a p-Al$_{0.3}$Ga$_{0.7}$As layer (thickness: 0.5 μm) 504$_3$, and p$^+$-GaAs layer (thickness: 0.1 μm). Be and Si were respectively used as p- and n-type dopants.

A 1.5-cm square chip was cut from a growth wafer. A 50×50 matrix (size: 100 μm square; pitch: 200 μm) was formed in a 1-cm square central portion of the chip by mesa division, thus forming bit constituent elements. Selective etching was performed such that five columns of the stacked layer portions of the MQW modulators 504 and the pin photodiodes 502 were left without being etched (interval: 10 columns) while adjacent nine columns (total: 45 columns) of the MQW modulators 504 and the tunnel junctions 503 were removed to expose the p-type layers 504$_2$ of the respective pin photodiodes 502. Note that a portion, of the n$^+$-type layer of each pin photodiode 502, corresponding to an area of 100 μm×40 μm was selectively etched. With the above-described process, one gate was constituted by ten bit constituent elements.

A first AuZnNi ohmic electrode 505 (thickness: 1,000 Å) having an area of 80 μm×20 μm was formed on the upper surface of the p-GaAs layer 504$_3$ of the MQW modulator 504. A second AuZnNi electrode 506 (thickness: 1,000 Å) having an area of 80 μm×40 μm was formed on an exposed portion of the p-type layer 502$_4$ of the pin photodiode 502. A first AuGeNi electrode 507 (thickness: 1,000 Å) having an area of 80 μm×20 μm was formed on an exposed portion of the n$^+$-type layer 502$_1$ of the pin photodiode 502. A side surface of each mesa structure was insulated by an SiN film 508. In order to connect the ten pin photodiodes 502 in series with each other, a first Cr/Au electrode 509 was formed to connect the first AuGeNi electrode 507 to the adjacent second AuZnNi electrode 506 of each pin photodiode 502. Second Cr/Au electrodes 510 were formed to connect the first AuZnNi electrodes 505 of the respective gate constituent elements. In addition, a third Cr/Au electrode 511 was formed to connect the first AuGeNi electrodes 507 of the last pin photodiode 502 to each other. After the p-GaAs layer $504_3$ as a photodetective portion and the GaAs substrate 501A on the lower surface of the element were peeled off by selective etching, an $SiO_2/TiO_2$ antireflection multilayer 512 was formed.

A constant-voltage power supply (30 V) was connected between the second Cr/Au electrode 510 and the third Cr/Au electrode 511. A semiconductor laser beam having a wavelength of 860 nm was used both as input light and bias light. Ten input light beams $P_{in}$ were incident, per gate, on the pin photodiodes 502 from the lower surface of the substrate while the intensity of each input light was changed in the range from 0 to 1 mW. A 1-mW laser beam was focused to have a spot size of 20 μm or less and was radiated, as bias light, on a light input/output portion of the upper surface of the element. The intensity of reflected light $P_{out}$ was measured by a power meter. As shown in FIG. 28(c), negative logic gate characteristics appeared only when the intensities of all the input light $P_{in}$ exceeded 0.5 mW. The contrast ratio ($P_{outH}/P_{outL}$) was 100:1, and the response time was 10 ns.

(2) GaAs/AlGaAs PD NOR gate

Figure 33B:
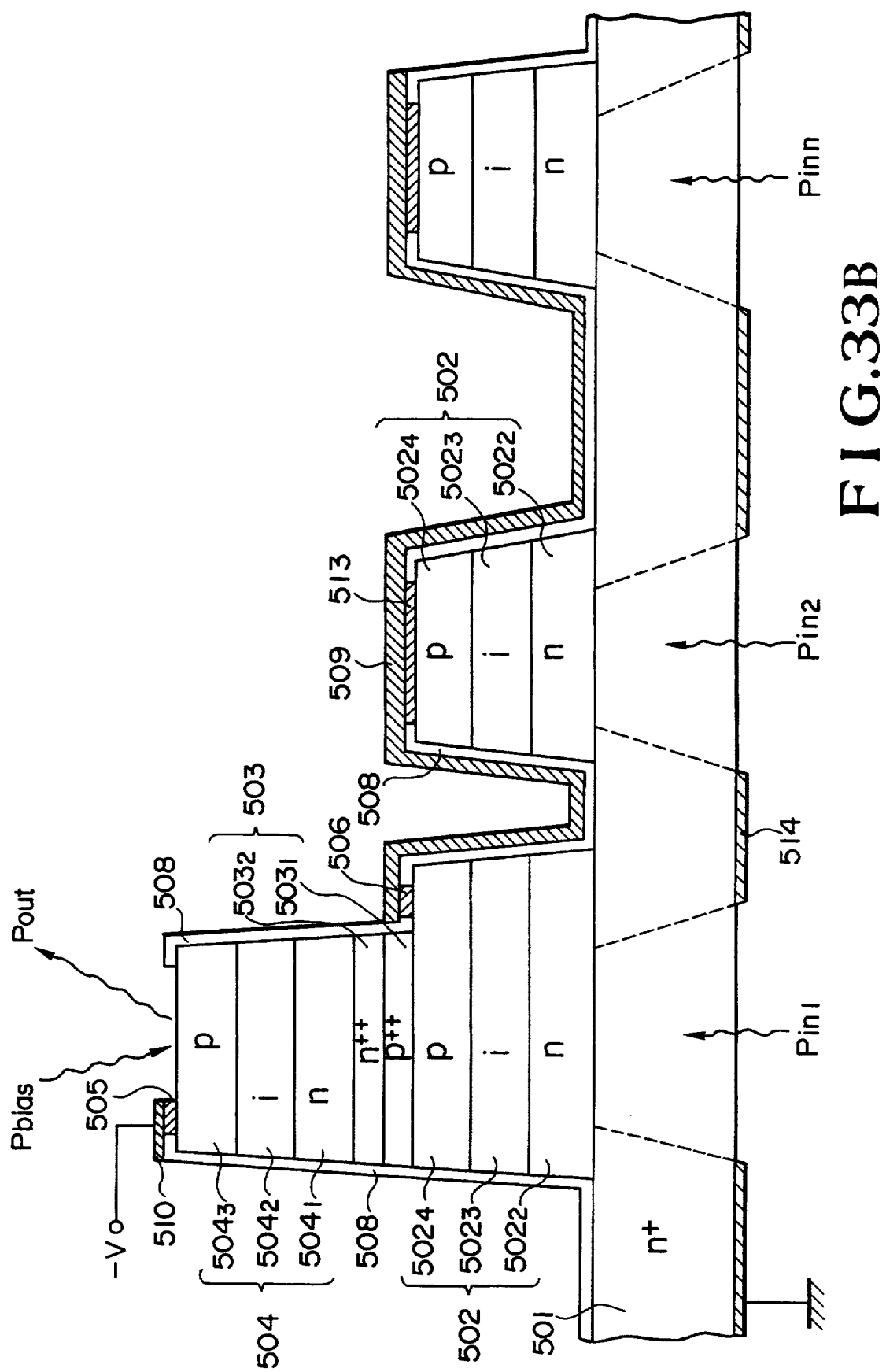

FIG. 33(b) shows a layer arrangement of this gate, which is the same as that shown in FIG. 33(a).

A 1.5-cm square chip was cut from a growth wafer. A 50×50 matrix (size: 100 μm square; pitch: 200 μm) was formed in a 1-cm square central portion of the chip by mesa division, thus forming bit constituent elements. Selective etching was performed such that five columns of stacked layer portions of MQW modulators 504 and pin photodiodes 502 were left without being etched (interval: 10 columns) while adjacent nine columns (total: 45 columns) of the MQW modulators 504 and tunnel junctions 503 were removed to expose p-type layers $502_4$ of the respective pin photodiodes 502. Note that a portion, of the p-type layer $502_4$ of the pin photodiode 502 on which the MQW modulator 504 was stacked, corresponding to an area of 1,000 μm×40 μm was exposed by selective etching. With the above-described process, one gate was constituted by ten bit constituent elements.

A first AuZnNi ohmic electrode 505 (thickness: 1,000 Å) having an area of 80 μm×20 μm was formed on the upper surface of a p-GaAs layer $504_3$ of the MQW modulator 504. A second AuZnNi electrode 506 (thickness: 1,000 Å) having an area of 80 μm×20 μm was formed on an exposed portion of the p-type layer $502_4$ of the pin photodiode 502 on which the MQW modulator 504 was stacked. A third AuZnNi electrode 513 (thickness: 1,000 Å) having an area of 80 μm×80 μm was formed on the entire exposed surface of a p-type layer $502_4$ of the pin photodiode 502. A first AuGeNi/Cr/Au electrode 514 (thickness: 2,000 Å) was formed on the lower surface of an n-type semiconductor substrate 1. A side surface of each mesa structure was insulated by an SiN film 508. In order to connect the ten pin photodiodes 502 in parallel with each other, a first Cr/Au electrode 509 was formed to connect the second AuZnNi electrode 506 to the adjacent third AuZnNi electrode 513 of each pin photodiode 502. In addition, second Cr/Au electrodes 510 were formed to connect first AuZnNi electrodes 505 of the respective gate constituent elements. After the p-GaAs layer $504_3$ as a photodetective portion and the n-type semiconductor substrate 501 on the lower surface of the element were peeled off by selective etching, an $SiO_2/TiO_2$ antireflection multilayer 512 was formed.

A constant-voltage power supply (30 V) was connected between the first AuGeNi/Cr/Au electrode 514 and the second Cr/Au electrode 510. A semiconductor laser beam having a wavelength of 860 nm was used both as input light and bias light. Ten input light beams $P_{in}$ were incident, per gate, on the pin photodiodes 502 from the lower surface of the substrate while the intensity of each input light was changed in the range from 0 to 1 mW. A 1-mW laser beam was focused to have a spot size of 20 μm or less and was radiated, as bias light, on a light input/output portion of the upper surface of the element. The intensity of reflected light $P_{out}$ was measured by a power meter. As shown in FIG. 28(c), negative logic gate characteristics appeared only when the intensities of all the input light $P_{in}$ exceeded 0.5 mW. The contrast ratio ($P_{outH}/P_{outL}$) was 100:1, and the response time was 10 ns.

(3) GaAs/AlGaAs PD AND gate

Figure 33C:
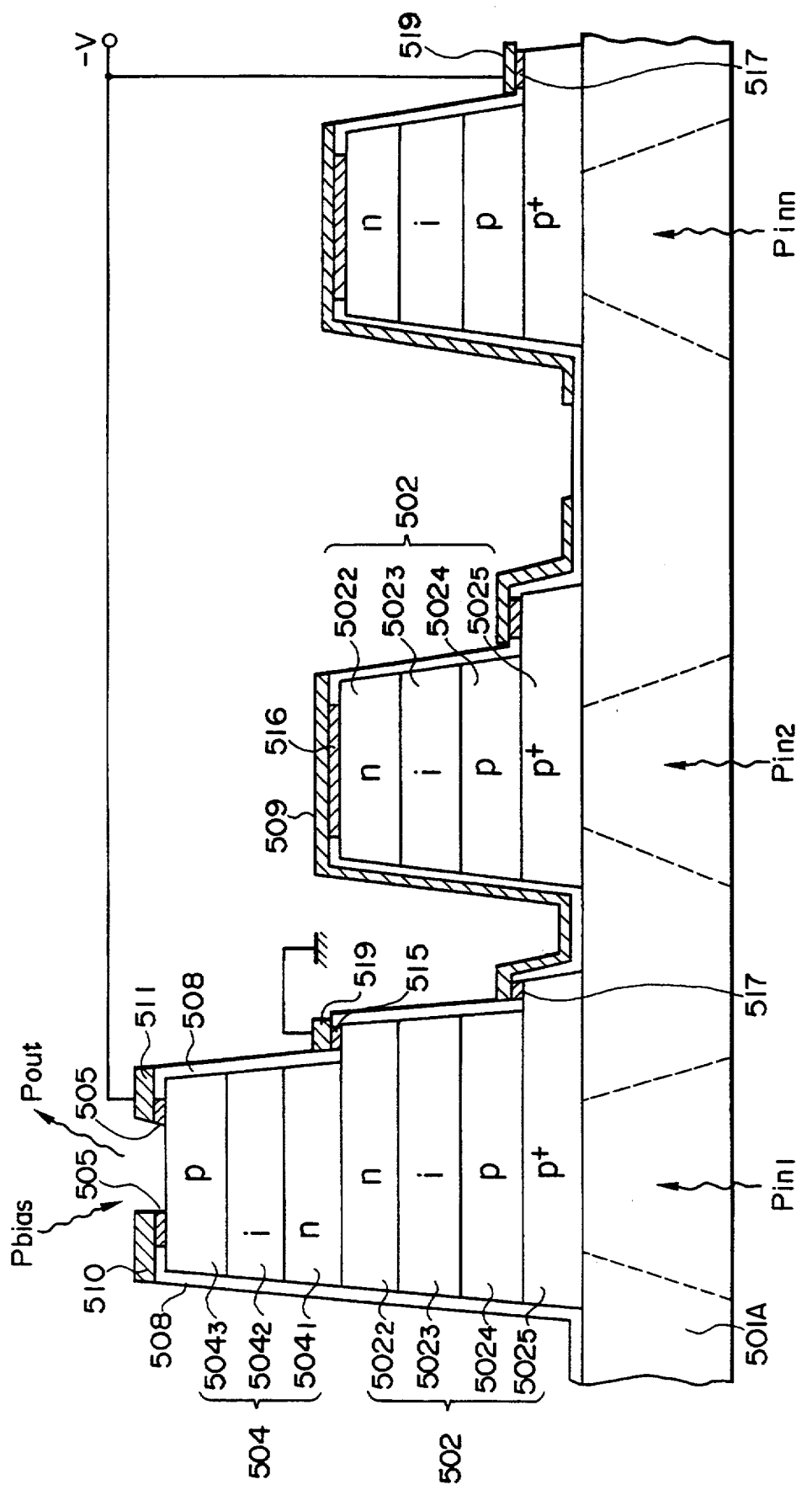

As shown in FIG. 33(c), a pin photodiode 502 and an MQW modulator 504 were stacked on a semi-insulating GaAs substrate 501A by molecular beam epitaxial deposition. The pin photodiode 502 was constituted by a p$^+$-GaAs layer $502_5$ (thickness: 2 μm) as a contact layer, a p-Al$_{0.3}$Ga$_{0.7}$As layer $502_4$ (thickness: 0.5 μm), an i-GaAs layer $502_3$ (thickness: 4 μm), and an n-Al$_{0.3}$Ga$_{0.7}$As layer $502_2$ (thickness: 0.5 μm). The MQW modulator 504 was constituted by an n-DBR layer $504_1$ formed by alternately stacking n-AlAs layers (thickness: 629 Å) and n-Al$_{0.3}$Ga$_{0.7}$As layers (thickness: 715 Å) in 25 stacking cycles, an i-MQW layer $504_2$ formed by alternately stacking undoped GaAs layers (thickness: 100 Å) and undoped Al$_{0.3}$Ga$_{0.7}$As layers (thickness: 50 Å) in 270 stacking cycles, a p-Al$_{0.3}$Ga$_{0.7}$As layer $504_3$ (thickness: 0.5 μm), and p$^+$-GaAs layer (thickness: 0.1 μm). Be and Si were respectively used as p- and n-type dopants.

A 1.5-cm square chip was cut from a growth wafer. A 50×50 matrix (size: 100 μm×140 μm; pitch: 200 μm) was formed in a 1-cm square central portion of the chip by mesa division, thus forming bit constituent elements. Selective etching was performed such that five columns of the stacked layer portions of the MQW modulators 504 and the pin photodiodes 502 were left without being etched (interval: 10 columns) while adjacent nine columns (total: 45 columns) of the MQW modulators 504 and tunnel junctions were removed to expose the p-type layers $502_2$ of the respective pin photodiodes 502. A portion, of the n-type layer of the pin photodiode 502 on which the MQW modulator 504 was stacked, corresponding to an area of 100 μm×40 μm was exposed by selective etching. Note that a portion, of the p$^+$-type layer of the pin photodiode 502, corresponding to an area 100 μm×40 μm was also exposed by selective etching. With the above-described process, one gate was constituted by ten bit constituent elements.

A first AuZnNi ohmic electrode 505 (thickness: 1,000 Å) having an area of 80 μm×20 μm was formed on the upper surface of the p-GaAs layer $504_3$ of the MQW modulator 504. A second AuZnNi electrode 506 (thickness: 1,000 Å) having an area of 80 μm×20 μm was formed on an exposed portion of the p-type layer $502_4$ of the pin photodiode 502. A third AuGeNi electrode 516 (thickness: 1,000 Å) having an area of 80 μm×80 μm was formed on the entire exposed surface of the n-type layer $502_2$ of the pin photodiode 502. A fourth AuZnNi electrode 517 (thickness: 1,000 Å) having an area of 80

μm×20 μm was formed on an exposed portion of the p+-type layer $502_5$ of the pin photodiode 502. A side surface of each mesa structure was insulated by an SiN film 508. In order to connect the ten pin photodiodes 502 in series with each other, a first Cr/Au electrode 509 was formed to connect the fourth AuZnNi electrode 517 to the third AuGeNi electrode 516 of the adjacent third AuGeNi electrode 516 of each pin photodiode 502. A second Cr/Au electrode 510 was formed on the first AuZnNi electrode 505. Furthermore, in order to connect the first AuZnNi electrode 505 to the fourth AuZnNi electrode 517 of the last pin photodiode 502, third and fourth Cr/Au electrodes 511 and 519 were respectively formed on the first and fourth AuZnNi electrodes 505 and 517 and were connected to each other by wire bonding. After the p-GaAs layer $504_3$ as a photodetective portion and the GaAs substrate 501A on the lower surface of the element were peeled off by selective etching, an $SiO_2/TiO_2$ antireflection multilayer was formed.

A constant-voltage power supply (30 V) was connected between the third and fourth Cr/Au electrodes 511 and 519. A semiconductor laser beam having a wavelength of 860 nm was used both as input light and bias light. Ten input light beams $P_{in}$ were incident, per gate, on the pin photodiodes 502 from the lower surface of the substrate while the intensity of each input light was changed in the range from 0 to 1 mW. A 1-mW laser beam was focused to have a spot size of 20 μm or less and was radiated, as bias light, on a light input/output portion of the upper surface of the element. The intensity of reflected light $P_{out}$ was measured by a power meter. As shown in FIG. 30(b), negative logic gate characteristics appeared only when the intensities of all the input light $P_{in}$ exceeded 0.5 mW. The contrast ratio ($P_{outH}/P_{outL}$) was 100:1, and the response time was 10 ns.

(4) GaAs/AlGaAs PD OR gate

Figure 33D:
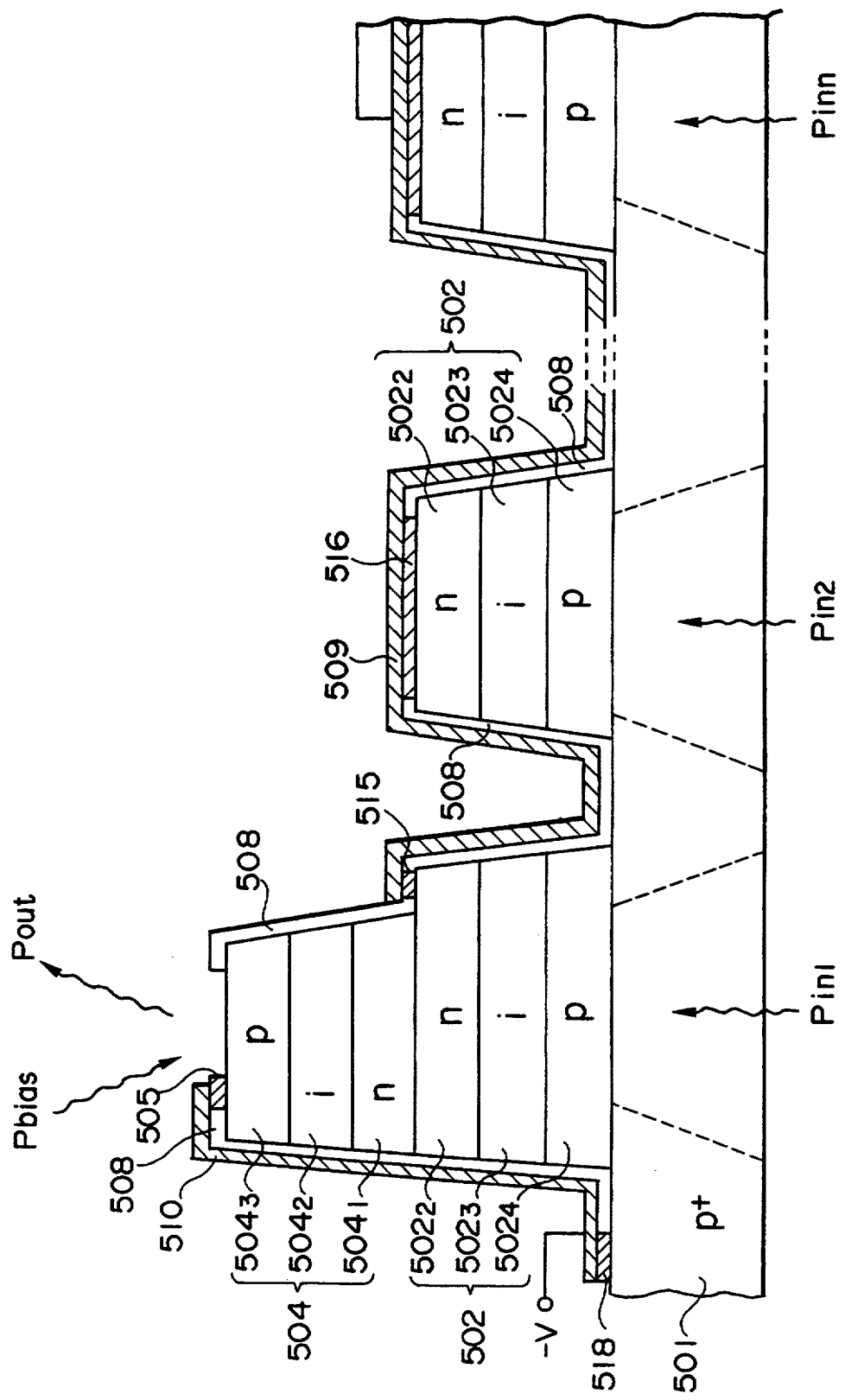

FIG. 33(d) shows a layer arrangement. This layer arrangement is the same as that shown in FIG. 33(c).

A 1.5-cm square chip was cut from a growth wafer. A 50×50 matrix (size: 100 μm×100 μm; pitch: 200 μm) was formed in a 1-cm square central portion of the chip by mesa division, thus forming bit constituent elements. Selective etching was performed such that five columns of the stacked layer portions of the MQW modulators 504 and the pin photodiodes 502 were left without being etched (interval: 10 columns) while adjacent nine columns (total: 45 columns) of the MQW modulators 504 and tunnel junctions were removed to expose the p-type layers $502_2$ of the respective pin photodiodes 502. A portion, of the n-type layer $502_2$ of the pin photodiode 502 on which the MQW modulator 504 was stacked, corresponding to an area of 100 μm×40 μm was exposed by selective etching. With the above-described process, one gate was constituted by ten bit constituent elements.

A first AuZnNi ohmic electrode 505 (thickness: 1,000 Å) having an area of 80 μm×20 μm was formed on the upper surface of the p-GaAs layer $504_3$ of the MQW modulator 504. A second AuZnNi electrode 515 (thickness: 1,000 Å) having an area of 80 μm×20 μm was formed on an exposed portion of the p-type layer $502_4$ of the pin photodiode 502. A third AuGeNi electrode 516 (thickness: 1,000 Å) having an area of 80 μm×80 μm was formed on the entire exposed surface of the n-type layer $502_2$ of the pin photodiode 502. A fifth AuZnNi electrode 518 (thickness: 1,000 Å) having an area of 80 μm×20 μm was formed on the upper surface of an exposed portion of a p-GaAs substrate 501. A side surface of each mesa structure was insulated by an SiN film 508. In order to connect the ten pin photodiodes 502 in parallel with each other, a first Cr/Au electrode 509 was formed to connect the second AuZnNi electrode 515 to the third AuGeNi electrode 516. In addition, a second Cr/Au electrode 510 was formed to connect the second AuZnNi electrode 515 to a fifth AuZnNi electrode 518. After the p-GaAs layer $504_3$ as a photodetective portion and the GaAs substrate 501 on the lower surface of the element were peeled off by selective etching, an $SiO_2/TiO_2$ antireflection multilayer was formed.

A constant-voltage power supply (30 V) was connected between the first and second Cr/Au electrodes 509 and 510. A semiconductor laser beam having a wavelength of 860 nm was used both as input light and bias light. Ten input light beams $P_{in}$ were incident, per gate, on the pin photodiodes 502 from the lower surface of the substrate while the intensity of each input light was changed in the range from 0 to 1 mW. A 1-mW laser beam was focused to have a spot size of 20 μm or less and was radiated, as bias light, on a light input/output portion of the upper surface of the element. The intensity of reflected light $P_{out}$ was measured by a power meter. As shown in FIG. 30(b), positive logic gate characteristics appeared only when the intensities of all the input light $P_{in}$ exceeded 0.5 mW. The contrast ratio ($P_{outH}/P_{outL}$) was 100:1, and the response time was 10 ns.

(5) GaAs/AlGaAs HPT NAND gate

Figure 34:
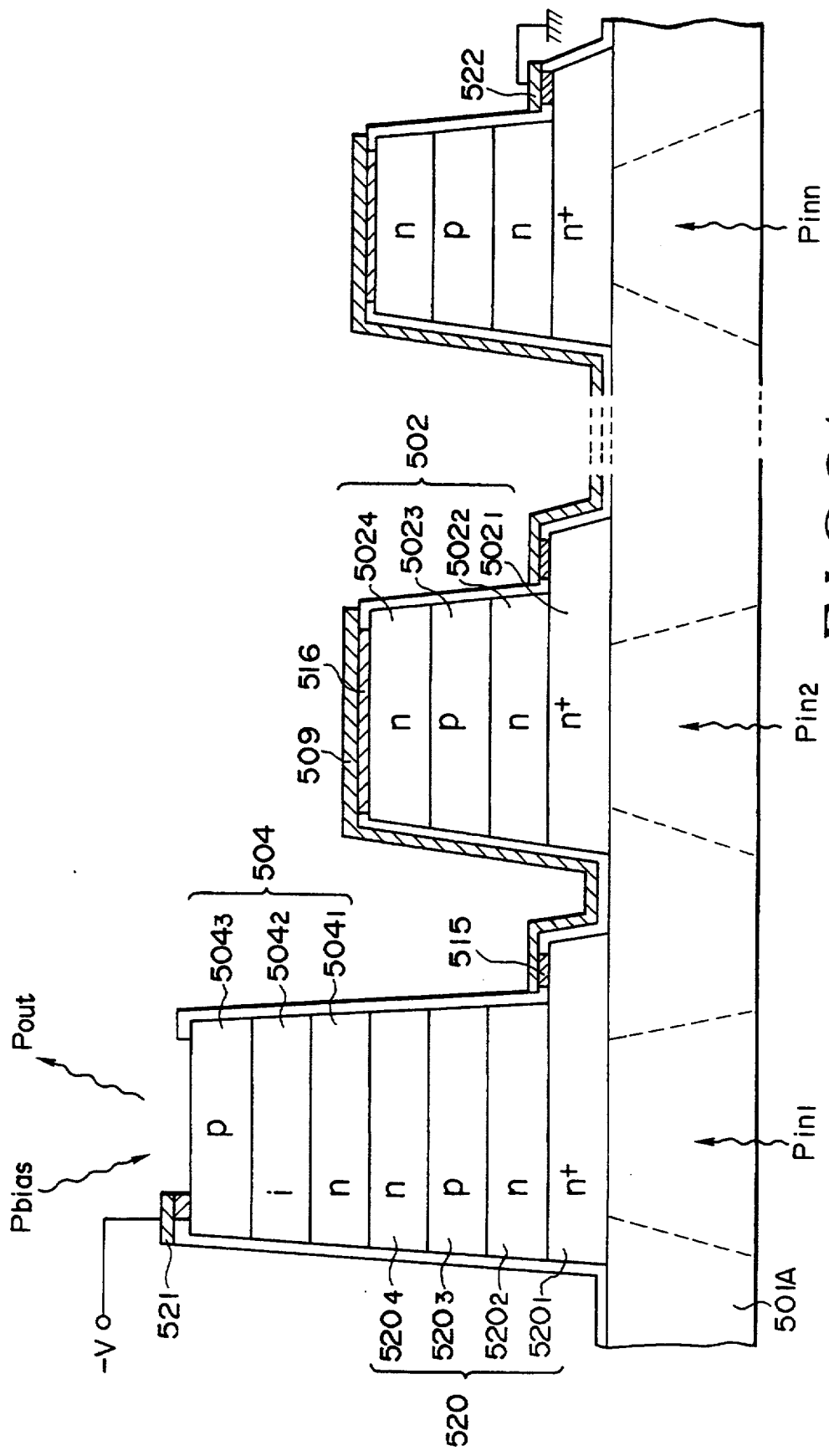

As shown in FIG. 34, an HPT 520 and an MQW modulator 504 were stacked on a semi-insulating GaAs substrate 501A by molecular beam epitaxial deposition. The HPT 520 was constituted by an n+-GaAs layer $520_1$ (thickness: 2 μm) as a contact layer, an n-GaAs layer $520_2$ (thickness: 2 μm), an p-GaAs layer $520_3$ (thickness: 2 μm), and an n-$Al_{0.3}Ga_{0.7}As$ layer $520_4$ (thickness: 0.5 μm). The MQW modulator 504 was constituted by an n-DBR layer $504_1$ formed by alternately stacking n-AlAs layers (thickness: 629 Å) and n-$Al_{0.3}Ga_{0.7}As$ layers (thickness: 715 Å) in 25 stacking cycles, an i-MQW layer $504_2$ formed by alternately stacking undoped GaAs layers (thickness: 100 Å) and undoped $Al_{0.3}Ga_{0.7}As$ layers (thickness: 50 Å) in 270 stacking cycles, a p-$Al_{0.3}Ga_{0.7}As$ layer (thickness: 0.5 μm) $504_2$, and a p+-GaAs layer (thickness: 0.1 μm). Be and Si were respectively used as p- and n-type dopants. Other arrangements of this gate are the same as those shown in FIG. 33(a).

A constant-voltage power supply (30 V) was connected between second and third Cr/Au electrodes 521 and 522. A semiconductor laser beam having a wavelength of 860 nm was used both as input light and bias light. Ten input light beams $P_{in}$ were incident, per gate, on the HPT 520 from the lower surface of the substrate while the intensity of each input light was changed in the range from 0 to 1 mW. A 1-mW laser beam was focused to have a spot size of 20 μm or less and was radiated, as bias light, on a light input/output portion of the upper surface of the element. The intensity of reflected light $P_{out}$ was measured by a power meter. As shown in FIG. 28(c), negative logic gate characteristics appeared only when the intensities of all the input light $P_{in}$ exceeded 0.5 mW. The contrast ratio ($P_{outH}/P_{outL}$) was 100:1, and the response time was 50 ns.

(6) GaAs/AlGaAs HPT NAND gate

Figure 35:
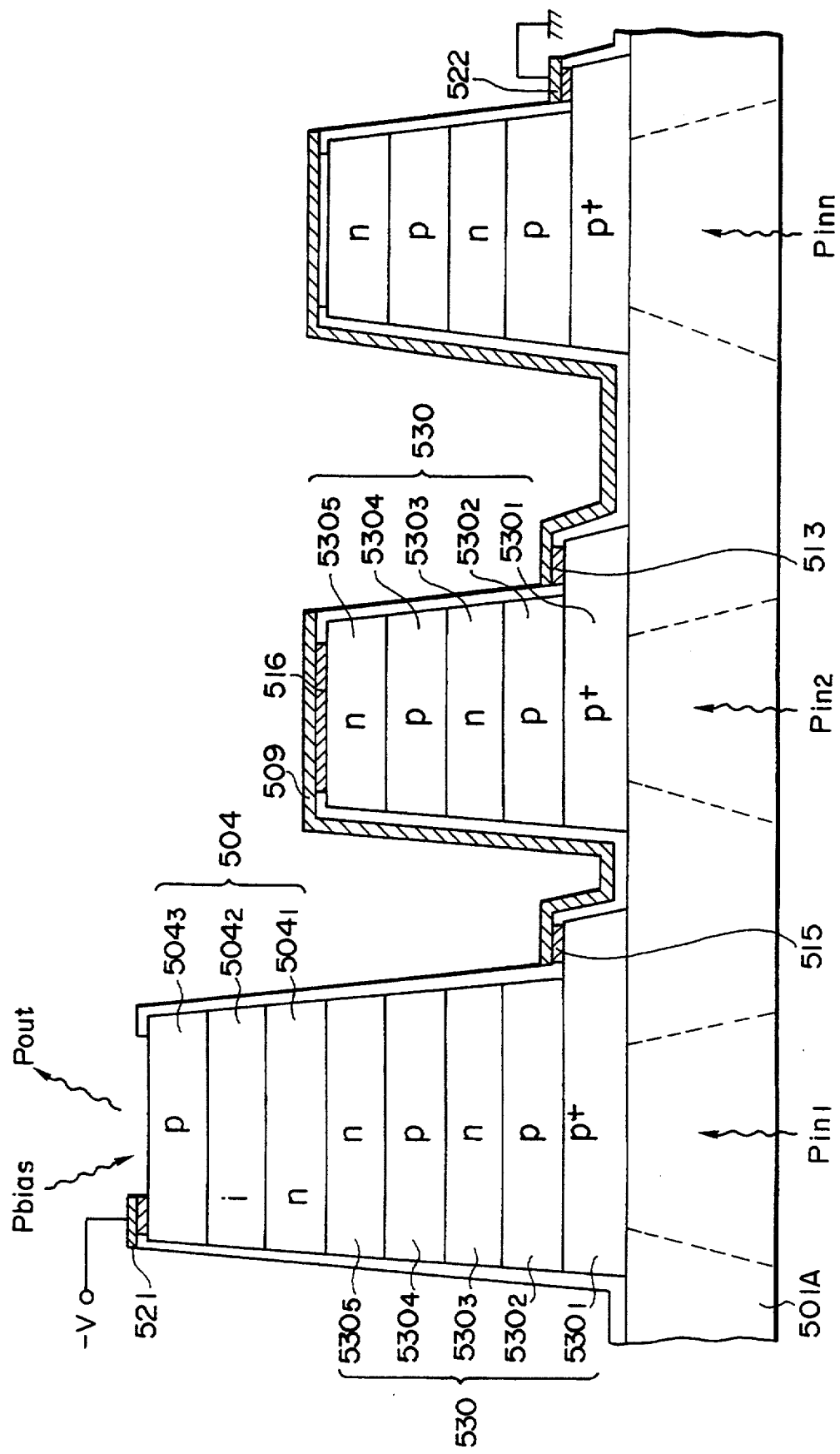

As shown in FIG. 35, a thyristor 530 and an MQW modulator 504 were stacked on a semi-insulating GaAs substrate 501A by molecular beam epitaxial deposition. The thyristor 530 was constituted by a p+-GaAs layer $530_1$ (thickness: 2 μm) as a contact layer, an p-$Al_{0.3}Ga_{0.7}As$ layer $530_2$ (thickness: 1 μm), an n-GaAs layer $530_3$ (thickness: 2 μm), a p-GaAs layer $530_4$ (thickness: 0.2 μm), and an n-$Al_{0.3}Ga_{0.7}As$ layer $530_5$ (thickness: 0.5 μm). The MQW modulator 504 was constituted by an n-DBR layer $504_1$ formed by alternately stacking n-AlAs layers (thickness: 629 Å) and n-$Al_{0.3}Ga_{0.7}As$ layers (thickness: 715 Å) in 25 stacking cycles, an i-MQW layer $504_2$ formed by alternately stacking undoped GaAs layers (thickness: 100 Å) and undoped $Al_{0.3}Ga_{0.7}As$ layers (thickness: 50 Å) in 270 stacking cycles, a p-$Al_{0.3}G_{0.7}As$ layer (thickness: 0.5 μm) $504_3$, and a p+-GaAs layer (thickness: 0.1 μm). Be and Si were respectively used as p- and n-type dopants. Other arrangements of this gate were the same as those shown in FIG. 33(a).

A constant-voltage power supply (30 V) was connected between second and third Cr/Au electrodes 521 and 522. A semiconductor laser beam having a wavelength of 860 nm was used both as input light and bias light. Ten input light beams $P_{in}$ were incident, per gate, on the HPT 520 from the lower surface of the substrate while the intensity of each input light was changed in the range from 0 to 100 μW. A 1-mW laser beam was focused to have a spot size of 20 μm or less and was radiated, as bias light, on a light input/output portion of the upper surface of the element. The intensity of reflected light $P_{out}$ was measured by a power meter. As shown in FIG. 30(b), negative logic gate characteristics appeared only when the intensities of all the input light $P_{in}$ exceeded 10 μW. The contrast ratio ($P_{outH}/P_{outL}$) was 100:1, and the response time was 50 ns.

(7) GaAs/InGaAs HPT NAND gate

As shown in FIG. 34, an HPT 520 and an MQW modulator 504 were stacked on a semi-insulating GaAs substrate 501A by molecular beam epitaxial deposition. The HPT 520 was constituted by an n+-GaAs layer $520_1$ (thickness: 0.5 μm) as a contact layer, an n-GaAs layer $520_2$ (thickness: 2 μm), a p-GaAs layer $520_3$ (thickness: 0.2 μm), and an n-$Al_{0.3}Ga_{0.7}As$ layer $520_4$ (thickness: 0.5 μm). The MQW modulator 504 was constituted by an n-DBR layer $504_1$ formed by alternately stacking n-AlAs layers (thickness: 758 Å) and n-GaAa layers (thickness: 629 Å) in 25 stacking cycles, an i-MQW layer $504_2$ formed by alternately stacking undoped $In_{0.15}Ga_{0.85}As$ layers (thickness: 100 Å) and undoped GaAs layers (thickness: 100 Å) in 100 stacking cycles, and p+-GaAs layer $504_3$ (thickness: 0.5 μm). Be and Si were respectively used as p- and n-type dopants. The element arrangement of this gate was the same as that shown in FIG. 33(a).

A constant-voltage power supply (30 V) was connected between a second Cr/Au electrode 521 and a third Cr/Au electrode 522. A semiconductor laser beam having a wavelength of 850 nm was used as input light, whereas a titanium-doped sapphire laser beam having a wavelength of 1,050 nm was used as bias light. Ten input light beams $P_{in}$ were incident, per gate, on the HPT 520 from the lower surface of the substrate while the intensity of each input light was changed in the range from 0 to 100 μW. A 1-mW laser beam was focused to have a spot size of 20 μm or less and was radiated, as bias light, on the upper surface of the MQW modulator 504. The intensity of reflected light $P_{out}$ was measured by a power meter. As shown in FIG. 28(c), negative logic gate characteristics appeared only when the intensities of all the input light $P_{in}$ exceeded 10 μW. The contrast ratio ($P_{outH}/P_{outL}$) was 10:1, and the response time was 50 ns.

(8) InGaAs/InAlAs HPT NAND gate

An HPT and an MQW-pin structure were stacked on a semi-insulating InP substrate by MBE. The HPT was constituted by an n+-$In_{0.53}Ga_{0.47}As$ layer (thickness 2 μm), an n-$In_{0.53}Al_{0.47}As$ layer (thickness: 2 μm), a p-$In_{0.53}Ga_{0.47}As$ layer (thickness: 0.2 μm), and an n+-$In_{0.53}Ga_{0.47}As$ layer (thickness: 0.5 μm). The MQW-pin structure was constituted by an n-DBR layer formed by alternately stacking n-$In_{0.52}Al_{0.48}As$ layers (thickness: 1,225 Å) and n-$In_{0.52}(Al_{0.25}Ga_{0.75})_{0.48}As$ layers (thickness: 1,120 Å) in 40 stacking cycles, an i-MQW layer formed by alternately stacking undoped $In_{0.53}Ga_{0.47}As$ well layers (thickness: 70 Å) and undoped $In_{0.52}Al_{0.48}As$ barrier layers (thickness: 50 Å) in 250 stacking cycles, a p-$In_{0.52}Al_{0.48}As$ clad layer (thickness: 0.5 μm), and a p+-$In_{0.53}Ga_{0.47}As$ cap layer (thickness: 0.1 μm). The element arrangement of this gate was the same as that shown in FIG. 33(a) except that etching of a portion, of the InP substrate, corresponding to a photodetective portion was omitted.

A constant-voltage power supply (30 V) was connected between a second Cr/Au electrode 510 and a third Cr/Au electrode 511. A semiconductor laser beam having a wavelength of 1,520 nm was used both as input light and bias light. Ten input light beams $P_{in}$ were incident, per gate, on pin photodiodes 502 from the lower surface of the substrate while the intensity of each input light was changed in the range from 0 to 100 μW. A 1-mW laser beam was focused to have a spot size of 20 μm or less and was radiated, as bias light, on the upper surface of an MQW modulator 504. The intensity of reflected light $P_{out}$ was measured by a power meter. As shown in FIG. 28(c), negative logic gate characteristics appeared only when the intensities of all the input light $P_{in}$ exceeded 10 μW. The contrast ratio ($P_{outH}/P_{outL}$) was 25:1, and the response time was 50 ns.

(9) InGaAs/InP HPT type element

An HPT and an MQW-pin structure were stacked on an Si-doped InP substrate by a gas source MBE method. The HPT was constituted by an n+-$In_{0.53}Ga_{0.47}As$ layer (thickness 2 μm), an n-$In_{0.53}Al_{0.47}As$ layer (thickness: 2 μm), a p-$In_{0.53}Ga_{0.47}As$ layer (thickness: 0.2 μm), and an n-InP layer (thickness: 0.5 μm). The MQW-pin structure was constituted by an n-DBR layer formed by alternately stacking n-InP layers (thickness: 1,222 Å) and n-$In_{0.63}Ga_{0.37}As_{0.80}P_{0.20}$ layers (thickness: 1,130 Å) in 40 stacking cycles, an i-MQW layer formed by alternately stacking undoped $In_{0.53}Ga_{0.47}As$ well layers (thickness: 80 Å) and undoped InP barrier layers (thickness: 50 Å) in 230 stacking cycles, a p-InP clad layer (thickness: 0.5 μm), and a p++-$In_{0.53}Ga_{0.47}As$ cap layer (thickness: 0.1 μm). The element arrangement of this element was the same as that of the element (1) except that etching of a portion, of the InP substrate, corresponding to a photodetective portion was omitted.

A constant-voltage power supply (30 V) was connected between second and third Cr/Au electrodes. A semiconductor laser beam having a wavelength of 1,550 nm was used both as input light and bias light. Ten input light beams $P_{in}$ were incident, per gate, on pin photodiodes from the lower surface of the substrate while the intensity of each input light was changed in the range from 0 to 100 μW. A 1-mW laser beam was focused to have a spot size of 20 μm or less and was radiated, as bias light, on the upper surface of the MQW modulator. The intensity of reflected light $P_{out}$ was measured by a power meter. As shown in FIG. 28(c), negative logic gate characteristics appeared only when the intensities of all the input light $P_{in}$ exceeded 10 μW. The contrast ratio ($P_{outH}/P_{outL}$) was 20:1, and the response time was 50 ns.

In addition to the photodiode, the phototransistor, and the photothyristor described above, a photo-tunnel diode, a photoconductor, and the like may be used as photodetector portions.

FIG. 36(a) shows an arrangement in which a photodetector portion is constituted by a photo-tunnel diode. In this arrangement, negative logic bistable characteristics are obtained, and a large gain is obtained. FIG. 36(b) shows an arrangement in which a photodetector portion is constituted by a photoconductor. In this arrangement, a large gain is obtained.

In addition to the p-i-n structure in the above embodiments, an n-i-n structure, an M-i-n structure, an n-p-i-n structure, an etalon type p-i-n structure, or the like may be used as an optical modulating portion.

Figures 37A, 37B, 37C, 37D:
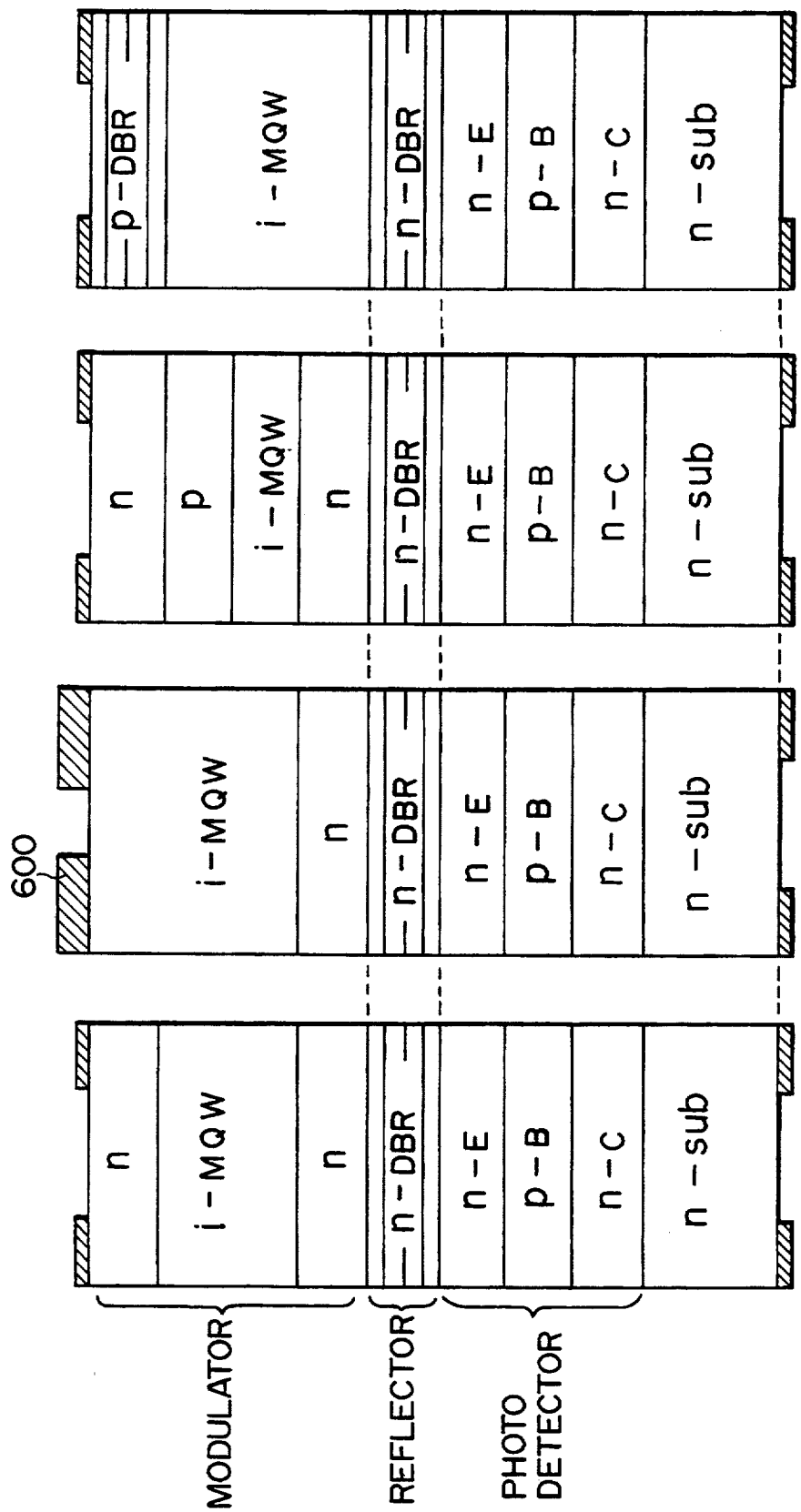
FIGS. 37(a) to 37(d) are sectional views each showing another embodiment of an optical modulating portion.
Figure 38A:
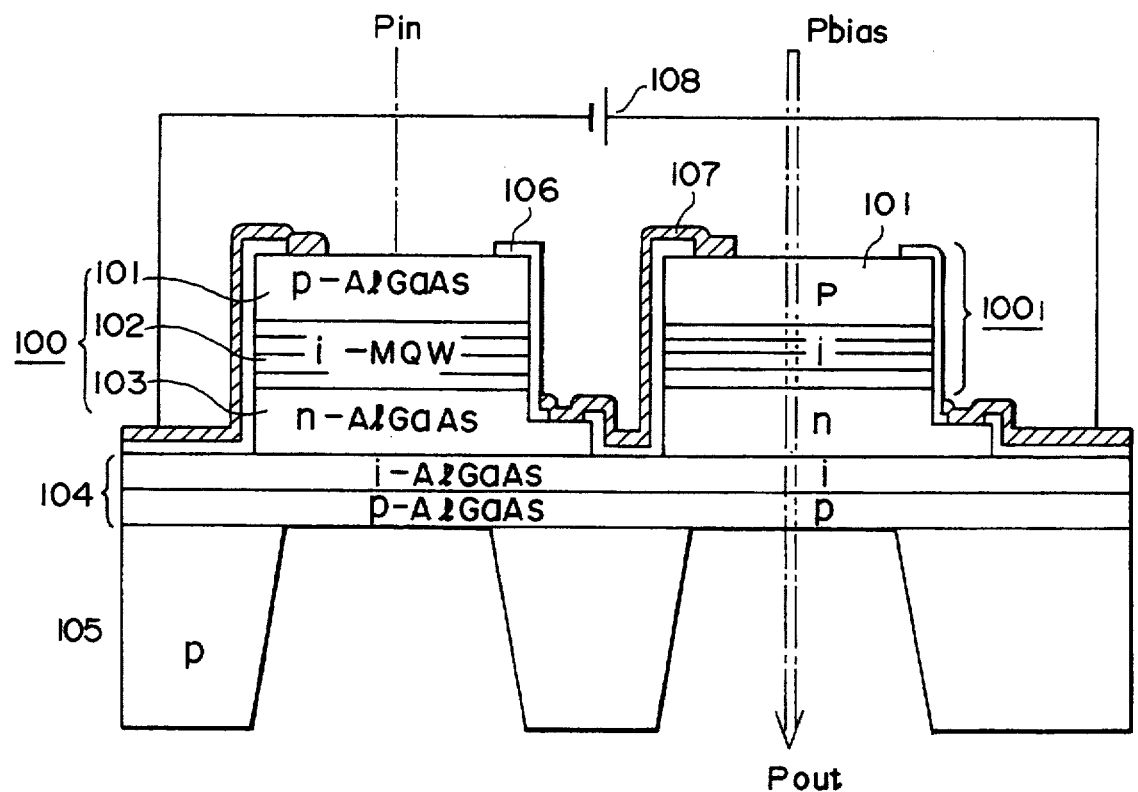
FIG. 38(a) is a sectional view showing an arrangement of a conventional optical gate array.

FIG. 37(a) shows an n-i-n structure. FIG. 37(b) shows an M-i-n structure. Referring to FIG. 37(b), reference numeral 600 denotes a metal layer. In this case mesa division among array elements is not required. FIG. 37(c) shows an n-p-i-n structure, in which a high-speed response can be ensured. FIG. 37(d) shows an etalon type p-i-n structure, in which a high-speed response and low power consumption can be ensured.

According to the optical gate array of the present invention, since a multi quantum well (MQW)-pin structure having a contrast ratio of 100:1, or more is used, a plurality of series-connected optical gates can be cascade-operated with a simple arrangement using a single pin structure without requiring a switching operation between two pin structures as in a conventional element. Since input light and bias light can be radiated from opposite sides in relation to a substrate, absorption can be easily performed. In addition, since input and output light beams can be properly separated from each other, a high S/N ratio can be obtained. For this reason, a multi-stage, multivalued logic operation between two-dimensional patterns of two light beams can be performed. In this case, it is only required that the respective patterns be incident on the upper and lower surfaces of the optical gate array, thus requiring no high-precision, complicated optical system. Furthermore, in the optical gate array of the present invention, since a photodetective portion and a modulating portion are vertically stacked, and their layer arrangements can be arbitrarily selected, for example, both positive and negative logic gate operations can be performed. In addition, a photodetective portion may be constituted by a phototransistor structure to increase the degree of freedom in design in terms of light input/output characteristics, e.g., enabling an ON/OFF operation of high-intensity bias light with weak light. Therefore, by using the optical gate array of the present invention, various advantages can be obtained. For example, logic operations among two-dimensional data of a plurality of light beams can be performed with high precision at high speed with a simple arrangement.

In addition, if a photothyristor is used for a detector portion, a high-speed operation can be performed while a memory function is obtained.

Furthermore, since a plurality of light beams can be input per gate, a multivalued logic operation can be performed with a single gate. Moreover, by using an MQW pin structure having a contrast ratio of 20 dB or more, an optical gate can be constituted by a single pin structure.

What is claimed is:

1. An optical gate array comprising a photodetector, an optical modulator, and a reflecting structure arranged therebetween, wherein said photodetector, said optical modulator, and said reflecting structure comprise semiconductor materials, said optical modulator including an MQW (Multi Quantum Well), said reflecting structure including a distributed Bragg reflector comprising adjacent semiconductor layers of different refractivities, said photodetector and said optical modulator are arranged to receive light from different directions, modulation characteristics of said optical modulator are controlled by the intensity of light radiated on said photodetector, said reflecting structure connects said modulator and said photodetector electrically and reflects lights radiated on said modulator and said photodetector for optical isolation therebetween, and a plurality of optical gates, each formed by said photodetector, said optical modulator, and said reflection structure arranged two-dimensionally therein.

2. An array according to claim 1, wherein said photodetector is a photodiode.

3. An array according to claim 1, wherein said photodetector is a phototransistor.

4. An array according to claim 1, wherein said photodetector is a tunnel diode.

5. An array according to claim 1, wherein said photodetector is a photothyristor.

6. An array according to claim 1, wherein said photodetector is a photoconductor.

7. An array according to claim 1, wherein said optical modulator is a pin structure.

8. An array according to claim 7, wherein said MQW is included in an i-type layer.

9. An array according to claim 7, wherein said reflecting structure is included in a p- or n-type layer of said pin structure.

10. An array according to claim 9, wherein said i-type layer has a thickness which allows depletion at a residual carrier concentration thereof in a zero bias state, and said MQW includes a total number of barrier layers having a thickness corresponding to not more than ½ the thickness of said i-type layer.

11. An array according to claim 1, wherein said optical modulator is a Schottky structure.

12. An array according to claim 1, wherein said optical modulator is an n-i-n structure.

13. An array according to claim 1, wherein said optical modulator is a p-i-p structure.

14. An array according to claim 1, wherein said optical modulator is an n-p-i-n structure.

15. An array according to claim 1, wherein said optical modulator is a p-n-i-p structure.

16. An array according to claim 1, wherein said reflecting structure is an element of said modulator.

17. An array according to claim 1, wherein said respective elements are vertically stacked.

18. An array according to claim 1, wherein said reflecting structure and said photodetector are connected to each other through a tunnel junction constituted by heavily doped p- and n-type layers.

19. An array according to claim 1, wherein said reflecting structure and said photodetector are electrically connected to each other through a metal material.

20. An array according to claim 1, wherein photodetector is arranged on a translucent semiconductor substrate.

21. An array according to claim 1, wherein said optical modulator is arranged on a translucent semiconductor substrate.

22. An array according to claim 1, further comprising means for electrically connecting said photodetector and said optical modulator in parallel with each other.

23. An array according to claim 1, further comprising means for connecting said photodetector and said optical modulator in parallel with each other to form a parallel circuit, and a load resistor connected to said parallel circuit of said photodetector and said optical modulator.

24. An array according to claim 1, wherein said light received by said photodetector and said optical modulator comprises a plurality of light beams, and said photodetector of each of said optical gates comprises a plurality of photodetector portions so as to perform a logic operation among two-dimensional input data of said plurality of light beams.

25. An array according to claim 24, further comprising means for electrically connecting all said plurality of photodetector portions and said optical modulator in series with each other.

26. An array according to claim 24, further comprising means for electrically connecting said plurality of photodetector portions in parallel with each other and connecting said photodetector portions in series with said optical modulator.

27. An array according to claim 24, further comprising means for electrically connecting said plurality of photodetector portions in series with each other and connecting said photodetector portions in parallel with said optical modulator.

28. An array according to claim 24, further comprising means for electrically connecting all said plurality of photodetector portions and said optical modulator in parallel with each other.

* * * * *